US012628492B2

(12) United States Patent
Palmstrom et al.

(10) Patent No.: US 12,628,492 B2
(45) Date of Patent: May 12, 2026

(54) METHODS FOR IMPROVING PEROVSKITE SOLAR CELLS

(71) Applicants: Alliance for Energy Innovation, LLC, Golden, CO (US); The Regents of the University of Colorado, Denver, CO (US)

(72) Inventors: Axel Finn Palmstrom, Golden, CO (US); Joseph Jonathan Berry, Boulder, CO (US); Samuel Aaron Johnson, Boulder, CO (US)

(73) Assignees: Alliance for Energy Innovation, LLC, Golden, CO (US); The Regents of the University of Colorado, Denver, CO (US)

( * ) Notice: Subject to any disclaimer, the term of this patent is extended or adjusted under 35 U.S.C. 154(b) by 27 days.

(21) Appl. No.: 18/604,365

(22) Filed: Mar. 13, 2024

(65) Prior Publication Data

US 2024/0315062 A1     Sep. 19, 2024

Related U.S. Application Data

(60) Provisional application No. 63/490,031, filed on Mar. 14, 2023.

(51) Int. Cl.
*H10K 30/82* (2023.01)
*H10K 30/40* (2023.01)

(52) U.S. Cl.
CPC ............. *H10K 30/82* (2023.02); *H10K 30/40* (2023.02)

(58) Field of Classification Search
CPC ............................... H10K 30/82; H10K 30/40
See application file for complete search history.

(56) References Cited

U.S. PATENT DOCUMENTS 6,605,549  B2     8/2003  Leu et al.
7,902,064  B1     3/2011  Chiang et al.
(Continued)

FOREIGN PATENT DOCUMENTS

WO     2014090394 A1     6/2014
WO     2017108710 A1     6/2017

OTHER PUBLICATIONS

Wang et al., "Efficient Inverted Planar Perovskite Solar Cells Using Ultraviolet/Ozone-Treated NiOx as the Hole Transport Layer", Sol. RRL 2019, 3, 1900045. (Year: 2019).*
(Continued)

*Primary Examiner* — Tae-Sik Kang
(74) *Attorney, Agent, or Firm* — Michael A. McIntyre

(57) ABSTRACT

The present disclosure relates to a device that includes a first metal oxide layer having a first thickness, a second metal oxide layer having a second thickness, and a base layer having a third thickness, where the first metal oxide layer is positioned between the base layer and the second metal oxide layer, at least one of the base layer and/or the first metal oxide layer includes a carbon-containing material, and at least one of a carbon concentration gradient and/or an oxygen concentration gradient is present across at least one of a portion of the first thickness and/or a portion of the third thickness. In some embodiments of the present disclosure, the first metal oxide layer may be permeable to an oxygen-containing compound. In some embodiments of the present disclosure, the oxygen-containing compound may include at least one of $O_3$, $N_2O$, and/or $H_2O_2$.

19 Claims, 40 Drawing Sheets

(56)                    References Cited

U.S. PATENT DOCUMENTS

| | | | |
|---|---|---|---|
| 2009/0188558 A1 | 7/2009 | Jen et al. | |
| 2013/0182307 A1 | 7/2013 | Gillaspie et al. | |
| 2014/0060643 A1 | 3/2014 | Martin et al. | |
| 2017/0089128 A1 | 3/2017 | Wheeler et al. | |
| 2017/0133163 A1 | 5/2017 | Russell et al. | |
| 2018/0033983 A1 | 2/2018 | Yang et al. | |
| 2018/0097182 A1 | 4/2018 | Benzie | |
| 2018/0226529 A1 | 8/2018 | Uzu et al. | |
| 2020/0402725 A1* | 12/2020 | Oooka | H10K 77/111 |
| 2022/0115547 A1 | 4/2022 | Prince et al. | |
| 2023/0422533 A1 | 12/2023 | Wheeler et al. | |

OTHER PUBLICATIONS

Sun et al., "Composition and Energy Band-Modified Commercial FTO Substrate for In Situ Formed Highly Efficient Electron Transport Layer in Planar Perovskite Solar Cells", Adv. Funct. Mater. 2019, 29, 1808667 (Year: 2019).*

Beal, R. et al., "Cesium Lead Halide Perovskites with Improved Stability for Tandem Solar Cells," Journal of Physical Chemistry Letters, vol. 7, 2016, pp. 746-751.

Bush, K. et al., "23.6%-efficient monolithic perovskite/silicon tandem solar cells with improved stability," Nature Energy, vol. 2, 2017, 7 pages.

Bush, K. et al., "Compositional Engineering for Efficient Wide Band Gap Perovskites with Improved Stability to Photoinduced Phase Segregation," ACS Energy Letters, vol. 3, 2018, 428-435.

Chang, C.Y. et al., "Thin-Film encapsulation of polymer-based bulk-heterojunction photovoltaic cells by atomic layer deposition," Elsevier Organic Electronics, vol. 10, 2009, pp. 1300-1306.

Chirila, A. et al., "Potassium-induced surface modification of Cu(In, Ga)Se2 thin films for high-efficiency solar cells," Nature Materials, vol. 12, 2013, 5 pages.

Christians, J. et al., "Stability in Perovskite Photovoltaics: A Paradigm for Newfangled Technologies," ACS Energy Letters, vol. 3, 2018, pp. 2136-2143.

Eperon, G. et al., Formamidinium lead trihalide: a broadly tunable perovskite for efficient planar heterojunction solar cells, Energy & Environmental Science, vol. 7, 2014, pp. 982-988.

Feng, J. et al., "Record Efficiency Stable Flexible Perovskite Solar Cell Using Effective Additive Assistance Strategy," Advanced Materials, vol. 30, 2018, 9 pages.

Ferdousi, F. et al., "Fullerene-Based Hybrid Devices for High-Density Nonvolatile Memory," IEEE Transactions on Nanotechnology, vol. 10, No. 3, May 2011, 4 pages.

Gao, Z. et al., "Improving the stability and efficiency of perovskite light-emitting diodes via an insulating layer of polyethylenimine ethoxylated," Journal of Luminescence, vol. 201, 2018, pp. 359-363.

Ha, J. et al., "Device architecture for efficient, low-hysteresis flexible perovskite solar cells: Replacing TiO2 with C60 assisted by polyethylenimine ethoxylated interfacial layers," Solar Energy Materials & Solar Cells, vol. 161, 2017, pp. 338-346.

Hazarika, A., "Perovskite Quantum Dot Photovoltaic Materials beyond the Reach of Thin Films: Full-Range Tuning of A-Site Cation Composition," ACS Nano, vol. 12, 2018, pp. 10327-10337.

Hüpkes, J. et al., "Chemical Etching of Zinc Oxide for Thin-Film Silicon Solar Cells," ChemPhysChem, vol. 13, 2012, pp. 66-73.

Ke, W. et al., Efficient Lead-Free Solar Cells Based on Hollow {en} MASnl3 Perovskites, Journal of the American Chemical Society, vol. 139, 2017, pp. 14800-14806.

King, D.L. et al., "New Methods For Measuring Performance of Monolithic Multi-Junction Solar Cells," Conference Record of the 28th IEEE PVSC, 2000, 5 pages.

Leijtens, T. et al., "Tin-lead halide perovskites with improved thermal and air stability for efficient all-perovskite tandem solar cells," Sustainable Energy & Fuels, vol. 2, 2018, pp. 2450-2459.

Li, Z. et al., "Stabilizing Perovskite Structures by Tuning Tolerance Factor: Formation of Formamidinium and Cesium Lead Iodide Solid-State Alloys," Chemistry of Materials, vol. 28, 2016, pp. 284-292.

Mitzi, David B., "Synthesis, Structure, and Properties of Organic-Inorganic Perovskites and Related Materials," Progress in Inorganic Chemistry, vol. 48, Edited by Kenneth D. Karlin, 1999, 121 pages.

Nam, E. et al., "Effects of pyromellitic dianhydride cathode interfacial layer on characteristics of organic solar cells based on poly(3-hexylthiophene-2,5-diyl) and [6,6]-phenyl C61 butyric acid methyl ester," Journal of Materials Research, vol. 25, No. 5, May 2010, 5 pages.

Parsons, G. et al., "Mechanisms and reactions during atomic layer deposition on polymers," Coordination Chemistry Reviews, vol. 257, 2013, pp. 3323-3331.

Pang, S. et al., "Efficient bifacial semitransparent perovskite solar cells with silver thin film electrode," Solar Energy Materials and Solar Cells, vol. 170, 2017, 278-286.

Peng, L. et al., "Reduce the hysteresis effect with the PEIE interface dipole effect in the organic-inorganic hybrid perovskite CH3NH3Pbl3-xClx solar cell," Organic Electronics, vol. 62, 2018, 7 pages (https://doi.org/10.1016/j.orgel.2018.06.043).

Pisoni, S. et al., "Impact of interlayer application on band bending for improved electron extraction for efficient flexible perovskite mini-modules," Elsevier Nano Energy, vol. 49, 2018, 8 pages.

Prasanna, R. et al., "Band Gap Tuning via Lattice Contraction and Octahedral Tilting in Perovskite Materials for Photovoltaics," Journal of American Chemical Society, vol. 139, 2017, pp. 11117-11124.

Reese, M. et al., "Quantitative calcium resistivity based method for accurate and scalable water vapor transmission rate measurement," Review of Scientific Instruments, vol. 82, 2011, 10 pages.

Saparov, B. et al., "Organic-Inorganic Perovskites: Structural Versatility for Functional Materials Design," Chemical Reviews, vol. 116, 2016, pp. 4558-4596.

Seo, S. et al., Perovskite Solar Cells with Inorganic Electron- and Hole-Transport Layers Exhibiting Long-Term (300 h) Stability at 85° C. under Continuous 1 Sun Illumination in Ambient Air).

Stoddard, R. et al., "Enhancing Defect Tolerance and Phase Stability of High-Bandgap Perovskites via Guanidinium Alloying," ACS Energy Letters, vol. 3, 2018, pp. 1261-1268.

Swarnkar, A. et al., "Quantum dot-induced phase stabilization of α-CsPbl3 perovskite for high-efficiency photovoltaics," Science, vol. 354, Issue 6308, 2016, 5 pages.

Wang, X. et al., "Atomic Layer Deposition of Metal Oxides on Pristine and Functionalized Graphene," Journal of the American Chemical Society, vol. 130, 2008, 2 pages.

Xiong, J. et al., "Improved efficiency and short-term stability of the planar heterojunction perovskite solar cells with a polyelectrolyte layer," Phys. Status Solidi A, vol. 214, No. 10, 2017, 8 pages.

Yang, H. et al., "Effect of polyelectrolyte interlayer on efficiency and stability of p-i-n perovskite solar cells," Solar Energy, vol. 139, 2016, pp. 190-198.

Yoo, J.S. et al., "Dual function of a high-contrast hydrophobic-hydrophilic coating for enhanced stability of perovskite solar cells in extremely humid environments," Nano Research, vol. 10, No. 11, 2017, pp. 3885-3895.

Zhou, H. et al., "Interface Engineering of Highly Efficient Perovskite Solar Cells," Science, vol. 345, Issue 6196, 2014, 6 pages.

Zhou, Y. et al., "High performance polymeric charge recombination layer for organic tandem solar cells," Energy & Environmental Science, vol. 5, 2012, pp. 9827-9832.

Zhou, Y. et al., "A Universal Method to Produce Low-Work Function Electrodes for Organic Electronics," Science, vol. 336, 2012, 7 pages.

International Search Report and Written Opinion from corresponding PCT/US19/53499 dated May 5, 2020, 10 pages.

Supplementary Partial European Search Report from corresponding EP Patent Application No. 19869533.0, dated May 19, 2022, 14 pages.

* cited by examiner

100

200

205

300

330

320

310

A) corner sharing cubic phase/α-phase

B) face sharing hexagonal phase

C) edge sharing orthorhombic phase

Protective capping layer forms after 40 cycles.

A)

B)

METHODS FOR IMPROVING PEROVSKITE SOLAR CELLS

CROSS-REFERENCE TO RELATED APPLICATIONS

This application claims priority from U.S. Provisional Patent Application No. 63/490,031 filed on Mar. 14, 2023, the contents of which are incorporated herein by reference in the entirety.

CONTRACTUAL ORIGIN

This invention was made with government support under Contract No. DE-AC36-08GO28308 awarded by the Department of Energy. The government has certain rights in the invention.

BACKGROUND

There are two primary challenges for growing by atomic layer deposition (ALD) high-quality oxide barriers on top of metal-halide perovskite (MHP) semiconductors: (i) potentially unfavorable interactions between the MHP surface and ALD precursor, necessitating the use of an interlayer between the MHP absorber and tin oxide film and (ii) the lack of organic or small molecule selective contact materials with reactive functional groups (e.g. —O—, —OH) suitable for initiating ALD surface nucleation. Nucleation of ALD on unreactive, low-energy surfaces often leads to nucleation delay, where no growth or non-conformal growth occurs in the first several growth cycles. In the case of nucleation delay on soft materials, this can enable to sub-surface diffusion of ALD reactants. In the case of unreactive, yet more permeable materials, such as polymers, organometallic precursors have been shown to diffuse tens to hundreds of nanometers sub-surface and affect bulk mechanical properties. Exothermic subsurface reactions can lead to expansion and contraction of an ALD oxide film throughout the half-cycles of the ALD process producing, among other things, cracked layers. Therefore, there remains a need for improved methods for growing thin oxide layers on the underlying layers of MHP-containing devices.

SUMMARY

An aspect of the present disclosure is a device that includes a first metal oxide layer having a first thickness, a second metal oxide layer having a second thickness, and a base layer having a third thickness, where the first metal oxide layer is positioned between the base layer and the second metal oxide layer, at least one of the base layer and/or the first metal oxide layer includes a carbon-containing material, and at least one of a carbon concentration gradient and/or an oxygen concentration gradient is present across at least one of a portion of the first thickness and/or a portion of the third thickness. In some embodiments of the present disclosure, the first metal oxide layer may be permeable to an oxygen-containing compound. In some embodiments of the present disclosure, the oxygen-containing compound may include at least one of $O_3$, $N_2O$, and/or $H_2O_2$.

In some embodiments of the present disclosure, the first thickness may be between 1 Å and 200 nm. In some embodiments of the present disclosure, the first metal oxide layer may include at least one of a tin oxide, a zinc oxide, a molybdenum oxide, a vanadium oxide, a nickel oxide, an aluminum oxide, a titanium oxide, a hafnium oxide, a zirconium oxide, a silicon oxide, a copper oxide, a chromium oxide, a cobalt oxide, a manganese oxide, and/or an indium-tin-oxide. In some embodiments of the present disclosure, the second thickness may be between 1 Å and 200 nm. In some embodiments of the present disclosure, the second metal oxide layer may include at least one of a tin oxide, a zinc oxide, a molybdenum oxide, a vanadium oxide, a nickel oxide, an aluminum oxide, a titanium oxide, a hafnium oxide, a zirconium oxide, a silicon oxide, a copper oxide, a chromium oxide, a cobalt oxide, a manganese oxide, and/or an indium-tin-oxide.

In some embodiments of the present disclosure, at least a portion of the first metal oxide layer may form an interface with the base layer. In some embodiments of the present disclosure, at least one of the oxygen concentration gradient and/or the carbon concentration gradient may be characterized by a maximum concentration of carbon-oxygen bonds at or near the interface. In some embodiments of the present disclosure, at least a portion of the second metal oxide layer may penetrate through the first metal oxide layer into a portion of the third thickness, as determined by at least one of X-ray reflectivity or transmission electron microscopy. In some embodiments of the present disclosure, the base layer may include at least one of a perovskite and/or a charge transport material (CTM).

In some embodiments of the present disclosure, the first metal oxide layer may include tin oxide, the second metal oxide layer may include tin oxide, the base layer may include a fullerene, and at least a portion of the tin oxide of the first metal oxide layer may penetrate into at least a portion of the third thickness of the fullerene. In some embodiments of the present disclosure, the portion of the thickness of the fullerene penetrated by the tin oxide of the first metal oxide layer may have a thickness between 10 Å and 61 Å. In some embodiments of the present disclosure, the portion of the thickness of the fullerene penetrated by the tin oxide of the first metal oxide layer may have an electron density between 0.61 e–/$Å^3$ and 1.37 e–/$Å^3$. In some embodiments of the present disclosure, the fullerene layer may include a surface concentration of C—O bonds of less than about 70 mol %. In some embodiments of the present disclosure, the fullerene layer may include a bulk concentration of C—O bonds of less than about 33 mol %.

In some embodiments of the present disclosure, the device may further include a gap, where the gap passes through at least one of the first thickness, the second thickness, and/or third thickness forming surface aligned perpendicular to at least one of the first metal oxide layer, the second metal oxide layer, and/or the base layer, the gap is at least partially filled with a solid, and the solid forms an interface with the surface. In some embodiments of the present disclosure, the solid may include a first layer that includes the metal oxide of the first metal oxide layer, the solid may include a second layer that includes the metal oxide of the second metal oxide layer, and the first layer is positioned between surface and the second layer.

An aspect of the present disclosure is a method, where the method includes a first depositing of a first metal oxide layer onto a surface, contacting at least one of the surface or the first metal oxide layer with at least one of an oxygen-containing compound or an oxygen plasma, and a second depositing of a second metal oxide layer onto the first metal oxide layer, where at least one of the surface or the first metal oxide layer includes a carbon-containing material, the oxygen-containing compound reacts with at least a portion of the carbon-containing material to form an oxygen-containing functional group bonded to carbon, and the oxygen-containing functional group provides a nucleation site that facilitates, during the second depositing, the forming of structures comprising —C—O—M at the surface or on the first metal oxide layer, wherein M is the metal of at least one of the first metal oxide layer and/or the second metal oxide layer.

In some embodiments of the present disclosure, the oxygen-containing compound may include at least one of $N_2O$, $O_3$, and/or $H_2O_2$. In some embodiments of the present disclosure, the second depositing may result in at least a portion of the metal oxide of the second metal oxide layer penetrating into at least one of the surface and/or the base layer, as determined by scanning transmission electron microscopy. In some embodiments of the present disclosure, the first depositing may be performed using atomic layer deposition (ALD). In some embodiments of the present disclosure, the second depositing may be performed using ALD.

BRIEF DESCRIPTION OF DRAWINGS

Some embodiments are illustrated in referenced figures of the drawings. It is intended that the embodiments and figures disclosed herein are to be considered illustrative rather than limiting.

FIG. 8A $C_{60}$/60 s ex-situ UV-ozone Panel; FIG. 8B $C_{60}$/1 hour air exposure; and FIG. 8C $C_{60}$/40 cycles $SnO_x$/5×[3 seconds $O_3$+150 ms $H_2O$]/85 cycles $SnO_x$ for a total of 125 cycles.

FIG. 19A—1.58 eV $FA_{0.7}MA_{0.15}Cs_{0.05}Pb(I_{0.83}Br_{0.17})_3$ 'mid-gap' composition; FIG. 19B—1.25 eV $FA_{0.76}Cs_{0.25}Pb_{0.5}Sn_{0.5}I_3$ narrow-gap composition; FIG. 19C—1.73 eV $FA_{0.6}Cs_{0.3}DMA_{0.10}Pb(I_{0.8}Br_{0.2})_3$ wide-gap composition; and FIG. 19D—a 1.70 eV/1.25 eV All-perovskite tandem device. Ozone nucleation for 1.58 eV and 1.73 eV devices was performed with 5 cycles (15 s) in-situ treatment; ozone nucleation for 1.25 eV and all-perovskite tandem devices was performed with 60 s ex-situ UV-ozone treatments.

To facilitate understanding, identical reference numerals have been used, where possible, to designate identical elements that are common to the figures. It is contemplated that elements and features of one embodiment may be beneficially incorporated in other embodiments without further recitation.

REFERENCE NUMERALS

Figure 1A:
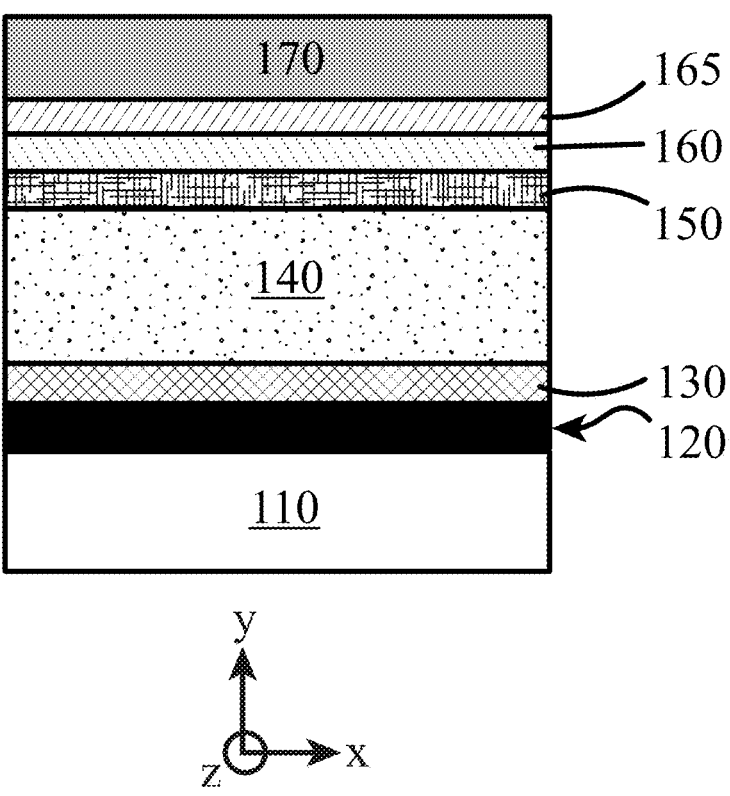
FIGS. 1A and 1B illustrate devices, according to some embodiments of the present disclosure.

100 . . . device
110 . . . substrate
120 . . . first contact layer
130 . . . charge transport layer (e.g., ETL)
140 . . . absorber layer
145 . . . interface
150 . . . base layer (e.g., HTL)
160 . . . first metal oxide layer
165 . . . second metal oxide layer
170 . . . second contact layer
180 . . . surface
200 . . . method
205 . . . starting device (e.g., with CTL)
210 . . . first depositing (of first metal oxide layer)
215 . . . first intermediate device
220 . . . contacting (e.g., with ozone)
225 . . . treated device
230 . . . second depositing (of second metal oxide layer)
235 . . . second intermediate device
240 . . . post processing
245 . . . final device
300 . . . metal-halide perovskite
310 . . . A-cation
320 . . . B-cation
330 . . . X-anion
P1 . . . first gap
P2 . . . second gap
P3 . . . third gap

DETAILED DESCRIPTION

The present disclosure relates to methods for growing high quality, conformal thin oxide layers on the surface of a layer under which is positioned a perovskite layer. For example, it is demonstrated herein that ozone treatments can be used to initiate ALD growth on fullerene films in p-i-n perovskite solar cells. It is shown herein that ozone damage can be mitigated in devices through the deposition of a thin (~5 nm), non-conformal ALD-grown oxide layer prior to ozone exposure. Using this approach, ozone, as well as other oxygen-containing compounds, can functionalize exposed fullerene within voids of the thin oxide layer for subsequent ALD oxide growth without loss of device performance. This vapor phase nucleation process for growth on fullerene materials is then demonstrated to improve the barrier properties of ALD-deposited tin oxide thin layers and is shown to be compatible with a broad range of MHP compositions and band gaps.

Although, this method has been successfully demonstrated by depositing a first metal oxide layer onto a fullerene, following by ozone treating, and then depositing a second metal oxide layer onto the ozone treated fullerene and/or first metal oxide layer, this is not intended to be limiting and other carbon-containing layers may also be treated successfully using the features described herein. FIG. 1A illustrates an exemplary device 100 that includes a first metal oxide layer 160 positioned between a base layer 150 and a second metal oxide layer 165. In this example, the device 100 also includes an absorber layer 140 positioned between the base layer 150 and a charge transport layer (CTL) 130, in addition to a first contact layer 120 positioned between the CTL 130 and a substrate 110. In some embodiments of the present disclosure, a base layer 150 may include a hole transport material (HTM) resulting in the base layer 150 having the properties of a hole transport layer (HTL). In some embodiments of the present disclosure, an absorber layer 140 may be constructed of a perovskite, a dye-sensitized semiconducting material, and/or an organic semiconducting material. Further, in some embodiments of the present disclosure, a CTL 130 may include an electron transport material (ETM) resulting in the CTL 130 having the properties of an electron transport layer (ETL).

As described herein, a beneficial aspect of the present disclosure is the reaction of an oxygen-containing compound (e.g., ozone ($O_3$), $N_2O$, $H_2O_2$, and/or some other oxygen containing peroxide) and/or an oxygen plasma with a carbon-containing material positioned in at least one of the base layer 150 and/or the first metal oxide layer 160, such that the reaction results in the formation of an oxygen-containing functional group bonded to carbon. Exemplary oxygen-containing functional groups include at least one of an epoxide, a hydroxyl, a carboxyl, a carbonyl, an aldehyde, an ester, a carboxylic acid, an ether, a ketone, an acyl halide, an amide, and/or an acid anhydride. These oxygen-containing functional groups may then provide nucleation sites for the subsequent reaction with the metal oxide precursor(s) used to deposit a second metal oxide layer 165 onto the first metal oxide layer 160 and/or base layer 150. For the example of depositing a second metal oxide layer 165 made of tin oxide using tetrakis-dimethylamino tin (IV) (TD-MASn) as the tin oxide precursor, the oxygen-containing functional groups may provide nucleation sites resulting in the forming of structures that include —C—O—Sn at the surface of the base layer 150 and/or on surface of the first metal oxide layer 160 and extending into the thicknesses of these layers. In some embodiments of the present disclosure, the reaction of ozone with a carbon-containing material may result in the formation of an oxygen concentration gradient (e.g., a gradient of oxygen-containing functional groups) across at least a portion of the thickness of a base layer 150 and/or at least a portion of the thickness of a first metal oxide layer 160 (thickness represented by the y-axis direction of FIG. 1A). In some embodiments of the present disclosure, an oxygen gradient may have a maximum oxygen concentration at or near the interface formed by the first oxide layer 160 and the second oxide layer 165 and/or a maximum oxygen concentration at or near the interface formed by the first oxide layer 160 and the base layer 150.

In some embodiments of the present disclosure, a first metal oxide layer 160 may be permeable to the oxygen-containing compounds to enable the oxygen-containing compound(s) to diffuse through the first metal oxide layer 160 to access an underlying base layer 150. Thus, a first metal oxide layer 160 may be permeable to at least one of ozone, $N_2O$, and/or a peroxide (e.g., $H_2O_2$). To provide permeability to an oxygen-containing compound, a first metal oxide layer may be non-conformal and have at least one of a crack, a hole, grain boundary, and/or some other imperfection that allows the mass-transfer of the oxygen-containing compound to the underlying base layer 150 (e.g., a HTL). In some embodiments of the present disclosure, a first metal oxide layer 160 may have a thickness between 1 Å and 200 nm or between 10 Å and 100 nm or between 100 Å and 5 nm, with or without a crack, hole, grain boundary, and/or imperfection.

A first metal oxide layer 160 may be made using one or more metal oxides with examples including at least one of a tin oxide, a zinc oxide, a molybdenum oxide, a vanadium oxide, a nickel oxide, an aluminum oxide, a titanium oxide, a hafnium oxide, a zirconium oxide, a silicon oxide, a copper oxide, a chromium oxide, a cobalt oxide, a manganese oxide, and/or an indium-tin-oxide. In some embodiments of the present disclosure, a first metal oxide layer 160 may be doped. Examples of dopant levels include between 0 at % and 6 at % yttrium doping in a tin oxide for a first metal oxide layer 160 have electron transport characteristics, between 0 at % and 2 at % fluorine doping in a tin oxide for a first metal oxide layer 160 having contact layer characteristics, and between 0 at % and 7 at % copper in a nickel oxide for a first metal oxide layer 160 having hole transport characteristics. Further, a metal oxide used to construct first metal oxide layer 160 may be conductive or insulative. Examples of conductive/semiconductive metal oxides include tin oxide, zinc oxide, titanium oxide, nickel oxide, copper oxide, vanadium oxide, molybdenum oxide, indium oxide, tungsten oxide, iron oxide, chromium oxide, cobalt oxide, manganese oxide, indium-tin-oxide, cadmium stannate, fluorine-doped tin oxide, and/or aluminum-doped zinc. Examples of insulating metal oxides include aluminum oxide, silicon oxide, hafnium oxide, zirconium oxide, magnesium oxide, and/or strontium oxide. In some embodiments of the present disclosure, a first metal oxide layer 160 may itself include a carbon-containing material that is capable of reacting with an oxygen-containing compound (e.g., ozone) to produce at least one oxygen-containing functional group (e.g., an epoxide) such that the oxygen-containing functional group provides nucleation sites at the surface of the first metal oxide layer 160 and/or nucleation sites positioned within a portion of the thickness of the first metal oxide layer 160.

A carbon-containing material may be present in a first metal oxide layer 160 because of the method used to deposit the first metal oxide layer 160. For example, a first metal oxide layer 160 may be deposited using a solution processing method that applies a film of a solution containing metal oxide nanoparticles, followed by a subsequent annealing step to produce the targeted first metal oxide layer 160. In some embodiments of the present disclosure, metal oxide nanoparticles may be stabilized, i.e., prevented from coalescing together, using carbon-containing ligands. The oxygen-containing compound (e.g., ozone) may then react with carbon provided by the ligands to form oxygen-containing functional groups bonded to carbon. Examples of ligands that may be present in a first metal oxide layer 160 include at least one of an acidic ligand, a basic ligand, or a zwitterionic ligand. Although solution processing may be used to deposit a first metal oxide layer 160, gas phase and/or vapor phase methods may also be employed, including atomic layer deposition (ALD). Other deposition methods that may be used to deposit a first metal oxide layer 160 include chemical vapor deposition (CVD), plasma enhanced CVD, spatial ALD, and/or plasma enhanced ALD.

Referring again to FIG. 1A, a second metal oxide layer 165 may be constructed using one or more metal oxides, including at least one of a tin oxide, a zinc oxide, a titanium oxide, a nickel oxide, a copper oxide, a vanadium oxide, a molybdenum oxide, an indium oxide, a tungsten oxide, an iron oxide, a chromium oxide, a cobalt oxide, a manganese oxide, an indium-tin-oxide, a cadmium stannate, a fluorine-doped tin oxide, aluminum-doped zinc, an aluminum oxide, a silicon oxide, a hafnium oxide, a zirconium oxide, a magnesium oxide, and/or a strontium oxide. In some embodiments of the present disclosure, a second metal oxide layer 165 may be doped. Examples of dopant levels include between 0 at % and 6 at % yttrium doping in a tin oxide for a second metal oxide layer 165 have electron transport characteristics, between 0 at % and 2 at % fluorine doping in a tin oxide for a second metal oxide layer 165 having contact layer characteristics, and between 0 at % and 7 at % copper in a nickel oxide for a second metal oxide layer 165 having hole transport characteristics. Further, a metal oxide used to construct second metal oxide layer 165 may be conductive or insulative (examples of each provide above for the first metal oxide layer). In some embodiments of the present disclosure, a metal oxide used to construct a first metal oxide layer 160 may be the same as the metal oxide used to construct a second metal oxide layer 165. In some embodiments of the present disclosure, a metal oxide used to construct a first metal oxide layer 160 may be different than the metal oxide used to construct a second metal oxide layer 165. A second metal oxide layer 165 may be deposited using at least one of a solution processing method, a vapor phase method, and/or a gas phase method. In some embodiments of the present disclosure, a second metal oxide layer 165 may be deposited using ALD. Other deposition methods that may be used to deposit a second metal oxide layer 165 include chemical vapor deposition (CVD), plasma enhanced CVD, spatial ALD, and/or plasma enhanced ALD.

Referring again to FIG. 1A, a base layer 150 may include at least one of a perovskite and/or a charge transport material (CTM). In some embodiments of the present disclosure, a base layer 150 may be essentially one distinct layer made of a single distinct material and/or composition, or a base layer 150 may be a composite layer constructed of two or more distinct layers, with each layer constructed of a single distinct material and/or composition. For the example of a base layer 150 that includes a perovskite, the carbon-containing material for reacting with an oxygen-containing compound may be provided by the A-site cation of the perovskite, such as ammonium cations and/or amidinium cations. Ammonium cations may include alkylammonium cations such as methylammonium (MA), ethylammonium, diethylammonium, and/or phenethylammonium. Examples of amidinium cations include formamidinium (FA) and/or guanidinium.

For the example of a base layer 150 that includes a CTM, the CTM itself may be the carbon-containing material. For example, a base layer 150 may be constructed using at least one of a fullerene, graphene, graphite, graphdiyne, a reduced graphene oxide, a carbon nanotube, carbon black, an MXene, a polymer, a perylenediimide, a perylene, a non-fullerene acceptor, and/or a small molecule. In some embodiments of the present disclosure, a base layer 150 may be constructed using at least one of a functionalized fullerene, a functionalized graphene, a functionalized graphite, a functionalized graphdiyne, a functionalized graphene oxide, a functionalized carbon nanotube, a functionalized carbon black, an MXene, a polymer, a perylenediimide, a perylene, a non-fullerene acceptor, and/or a small molecule, wherein the functionalization results in at least one of an epoxy group, a hydroxyl group, a carboxyl group, and/or a carbonyl group.

Examples of fullerenes include C50, C60, C70, C120, C140, and/or C180. An example of a functionalized fullerene is [6,6] phenyl-C61-butyric acid methyl ester (PCBM). A carbon nanotube may be a single-walled carbon nanotube, a double-walled carbon nanotube, and/or a multi-walled carbon nanotube. A polymer may include parylene, poly(3-hexylthiophene) (P3HT), poly(triarlyamine) (PTAA), poly (3,4-ethylenedioxythiophene):poly(styrenesulfonate) (PE-DOT:PSS), bathocuproine (BCP), polyaniline, poly[(9,9-bis (3'-(N,N-dimethylamino)propyl)-2,7-fluorene)-alt-2,7-(9,9-dioctylfluorene)] (PFtN), poly(methyl methacrylate) (PMMA), and/or polycarbonate (PC). A small molecule may include a self-assembled monolayer (SAM), 10,14-Bis(5-(2-ethylhexyl)thiophen-2-yl)-dipyrido[3,2-a:2',3'-c][1,2,5] thiadiazolo[3,4-]phenazine (TDTP), 1,1-dicyanomethylene-3-indanone (IDIC), N,N'-bis(3-(dimethylamino)propyl)-5, 11-dioctylcoronene-2,3,8,9-tetracarboxdiimide (CDIN), perylene diimides (PDIs), and/or 1-benzyl-3-methylimidazolium chloride. A SAM may be a molecule that includes a phosphonic acid functional group. Examples of phosphonic acid-containing SAMS include [2-(9H-Carbazol-9-yl)ethyl] phosphonic acid (2PACz), [2-(3,6-Dimethoxy-9H-carbazol-9-yl)ethyl]phosphonic acid (MeO-2PACz), [4-(9H-Carbazol-9-yl)butyl]phosphonic acid (4PACz), [4-(3,6-Dimethoxy-9H-carbazol-9-yl)butyl]phosphonic acid (MeO-4PACz), [4-(3,6-Dimethyl-9H-carbazol-9-yl)butyl] phosphonic acid (Me-4PACz), and/or [2-(3,6-Dimethyl-9H-carbazol-9-yl)ethyl]phosphonic acid (Me-2PACz). In some embodiments of the present disclosure, a SAM may include an aliphatic carbon chain and halogen.

As previously described, a metal oxide layer may be deposited using a solution processing method using metal oxide nanocrystals as a starting material, where the nanocrystals are stabilized using a ligand. A ligand may be at least one of an acidic ligand, a basic ligand, and/or a zwitterionic ligand. Examples of acidic ligands include oleic acid, phosphonic acid, and/or a phosphinic acid. Examples of phosphinic acid ligands include diisooctylphosphinic acid and/or tetradecylphosphonic acid. Examples of basic ligand include amines, an acetate, and/or an oxide, with specific basic ligands including oleylamine, dioctylamine, and/or trioctylphosphine oxide. Examples of zwitterionic ligand include 3-(N,N-dimethyloctadecylammonio)-propanesulfonate, N-hexadecylphosphocholine, and/or N,N-dimethyldodecylammoniobutyrate.

Figure 1B:
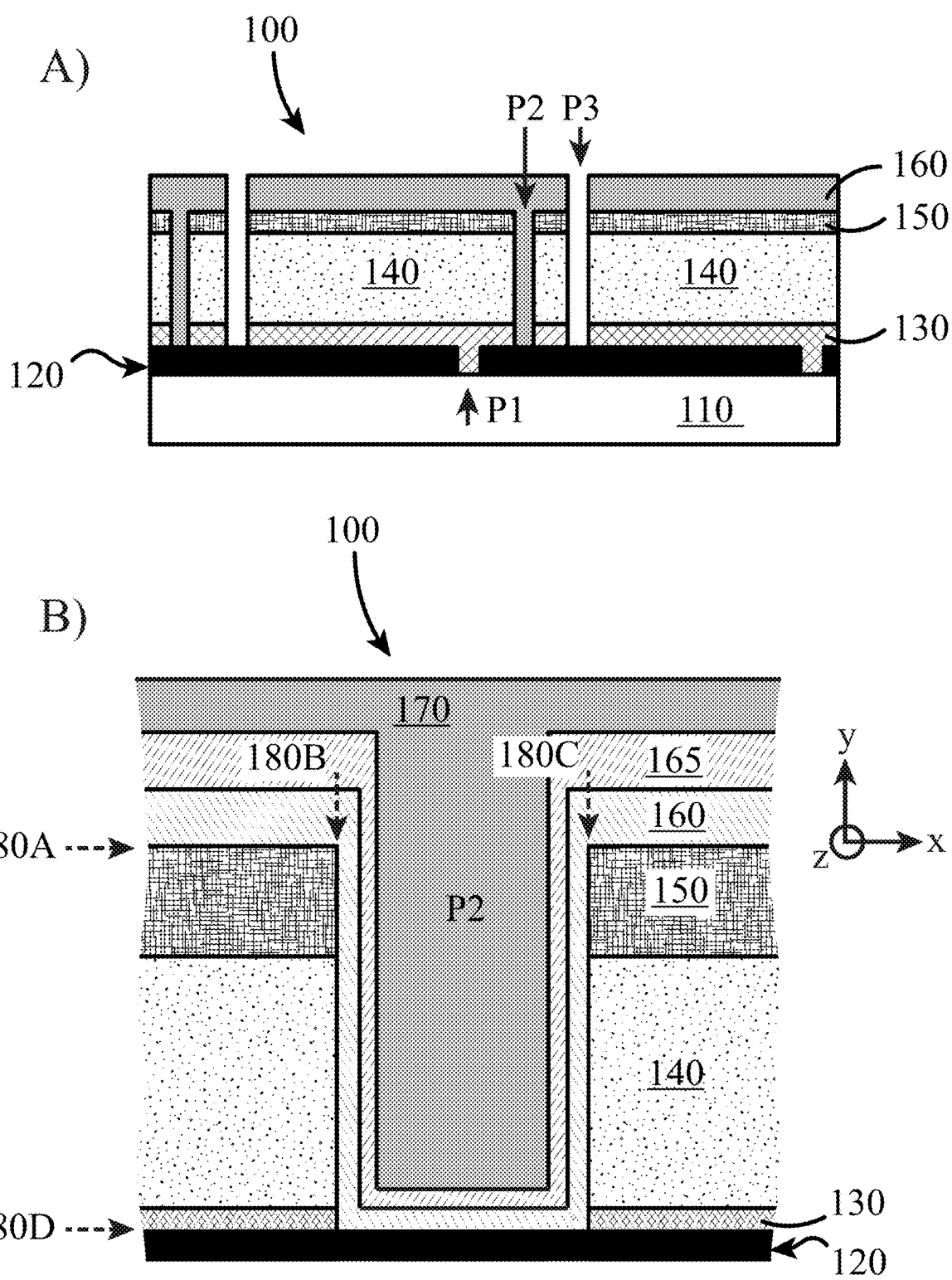

Panel A of FIG. 1B illustrates a device like that shown in FIG. 1A, but with the addition of a first gap P1, a second gap P2, and a third gap P3. Panel B of FIG. 1B magnifies the second gap P2 to show the first metal oxide layer 160 and the second metal oxide layer 165 (not drawn to scale). In some embodiments, the first metal oxide layer 160 and/or the second metal oxide layer 165 may be partially or fully removed from the bottom of the gap in proximity to the first contact layer 120 prior to the deposition of the second contact layer 170. A device 100 like that in Panel B of FIG. 1B illustrates that at least one of a first metal oxide layer 160 and/or a second metal oxide layer 165 may be positioned on multiple surfaces of a device 100 and may cover surfaces exposed by the formation (e.g., scribing) of the gaps. Referring to Panel B of FIG. 1B, the first metal oxide layer 160 is positioned on a first surface 180A (positioned in an xz-plane) which results from the depositing of the base layer 150 (e.g., a fullerene) onto the absorber layer 140 (e.g., a perovskite). In addition, the first metal oxide layer 160 covers two surfaces 180B and 180C (each positioned in an yz-plane) resulting from the scribing of the P2 gap. Further, in this example, the P2 gap extends through the thickness of the charge transport layer 130 to expose another surface 180D (also positioned in an xz-plane). So, in short, a first metal oxide layer 160 may provide a coating of one or more surfaces of a device 100 that has been scribed. In some embodiments of the present disclosure, a first portion of a first metal oxide layer 160 positioned in a gap may serve essentially the same purpose as a second portion of a first metal oxide layer 160 positioned on xz-planar surface of a base layer 150; to provide a layer that is permeable to an oxygen-containing compound to form nucleation sites to facilitate the depositing of the second metal oxide layer 165. In this example, the P2 gap is subsequently coated with the material (e.g., a metal) used to construct a second contact layer 170 to provide an electrical contact between the first contact layer 130 and the second contact layer 170. Thus, to minimize the resistance of the flow of charge, each metal oxide used to construct the first metal oxide layer 160 and the second metal oxide layer 165 may be conductive. However, given the extremely thin thickness of each metal oxide layer, insulative metal oxides may also be used or they can be removed with a subsequent scribing process prior to the deposition of the second contact layer 170.

Referring again to Panels A and B of FIG. 1B, the method of depositing a first metal oxide layer 160 and a second metal oxide layer 165 may be performed more than once for a given device. For example, the method may be employed a first time for covering a first surface 180A (e.g., the top surface of a fullerene layer). Next, a P2 gap may be scribed followed a second application of the method to the vertical walls of the P2 gap, surfaces 180B and 180C. This may then be followed by the depositing of the second contact layer 170, resulting in the coating of the P2 gap with the material used to make the second contact layer 170. Subsequently, a P3 gap may be scribed into the device, where the P3 gap penetrates the full thicknesses of each of the second contact layer 160, the base layer 150 (e.g., a HTL), the absorber layer (e.g., perovskite layer), and the CTL 130 (e.g., an ETL). The formation of the P3 gap would, therefore, expose portions of each of the layers through which the gap passes. This may necessitate a third use of the method of applying a first metal oxide layer 160 and a second metal oxide layer 165, with or without the intervening step of contacting the first metal oxide layer 160 with an oxygen-containing compound. In this example, the metal oxide layers may simply provide a barrier to the external environment. Furthermore, the metal oxide layers used to coat the surfaces exposed by the P3 gap may be insulative. In some embodiments, this method may be applied to a P1 gap if the P1 scribe is performed after the deposition of the absorber layer 140. In some embodiments, this method may be applied to a gap orthogonal to the P1, P2, and P3 gaps (termed a P4 gap) that bisects at least some portion of the absorber layer 140. In some embodiments, the surfaces 180B and 180C may not be vertical and limited to the yz-plane.

Figure 2:
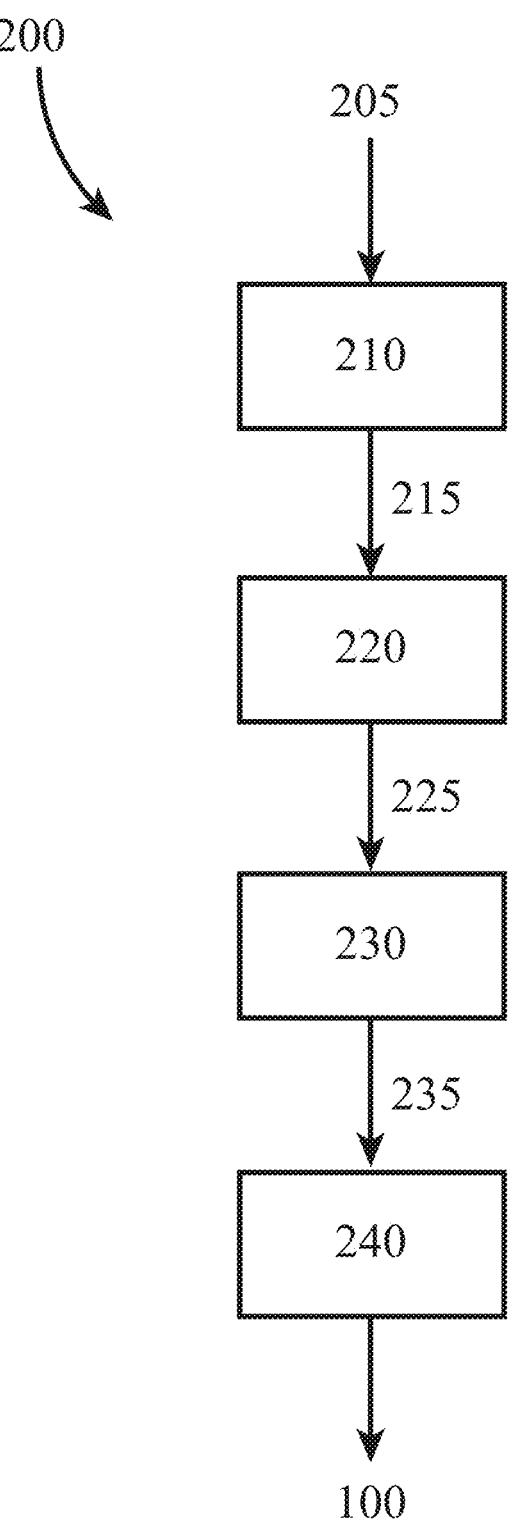
FIG. 2 illustrates a method for manufacturing devices like those illustrated in FIGS. 1A and 1B, according to some embodiments of the present disclosure.

FIG. 2 illustrates a method 200 for making a device 100, like that illustrated in FIGS. 1A and 1B, according to some embodiments of the present disclosure. This shows that a method 200 may begin with a first depositing 210 of a first metal oxide layer onto a surface of a starting device 205. For example, a starting device 205 may have some of the features of the exemplary device illustrated in FIG. 1A, e.g., a substrate 110, a first contact layer 120, a CTL 130 (e.g., an ETL), an absorber layer 140, and a base layer 150 (e.g., a HTL constructed of a fullerene), where the first depositing 210 deposits the first metal oxide layer 160 onto the base layer 150 (e.g., a fullerene layer). The first depositing 210, therefore, results in a first intermediate device 215 having a first metal oxide layer 160, that is permeable to an oxygen-containing compound such as ozone. Thus, a method 200 may continue with the contacting of the first intermediate device 215 with at least one of an oxygen-containing compound and/or an oxygen plasma, such that the oxygen-containing compound and/or oxygen plasma pass through the first metal oxide layer 160 to the surface of the base layer 150 and into at least a portion of the thickness of the base layer 150, resulting in the formation of oxygen-containing functional groups. Examples of an oxygen-containing functional group include at least one of an epoxide, a hydroxyl, a carboxyl, a carbonyl, an aldehyde, an ester, a carboxylic acid, an ether, a ketone, an acyl halide, an amide, and/or an acid anhydride. As described previously, the oxygen-containing functional groups result from the reaction of carbon present in the base layer with the oxygen-containing compound and/or an oxygen plasma, resulting in a treated device 225, as illustrated in FIG. 2. These oxygen-containing functional groups then act as nucleation sites to facilitate the deposition of a second metal oxide layer 165 onto the first metal oxide layer 160 during a subsequent second depositing 230 to form a second intermediate device 235 capped with the second metal oxide layer 165. As shown below, this combination of a first depositing 210 of a first metal oxide layer 160, a contacting 220 of first intermediate device 215 with an oxygen-containing compound, followed by a second depositing 230 of a second metal oxide layer 165, results in a second intermediate device 235 having a final conformal metal oxide layer having superior physical properties and performance metrics that results in solar cells that demonstrate excellent performance metrics (e.g., closed-circuit current ($J_{cc}$), open-circuit voltage ($V_{oc}$), fill-factor (FF), and power conversion efficiency (PCE)).

In some embodiments of the present disclosure, an oxygen-containing functional group may be present in at least one of a gradient aligned in a direction across the thickness of a base layer 150 or in a direction that is substantially orthogonal to an interface between a base layer 150 and a first metal oxide layer 160. A second depositing 230 may result in at least a portion of the metal oxide of the second metal oxide layer 165 penetrating into at least one of the surface of a base layer 150 and/or into a portion of a base layer's thickness, as determined by scanning transmission electron microscopy (STEM).

In some embodiments of the present disclosure, a first depositing 210 of a first metal oxide layer 160 may be performed using at least one of a gas phase method, a vapor phase method, and/or a solution phase method. In some embodiments of the present disclosure, a first depositing 210 of a first metal oxide layer 160 may be performed using atomic layer deposition (ALD) and a first metal oxide precursor. In some embodiments of the present disclosure, a first depositing 210 may be performed using between 1 ALD cycles and 150 ALD cycles or between 1 ALD cycle and 40 ALD cycles. In some embodiments of the present disclosure, a first metal oxide precursor may include tetrakis-dimethyl-amino tin (IV) (TDMASn) and the first metal oxide layer 160 may be constructed of tin oxide. In some embodiments of the present disclosure, a first depositing 210 using ALD may further include water during at least a portion of the ALD cycles. In some embodiments of the present disclosure, a first depositing 210 using ALD may be performed at a temperature between 50° C. and 150° C.

In some embodiments of the present disclosure, a first depositing 210 of a first oxide layer 160 may be performed using a solution phase method that includes applying a solution onto a base layer 150, where the solution includes a metal oxide nanoparticle suspended in an alcohol. The metal oxide nanoparticle in the solution may include a metal oxide core and a ligand connected to the metal oxide core, where the ligand stabilizes the nanoparticle. A ligand may include at least one of an acidic ligand, a basic ligand, and/or a zwitterionic ligand.

In some embodiments of the present disclosure, an oxygen-containing compound used for the contacting 220 includes ozone (i.e., $O_3$). In some embodiments of the present disclosure, contacting 220 may include ozone as the oxygen-containing compound, where the first intermediate device 215 is contacted with ozone for a period of time between 10 ms and 60 seconds or between 100 ms and 50 seconds or between 1 second and 10 seconds. In some embodiments of the present disclosure, the contacting 220 of the first intermediate device 215 with ozone may be repeated between once (1 cycle) and 50 times (50 cycles), or between 1 cycle and 10 cycles.

In some embodiments of the present disclosure, contacting 220 may include water. In some embodiments of the present disclosure, contacting 220 may include ozone and water, where the first intermediate device 215 is contacted with ozone and water simultaneously for a period of time between 10 ms and 60 seconds or between 100 ms and 50 seconds or between 1 second and 10 seconds. In some embodiments of the present disclosure, the contacting 220 of the first intermediate device 215 simultaneously with ozone and water may be repeated between 1 cycle and 50 cycles, or between 1 cycle and 10 cycles.

In some embodiments of the present the contacting 220 may include two sequential contacting steps, starting with a first contacting of the first intermediate device 215 with ozone for a period of time between 10 ms and 60 seconds or between 100 ms and 50 seconds or between 1 second and 10 seconds, followed by a second contacting of the first intermediate device 215 using water for a second period of time between 1 ms and 10 second or between 10 ms and 1000 ms or between 50 ms and 200 ms. In some embodiments of the present disclosure, the sequential contacting 220 of the first intermediate device 215, first with ozone and second with water may be repeated between 1 cycle and 50 cycles, or between 1 cycle and 10 cycles.

In some embodiments of the present disclosure, a second depositing 210 of a second metal oxide layer 165 may be performed using at least one of a gas phase method, a vapor phase method, and/or a solution phase method. In some embodiments of the present disclosure, a second depositing 230 of a second metal oxide layer 165 may be performed using atomic layer deposition (ALD) and a second metal oxide precursor. In some embodiments of the present disclosure, a second depositing 220 may be performed using between 1 ALD cycles and 150 ALD cycles or between 1 ALD cycle and 40 ALD cycles. In some embodiments of the present disclosure, a second metal oxide precursor may include tetrakis-dimethylamino tin (IV) (TDMASn) and the second metal oxide layer 165 may be constructed of tin oxide. In some embodiments of the present disclosure, a second depositing 220 using ALD may further include water and/or ozone during at least a portion of the ALD cycles. In some embodiments of the present disclosure, a second depositing 210 using ALD may be performed at a temperature between 50° C. and 150° C.

Referring again to FIG. 2, a method may conclude with one or more post-processing steps 240. Post-processing steps may include, among other things, (non in order) at least one of scribing a P1 gap, a P2, and/or a P3 gap, depositing a contact layer, and/or depositing the layers needed to construct a tandem or multi-junction device. Thus, the benefits resulting from the methods described herein may be applicable to a diverse group of materials and device architectures (i.e., stacks). In some embodiments of the present disclosure, a device may have a p-i-n architecture or a n-i-p device architecture. In some embodiments of the present disclosure, a device may be a single junction device, a tandem device, or a multi-junction device. The present methods may be beneficial for the manufacture of other metal halide perovskite-containing devices such as displays, sensors, and light-emitting diodes, to name a few.

Figure 3A:
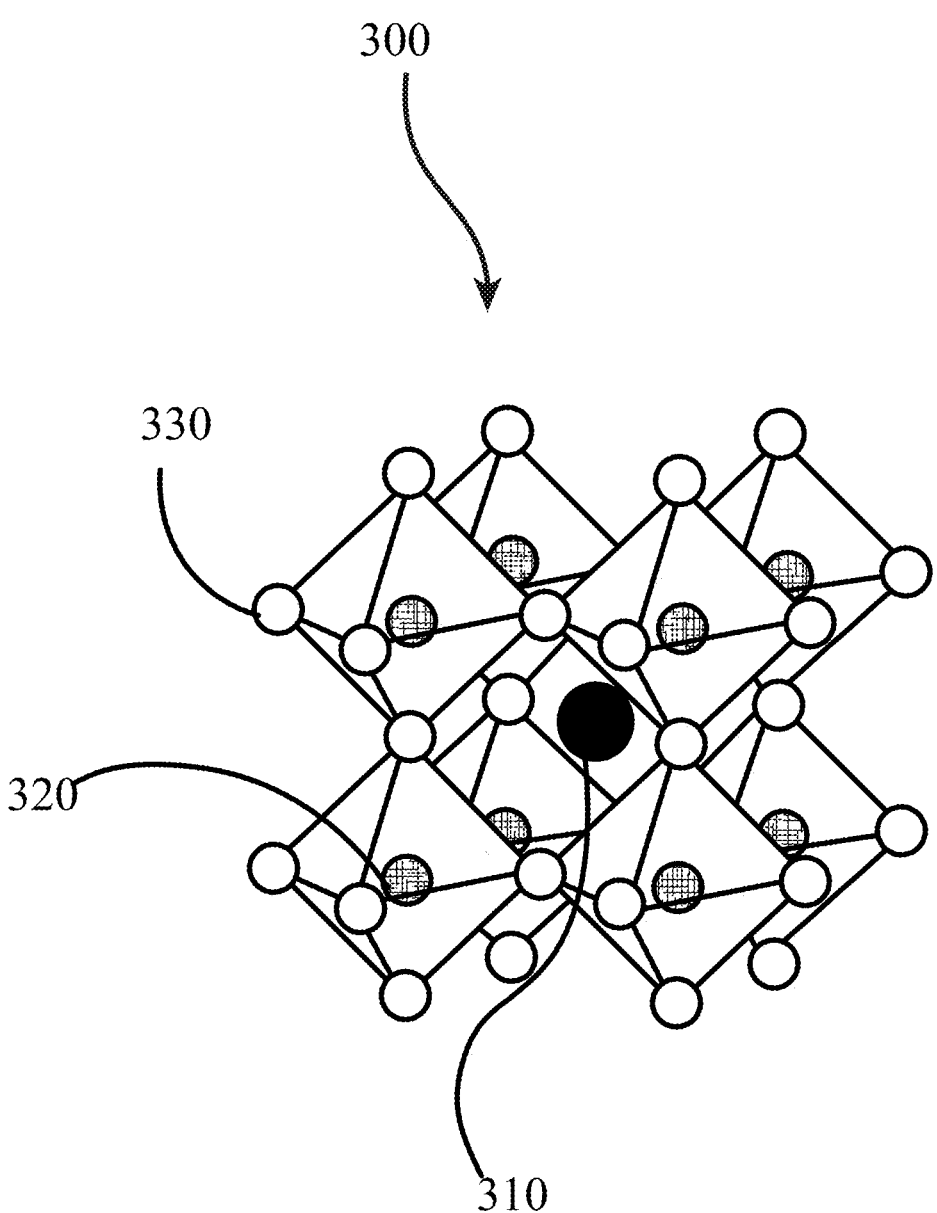
FIGS. 3A and 3B illustrate a perovskite in a corner-sharing, cubic phase arrangement, according to some embodiments of the present disclosure.
Figure 3B:
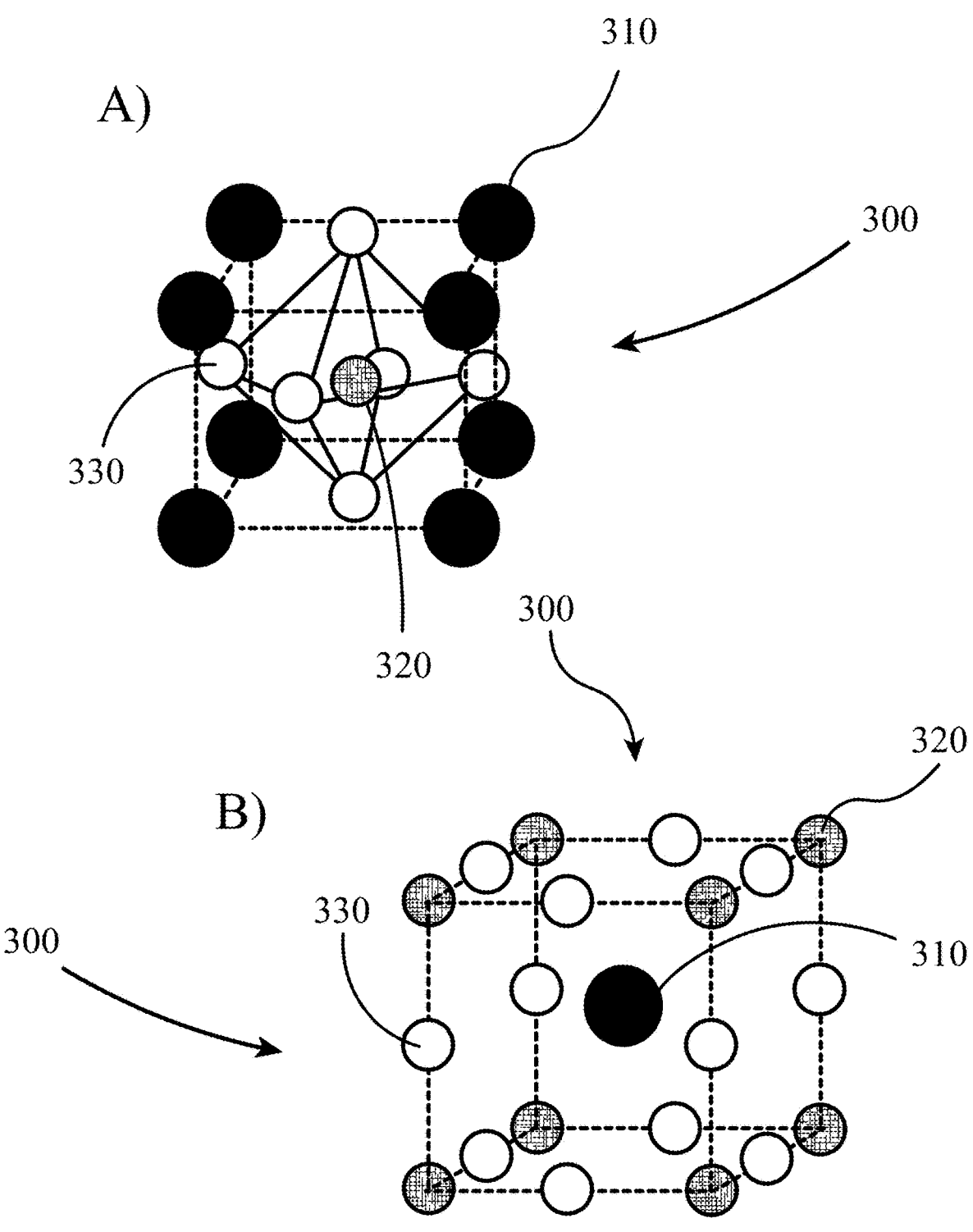

The following section describes perovskites, which in the context of the present disclosure, relate mostly to metal halide perovskites (MHPs). In general, the term "perovskite" refers to compositions having a network of corner-sharing $BX_6$ octahedra resulting in the general stoichiometry of $ABX_3$. FIGS. 3A and 3B illustrate that perovskites 100, for example MHPs, may organize into a three-dimensional (3D) cubic crystalline structures (i.e., $\alpha$-phase or $\alpha$-$ABX_3$) constructed of a plurality of corner-sharing $BX_6$ octahedra. In the general stoichiometry for a perovskite, $ABX_3$, X (130) is an anion and A (110) and B (120) are cations, typically of different sizes. FIG. 3A illustrates that a perovskite 100 having an $\alpha$-phase structure may be further characterized by eight $BX_6$ octahedra surrounding a central A-cation 110, where each octahedra is formed by six X-anions 130 surrounding a central B-cation 120 and each of the octahedra are linked together by "corner-sharing" of anions, X (130).

Panel A of FIG. 3B provides another visualization of a perovskite 100 in the $\alpha$-phase, also referred to as the cubic phase. This is because, as shown in FIG. 3B, a perovskite in the $\alpha$-phase may be visualized as a cubic unit cell, where the B-cation 120 is positioned at the center of the cube, an A-cation 110 is positioned at each corner of the cube, and an X-anion 130 is face-centered on each face of the cube. Panel B of FIG. 3B provides another visualization of the cubic unit cell of an $\alpha$-phase perovskite, where the B-cation 120 resides at the eight corners of a cube, while the A-cation 110 is located at the center of the cube and with 12 X-anions 130 centrally located between B-cations 120 along each edge of the unit cell. For both unit cells illustrated in FIG. 3B, the A-cations 110, the B-cations 120, and the X-anions 130 balance to the general formula $ABX_3$ of a perovskite, after accounting for the fractions of each atom shared with neighboring unit cells. For example, referring to Panel A of FIG. 3B, the single B-cation 120 atom is not shared with any of the neighboring unit cells. However, each of the six X-anions 130 is shared between two unit cells, and each of the eight A-cations 110 is shared between eight unit cells. So, for the unit cell shown in Panel A of FIG. 3B, the stoichiometry simplifies to B=1, A=8*0.125=1, and X=6*0.5=3, or $ABX_3$. Similarly, referring again to Panel B of FIG. 3B, since the A-cation is centrally positioned, it is not shared with any of the unit cells neighbors. However, each of the 12 X-anions 130 is shared between four neighboring unit cells, and each of the eight B-cations 120 is shared between eight neighboring unit cells, resulting in A=1, B=8*0.125=1, and X=12*0.25=3, or $ABX_3$. Referring again to Panel B of FIG. 3B, the X-anions 130 and the B-cations 120 of a perovskite in the $\alpha$-phase are aligned along an axis; e.g., where the angle at the X-anion 130 between two neighboring B-cations 120 is exactly 180 degrees, referred to herein as the tilt angle. However, as shown in FIG. 4A, a perovskite 100 may assume other corner-sharing crystalline phases having tilt angles not equal to 180 degrees.

Figure 4A:
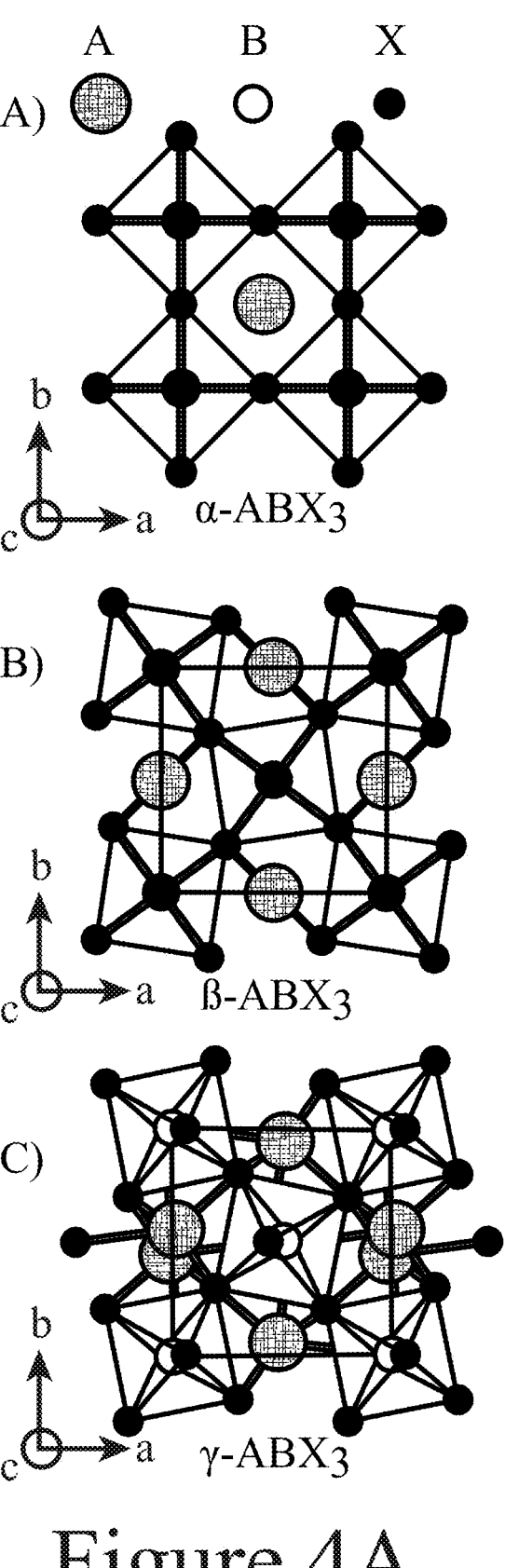
FIG. 4A illustrates three possible corner-sharing phases for perovskites, Panel A cubic phase (i.e., $\alpha$-$ABX_3$), Panel B a tetragonal crystalline phase (i.e., $\beta$-$ABX_3$), and Panel C an orthorhombic crystalline phase (i.e., $\gamma$-$ABX_3$), according to some embodiments of the present disclosure.

FIG. 4A illustrates that a perovskite can assume other crystalline forms while still maintaining the criteria of an $ABX_3$ stoichiometry with neighboring $BX_6$ octahedra maintaining X anion (130) corner-sharing. Thus, in addition to $\alpha$-$ABX_3$ perovskites (in the cubic phase) having a tilt angle of 180 degrees, shown in Panel A of FIG. 4A, a perovskite may also assume a tetragonal crystalline phase (i.e., $\beta$-$ABX_3$) (see Panel B of FIG. 4A) and/or an orthorhombic crystalline phase (i.e., $\gamma$-$ABX_3$) (see Panel C of FIG. 4A), where the adjacent octahedra are tilted relative to the reference axes a, b, and c.

Figure 4B:
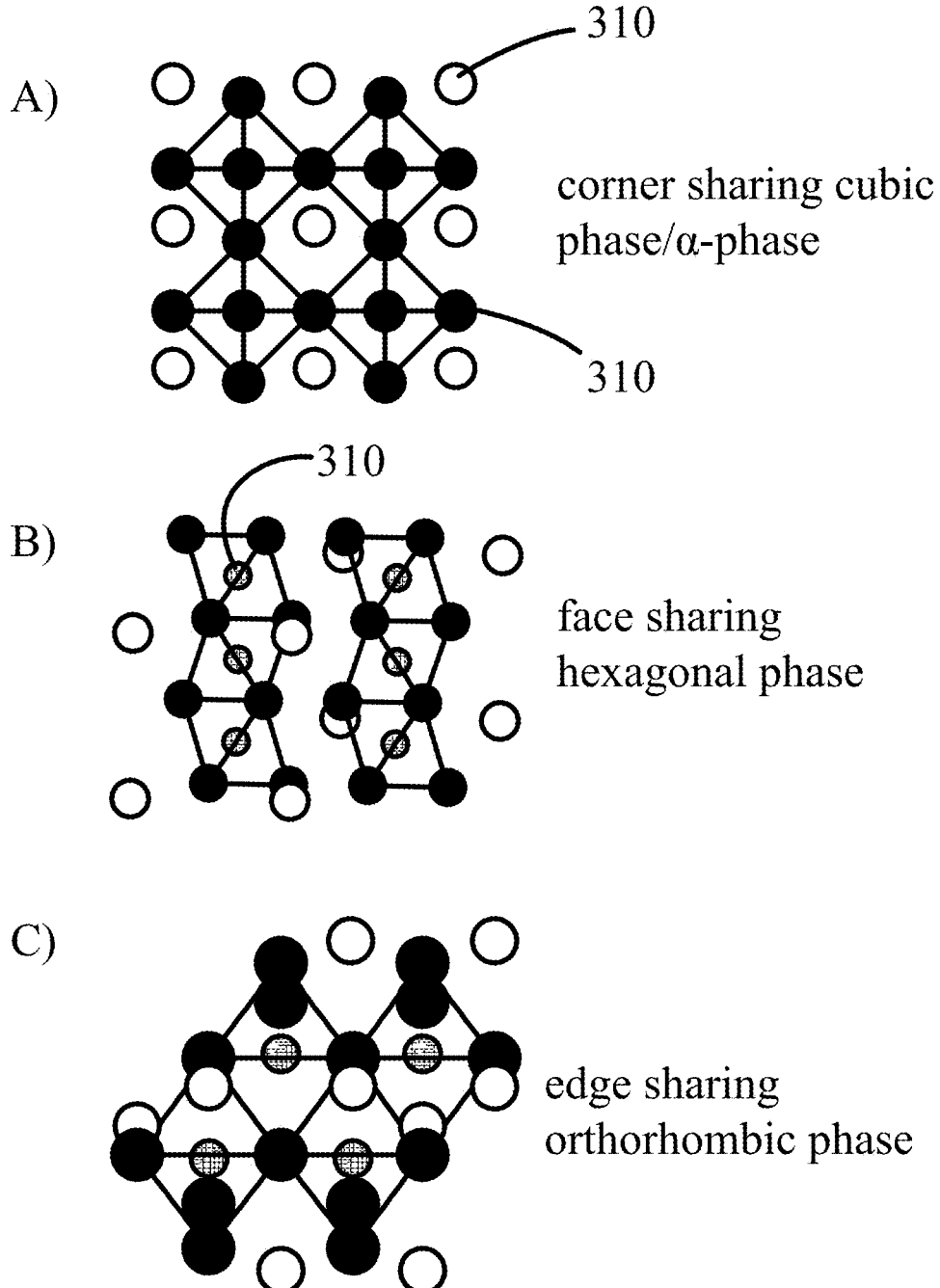
FIG. 4B illustrates a perovskite in one of the three possible phases, the cubic phase (i.e., $\alpha$-phase), compared to two non-perovskite phases (i.e., non-corner sharing), according to some embodiments of the present disclosure.

FIG. 4B illustrates that the elements used to construct a perovskite, as described above, A-cations 110, B-cations 120, and X-anions 130, may result in 3D non-perovskite structures; i.e., structures where neighboring $BX_6$ octahedra are not X-anion 130 corner-sharing and/or do not have a unit structure that simplifies to the $ABX_3$ stoichiometry. Referring to Panel A of FIG. 4B, illustrates a perovskite in the cubic phase, i.e., $\alpha$-$ABX_3$, compared to a non-perovskite structure constructed of face-sharing $BX_6$ octahedra resulting in a hexagonal crystalline structure (see Panel B of FIG. 4B) and a non-perovskite structure constructed of edge-sharing $BX_6$ octahedra resulting in an orthorhombic crystalline structure (see Panel C of FIG. 4B).

Figure 5:
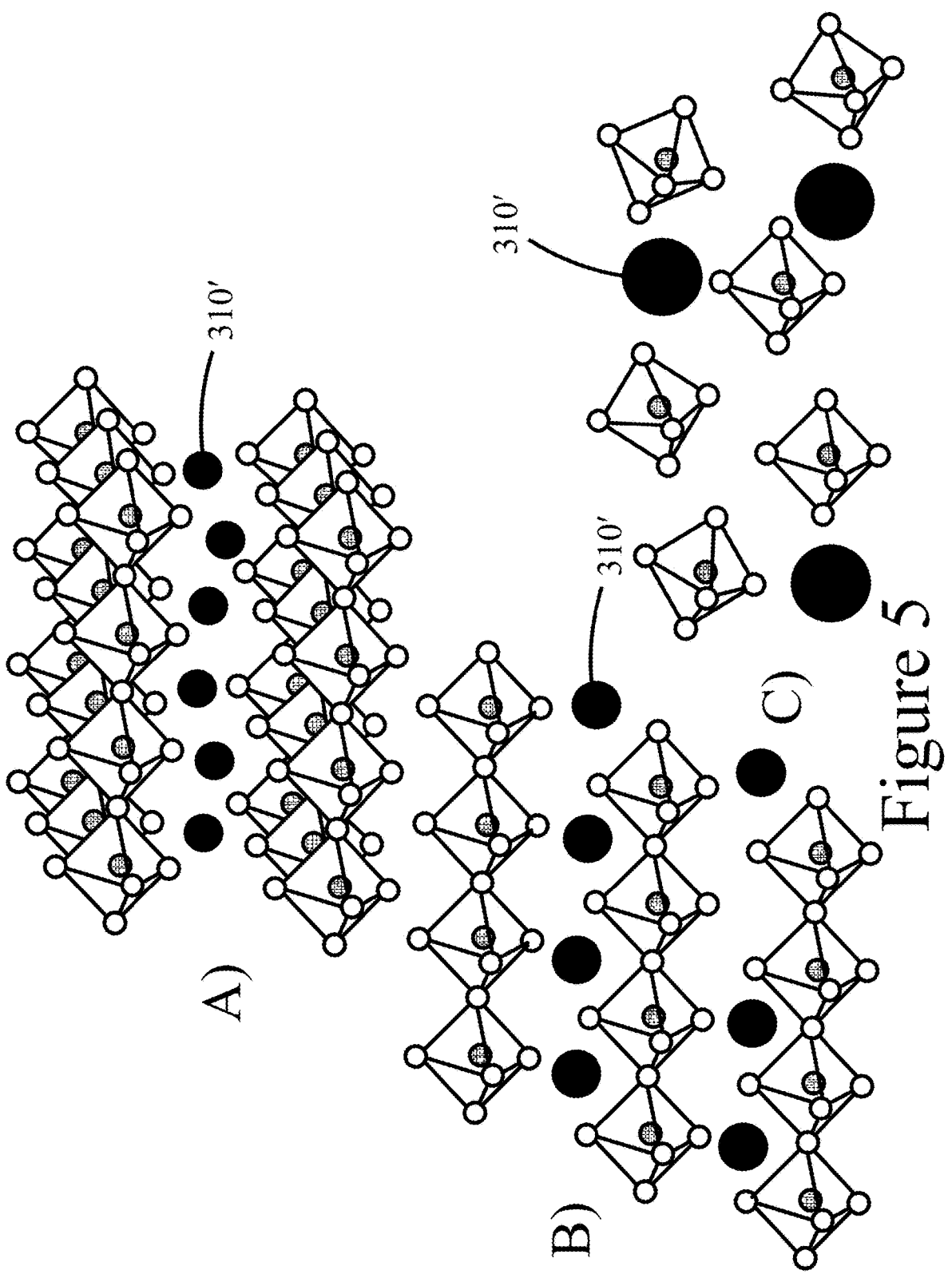
FIG. 5 illustrates 2D, 1D, and 0D perovskite-like structures, in Panels A, B, and C, respectively, according to some embodiments of the present disclosure.

Further, referring now to FIG. 5, the elements used to construct a perovskite, as described above, A-cations 110, B-cations 120, and X-anions 130, may result in non-3D (i.e., lower dimensional structures) perovskite-like structures such as two-dimensional (2D) structures, one-dimensional (1D) structures, and/or zero-dimensional (0D) structures. As shown in FIG. 5, such lower dimensional, perovskite-like structures still include the $BX_6$ octahedra, and depending on the dimensionality, e.g., 2D or 1D, may still maintain a degree of X-anion corner-sharing. However, as shown in FIG. 5, the X-anion 130 corner-sharing connectivity of neighboring octahedra of such lower dimensional structures, i.e., 2D, 1D, and 0D, is disrupted by intervening A-cations 110. Such a disruption of the neighboring octahedra, can be achieved by, among other things, varying the size of the intervening A-cations 110.

Referring to Panel A of FIG. 5, a 3D perovskite may be transformed to a 2D perovskite-like structure, 1D perovskite-like structure, and/or 0D perovskite-like structure. Where the degree of X-anion 130 corner sharing decreases and the stoichiometry changes according to the formula $(A')_m(A)_{n-1}B_nX_{3n+1}$, where monovalent (m=2) or divalent (m=1) A' cations 110' can intercalate between the X-anions of 2D perovskite-like sheets. Referring to Panel B of FIG. 5, 1D perovskite-like structures are constructed by $BX_6$ octahedral chained segments spatially isolated from each other by surrounding bulky organic A'-cations 110', leading to bulk assemblies of paralleled octahedral chains. Referring to Panel C of FIG. 5, typically, the 0D perovskite-like structures are constructed of isolated inorganic octahedral clusters and surrounded by small A'-cations 110', which may be connected via hydrogen bonding. In general, as n approaches infinity the structure is a pure 3D perovskite and when n is equal to 1, the structure is a pure 2D perovskite-like structure. More specifically, when n is greater than 10 the structure is considered to be essentially a 3D perovskite material and when n is between 1 and 5, inclusively, the structure is considered substantially a 2D perovskite-like material.

For simplification, as used herein the term "perovskite" will refer to each of the structures illustrated in FIGS. 3A through 5, unless specified otherwise. Thus, unless specified otherwise, the term "perovskite" as used herein includes each of a true corner-sharing $ABX_3$ perovskite, as illustrated in FIGS. 3A, 3B, and 4A, as well as perovskite-like compositions having 0D, 1D, and/or 2D structures like those shown in FIG. 5, and non-perovskites as illustrated in Panels B and C of FIG. 4B, respectively.

In some embodiments of the present invention, the A-cation 110 may include a nitrogen-containing organic compound such as an alkyl ammonium compound. The B-cation 120 may include a metal and the X-anion 130 may include a halogen. Additional examples for the A-cation 110 include organic cations and/or inorganic cations, for example Cs, Rb, K, Na, Li, and/or Fr. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium ($CH_3NH_3^+$), ethylammonium ($CH_3CH_2NH_3^+$), propylammonium ($CH_3CH_2CH_2NH_3^+$), butylammonium ($CH_3CH_2CH_2CH_2NH_3^+$), formamidinium ($NH_2CH{=}NH_2^+$), hydrazinium, acetylammonium, dimethylammonium, imidazolium, guanidinium, benzylammonium, phenethylammonium, butylammonium and/or any other suitable nitrogen-containing or organic compound. In other examples, an A-cation 110 may include an alkylamine. Thus, an A-cation 110 may include an organic component with one or more amine groups. For example, an A-cation 110 may be an alkyl diamine halide such as formamidinium ($CH(NH_2)_2$). Thus, the A-cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Examples of metal B-cations 120 include, for example, lead, tin, germanium, and or any other 2+ valence state metal that can charge-balance the perovskite 100. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for X-anions 130 include halogens: e.g., fluorine, chlorine, bromine, iodine and/or astatine. In some cases, the perovskite halide may include more than one X-anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cation 120, and X-anion 130 may be selected within the general formula of $ABX_3$ to produce a wide variety of perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite 100 may have more than one halogen element, where the various halogen elements are present in non-integer quantities; e.g., x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure. As described herein, the A-cation 110 of a perovskite 100, may include one or more A-cations, for example, one or more of cesium, FA, MA, etc. Similarly, the B-cation 120 of a perovskite 100, may include one or more B-cations, for example, one or more of lead, tin, germanium, etc. Similarly, the X-anion 130 of a perovskite 100 may include one or more anions, for example, one or more halogens (e.g., at least one of I, Br, Cl, and/or F), thiocyanate, and/or sulfur. Any combination is possible provided that the charges balance.

For example, a perovskite having the basic crystal structure illustrated in FIGS. 3A and 3B, in at least one of a cubic, orthorhombic, and/or tetragonal structure, may have other compositions resulting from the combination of the cations having various valence states in addition to the 2+ state and/or 1+ state described above for lead and alkyl ammonium cations; e.g., compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1+}B^{3+}X_6$, with an example of such a composition being $Cs_2BiAgCl_6$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations.

Figure 6A:
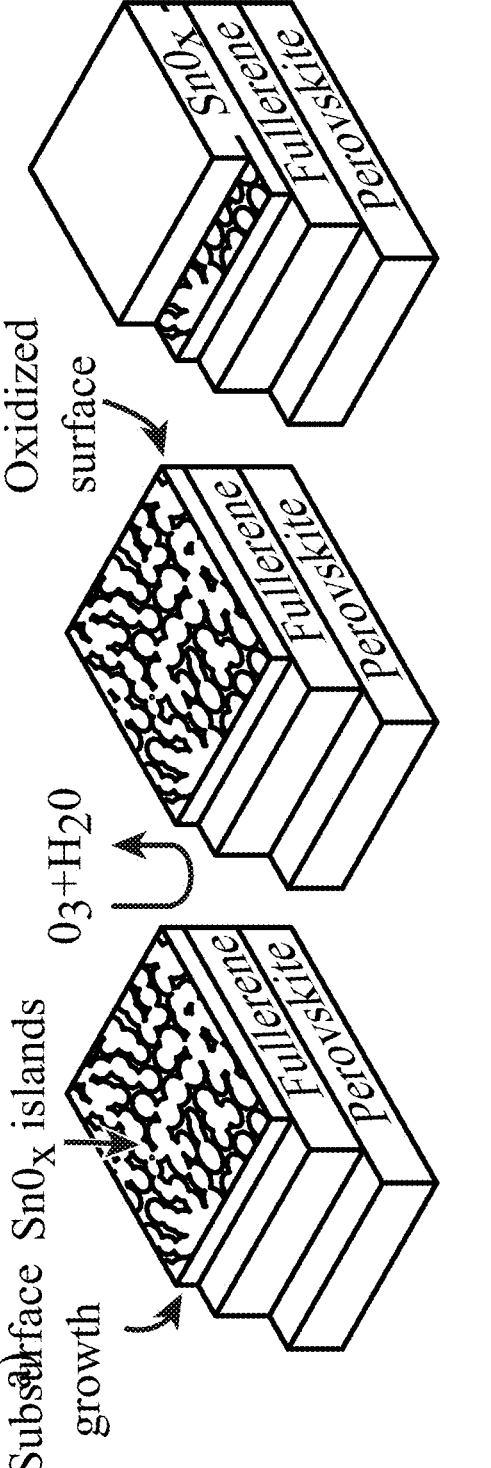
FIG. 6A illustrates an overview of an ozone seeding mechanism and implementation in devices, a visual schematic of the in-situ ozone treatment during the atomic layer deposition of tin oxide on fullerene, according to some embodiments of the present disclosure.

Limited Diffusion of Ozone Through Metal Oxide Layers Enables Devices: Using the methods described above, ozone, as well as other oxygen-containing compounds, can poor nucleation and subsurface growth. The middle image of FIG. 6A illustrates contacting 220 the first intermediate device 215 with ozone and water, resulting in a treated device 225 having oxygen-containing functional groups on the exposed surfaces of the fullerene base layer 150. The image on the right of FIG. 6A illustrates a final device 225 resulting from a second depositing 230 by ALD of a second metal oxide layer 165 onto the first metal oxide layer 160. Here, ALD growth resumes on the functionalized surface of the fullerene base layer 150 and the first metal oxide layer 160, where the enhanced nucleation provided by the oxygen-containing functional groups result in a denser and more conformal final metal oxide barrier.

The mechanism illustrated in FIG. 6A was evaluated beginning with the investigation of the effects of first metal oxide layer 160 thicknesses on device performance and degradation as a result of contact with ozone. 1.73 eV band gap p-i-n devices with the MHP composition $DMA_{0.1}FA_{0.6}Cs_{0.3}Pb(I_{2.4}Br_{0.6})_3$ were fabricated with a fullerene base layer 150 as an electron transport layer (ETL) contact and varying thicknesses of an ALD-deposited first oxide layer 160 of $SnO_x$. The $SnO_x$ first oxide layers 160 were deposited (first depositing 210) at 0, 20, 40, 60, 80, 100, and 120 cycles and exposed to about 60 seconds of an in-situ dose of ozone at a concentration of 175 grams per normal cubic meter ($g/Nm^3$). After ozone treatment, a second depositing 230 was completed using ALD for a cumulative deposition (first metal oxide layer 160 and second metal oxide layer 165) of 125 cycles, resulting in a combined thickness for both metal oxide layers (160 and 165) of approximately 15 nm (1.2 Å/cycle). Devices were completed with an evaporated silver electrode. The power conversion efficiency of the resultant solar cells is plotted versus first metal oxide layer 160 thickness (cycle) prior to the ozone exposure in FIG. 6B (All devices were subjected to a total of 125 tin-oxide ALD cycles, the deposition was paused at the stated number of cycles for 60 second in-situ ozone treatment before resuming). Current-voltage curves for the 0, 20, 40 cycle first metal oxide layer 160 thicknesses and control cells are illustrated in FIG. 6C. Device performance statistics can be found in Table 1.

TABLE 1

Figure 6B:
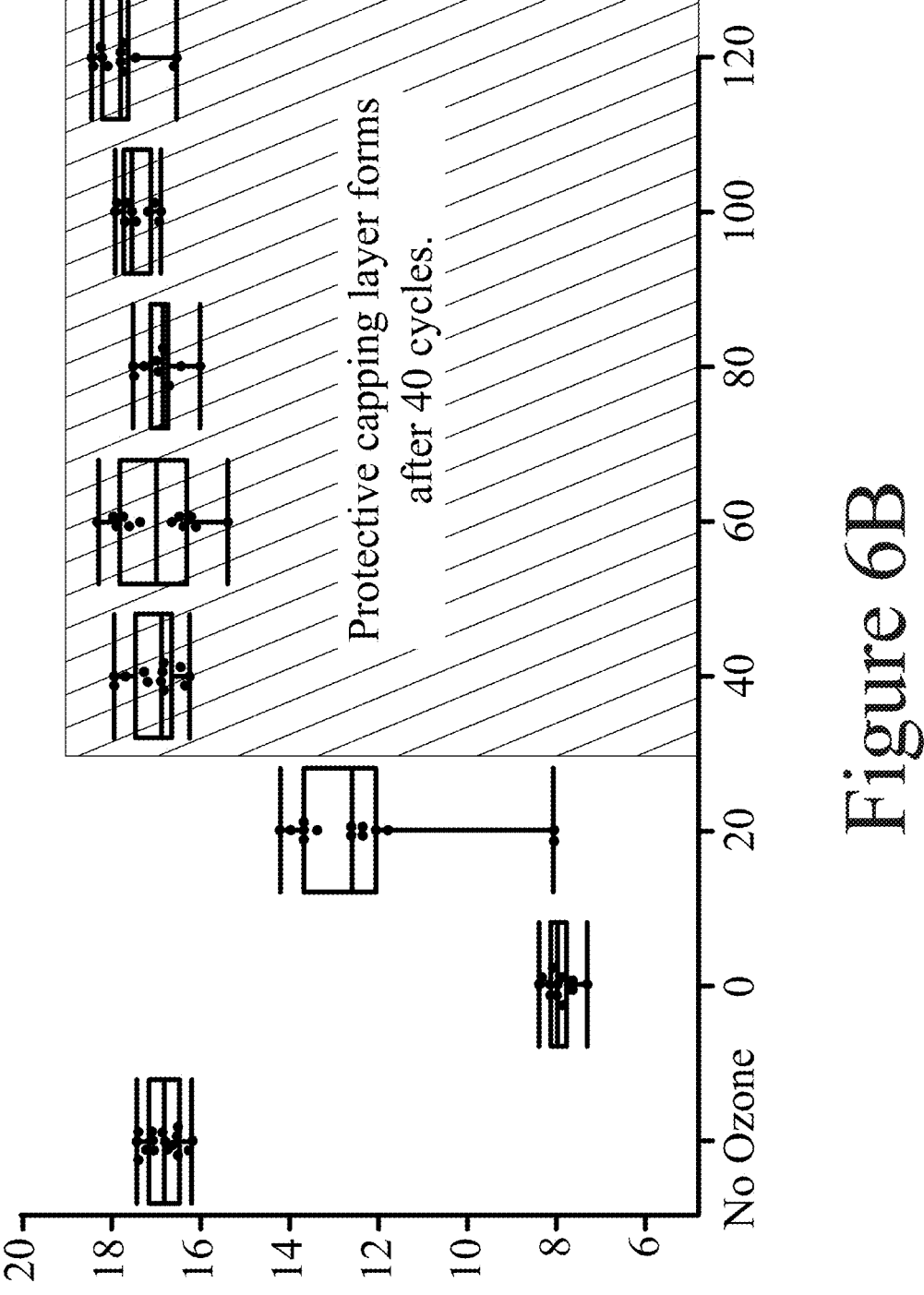
FIG. 6B illustrates in-situ ozone treatment's impact on device power conversion efficiency with an increasing thickness of $SnO_x$ layer, according to some embodiments of the present disclosure.
Figure 6C:
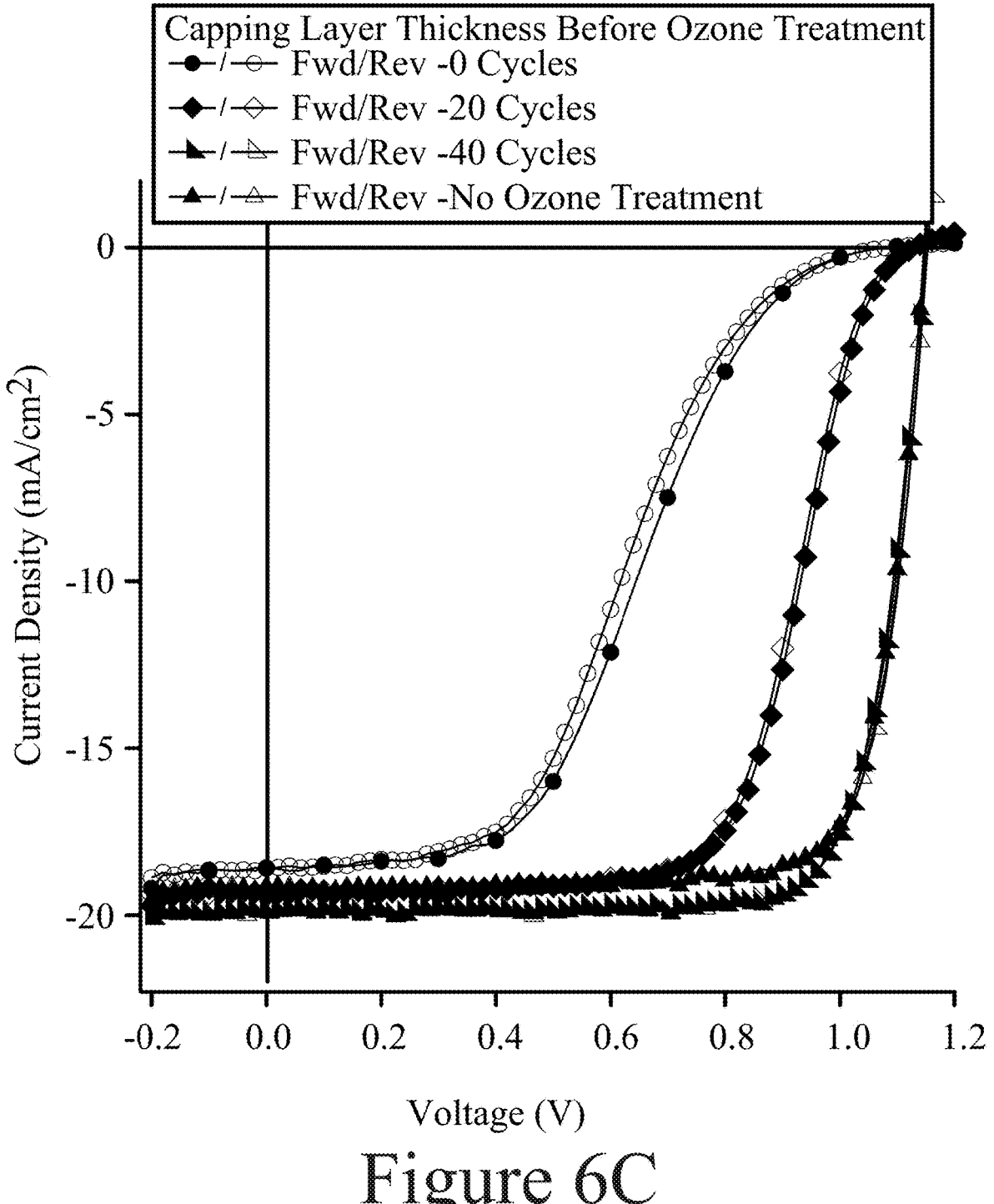
FIG. 6C illustrates a comparison of the forward and reverse JV scans of the 0, 20, and 40-cycle delayed devices with the ozone-free control devices under 1-sun illumination, according to some embodiments of the present disclosure.
Figure 7:
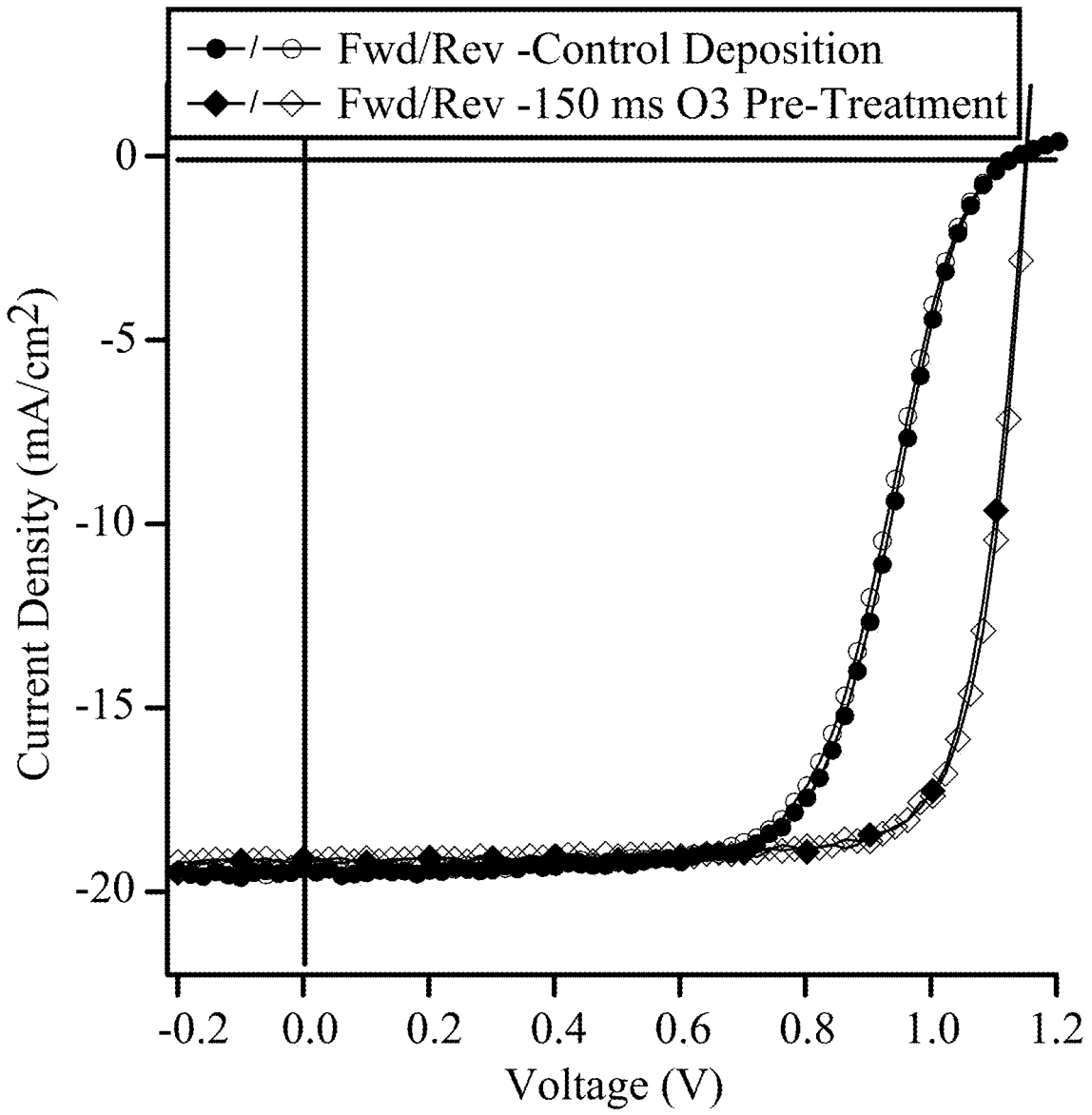
FIG. 7 illustrates forward and reverse JV curves from a device pre-treated with a short, 150 ms pulse of ozone prior to deposition, compared to a control deposition, according to some embodiments of the present disclosure. both devices received a total of 125 ALD $SnO_x$ cycles.

| | | | | |
|---|---|---|---|---|
| Device performance statistics displayed as (Median; [Quartile 1, Quartile 3]) for the first metal oxide layer experiment in FIG. 6B, n = 18 for each variable. | | | | |
| n = 18 | PCE (%) Median; [Q1, Q3] | FF (%) Median; [Q1, Q3] | $V_{oc}$ (mV) Median; [Q1, Q3] | $J_{sc}$ ($mA/cm^2$) Median; [Q1, Q3] |
| No Ozone | 16.83; [16.51, 17.11] | 16.83; [16.51, 17.11] | 16.83; [16.51, 17.11] | 16.83; [16.51, 17.11] |
| 0 cycles | 16.83; [16.51, 17.11] | 16.83; [16.51, 17.11] | 16.83; [16.51, 17.11] | 16.83; [16.51, 17.11] |
| 20 cycles | 16.83; [16.51, 17.11] | 16.83; [16.51, 17.11] | 16.83; [16.51, 17.11] | 16.83; [16.51, 17.11] |
| 40 cycles | 16.83; [16.51, 17.11] | 16.83; [16.51, 17.11] | 16.83; [16.51, 17.11] | 16.83; [16.51, 17.11] |
| 60 cycles | 16.83; [16.51, 17.11] | 16.83; [16.51, 17.11] | 16.83; [16.51, 17.11] | 16.83; [16.51, 17.11] |
| 80 cycles | 16.83; [16.51, 17.11] | 16.83; [16.51, 17.11] | 16.83; [16.51, 17.11] | 16.83; [16.51, 17.11] |
| 100 cycles | 16.83; [16.51, 17.11] | 16.83; [16.51, 17.11] | 16.83; [16.51, 17.11] | 16.83; [16.51, 17.11] |
| 120 cycles | 16.83; [16.51, 17.11] | 16.83; [16.51, 17.11] | 16.83; [16.51, 17.11] | 16.83; [16.51, 17.11] | functionalize exposed carbon-containing materials such as fullerene, for example within voids remaining in a thin oxide layer (a first metal oxide layer 160), thereby enabling the subsequent growth of a second metal oxide layer 165 using, for example, ALD, without a loss of performance in the final device. FIG. 6A illustrates this mechanism, starting with the left image depicting a first intermediate device 215 resulting from a first depositing 210 by ALD of a first metal oxide layer 165 of $SnO_x$ onto a fullerene base layer 150. This initial ALD oxide growth is likely not uniform on fullerene due to The results show that ozone exposure to an unprotected perovskite/$C_{60}$ (absorber layer surface is detrimental to the performance of the solar cell. A 50% reduction in efficiency was observed when the bare fullerene surface was ozone-treated relative to the ozone-free control. The loss is primarily attributed to a reduction in fill factor and evident of the formation of a transport barrier. A similar efficiency drop was observed in the absence of a tin oxide first metal oxide layer 160 with a single short 150 ms ozone dose. Current-voltage for a short ozone exposure without a first metal oxide layer is illustrated in FIG. 7. Referring again to FIG. 6B, a first depositing 210 of 20 ALD cycles of a $SnO_x$ first metal oxide layer 160 reduced the device performance loss to an approximate 25%. Increasing the first metal oxide layer 160 thickness by increasing the ALD deposition to 40 cycles $SnO_x$ (5 nm) and thicker prior to ozone treatment (i.e., contacting 220) resulted in no significant change in initial device power-conversion efficiency. This finding suggests that a first metal oxide layer 160 of $SnO_x$ having a thickness of about 5 nm can protect an underlying perovskite from strong oxidizers, such as ozone. Subsequent analysis discussed below shows that the $C_{60}/SnO_x$ interface is quite diffuse at this growth stage. For the remainder of these experiments, 40 ALD $SnO_x$ cycles were used as a first depositing 210 strategy, to produce the minimum thickness of a first metal oxide layer 160 sufficient for enabling surface ozone treatment of PSCs, without damaging the underlying perovskite layer.

In-situ Fullerene Oxidation: X-ray photoelectron spectroscopy (XPS) was used to study the effect of ozone exposure to fullerene thin films. Ozone may react with fullerene as the addition of ozone directly to the [6,6] double-bond junction to form the $C_{60}O_3$ [6,6]-closed ozonide; ozonide has a short half-life at the elevated temperatures and may liberate dioxygen gas to form a 6,6-arene oxide on the cage surface. The protonation of the 6,6-arene oxide with water was targeted herein to create a hydroxylated fullerene nucleation site, favorable for subsequent ALD surface growth. For this reason, ALD nucleation by in-situ functionalization through combined ozone and water pulses in the ALD reactor was investigated, where one ozone treatment cycle consisted of a 3 second ozone dose immediately followed by a 150 ms $H_2O$ dose with no purge delay.

Figure 8A:
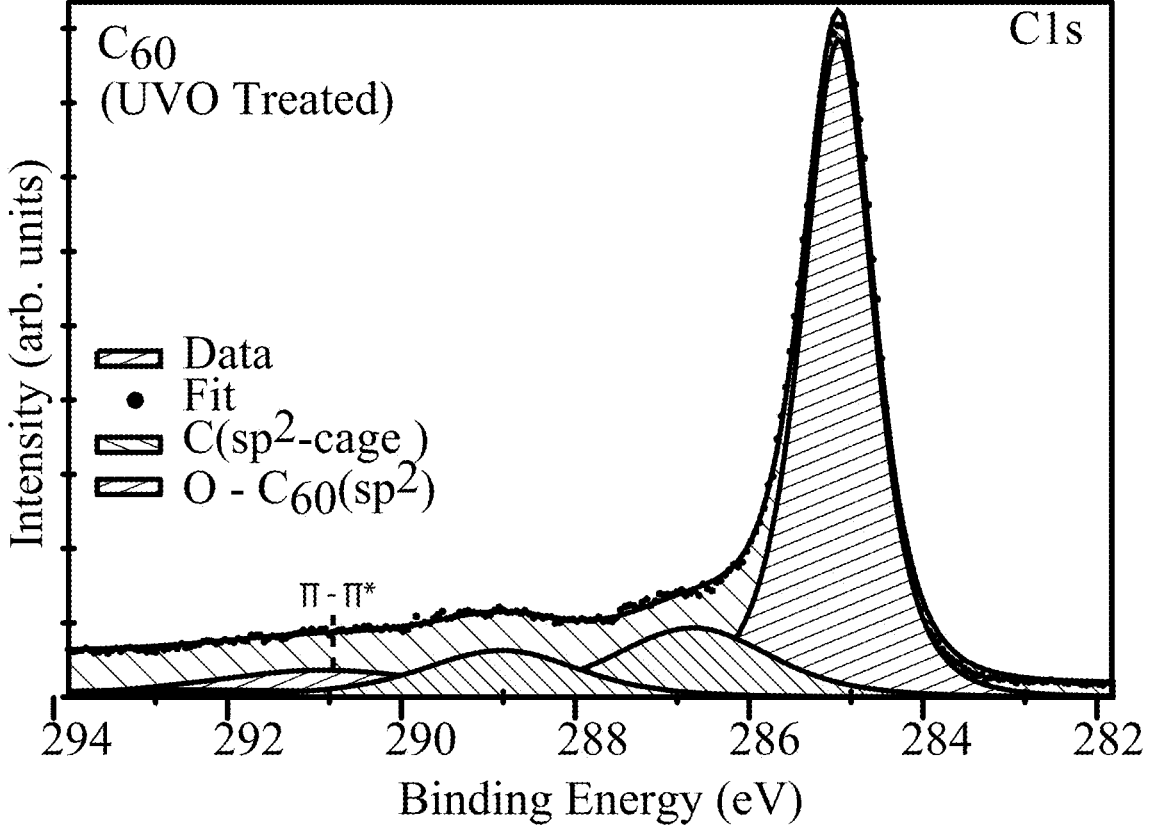
FIGS. 8A-8C illustrate fitted C1s XPS of the following samples, according to some embodiments of the present disclosure.
Figure 8B:
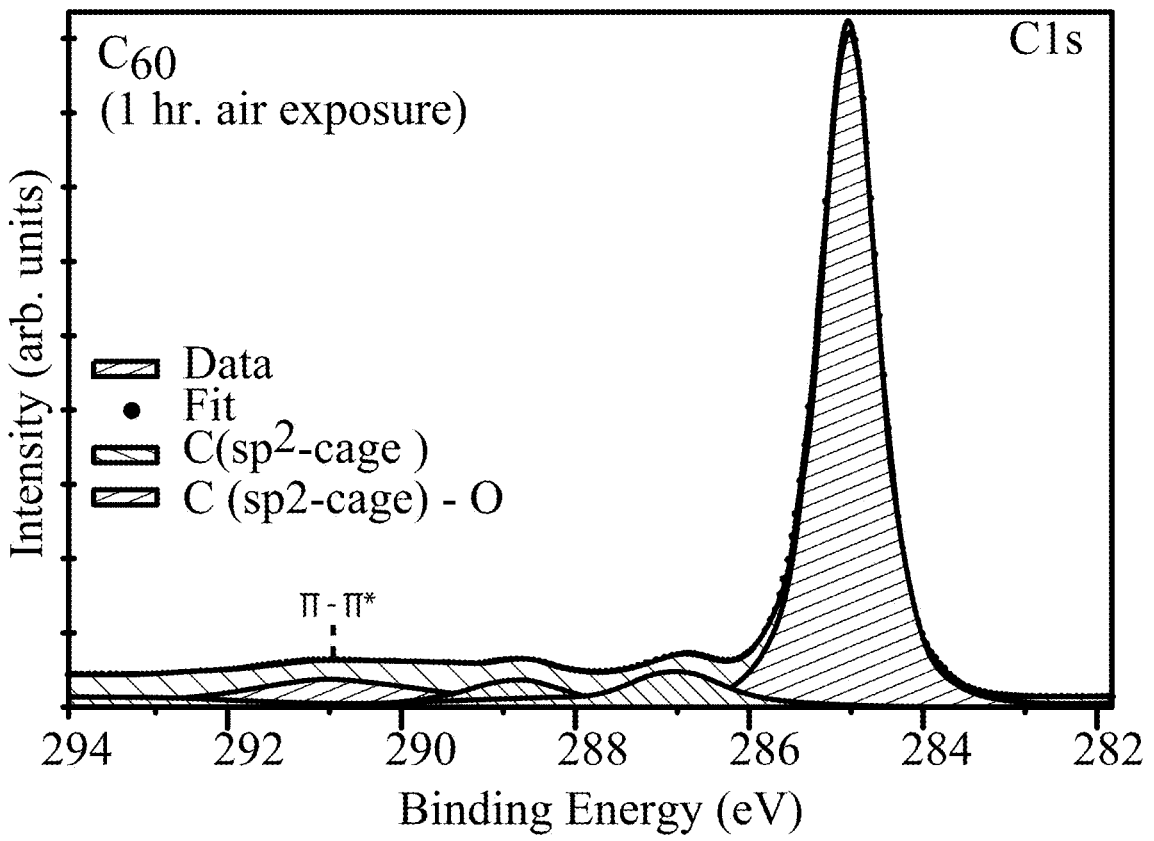
Figure 8C:
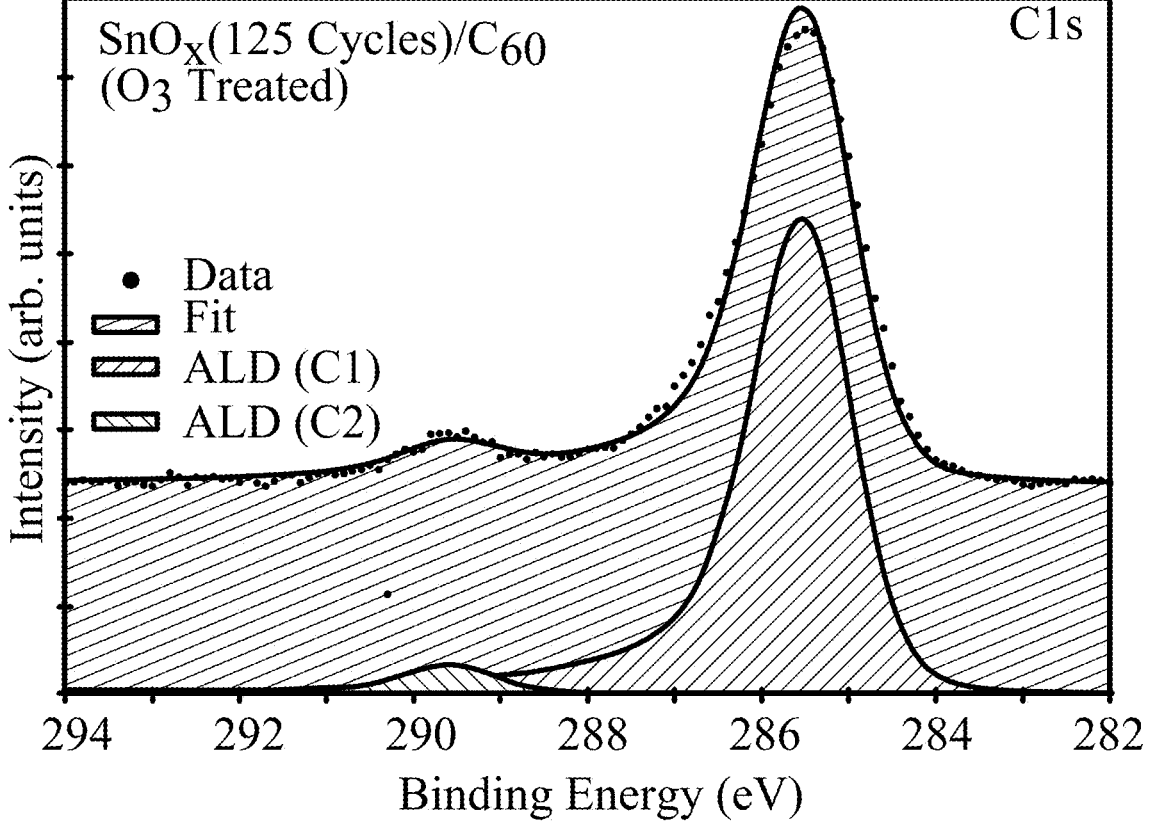
Figure 9A:
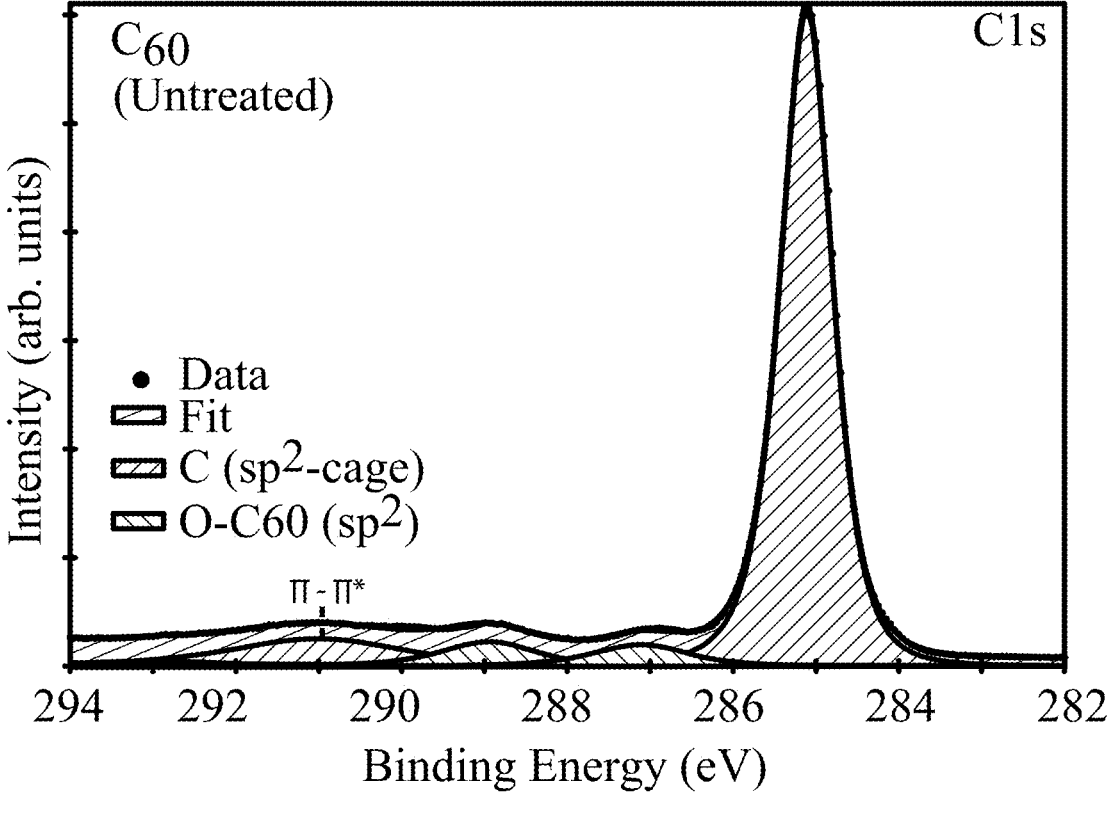
FIGS. 9A-9C illustrate fitted carbon C1s XPS spectra of pristine 30 nm thermally-evaporated fullerene film on glass (FIG. 9A), 15 second ozone-treated fullerene film on glass, showing a chemical shift in the C1s spectra, indicative of oxidation (FIG. 9B), and fullerene film coated with 40 cycles of ALD-deposited $SnO_x$ first metal oxide layer, followed by a 15 seconds ozone treatment (FIG. 9C), according to some embodiments of the present disclosure. This spectrum contains the chemically shifted fullerene-oxide, unmodified fullerene, and residual carbon from the ALD growth.
Figure 9B:
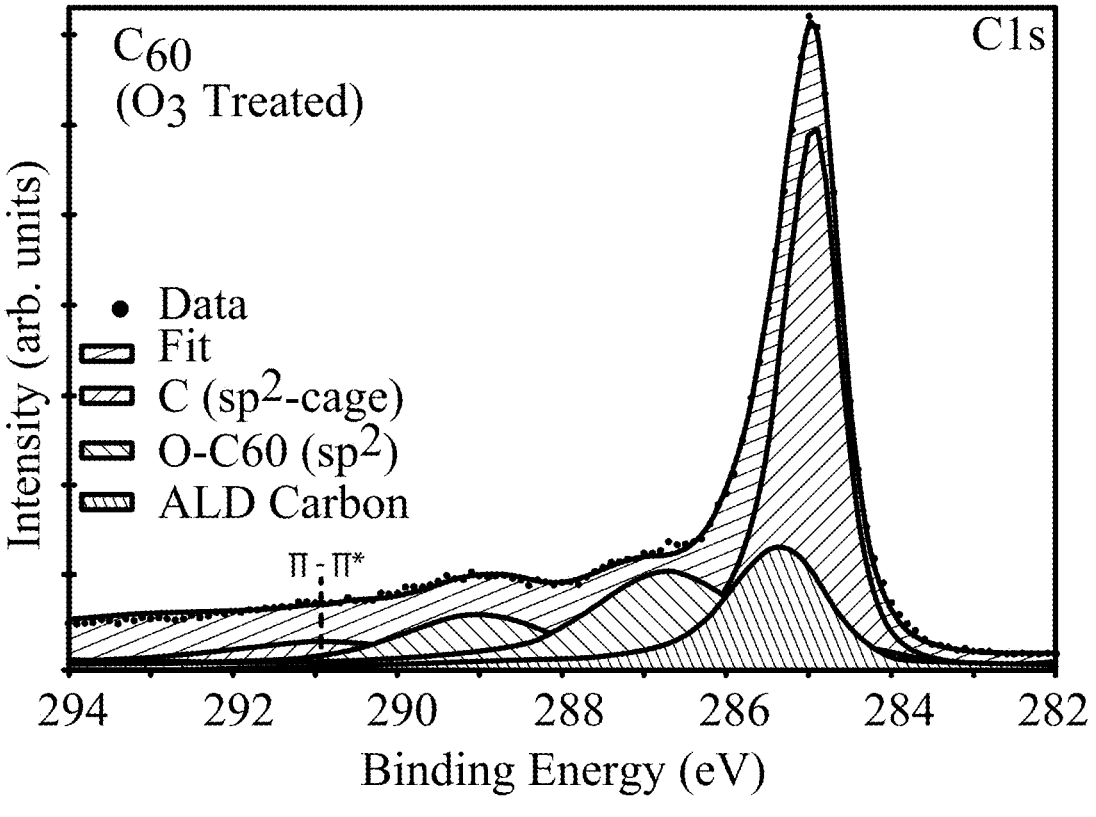
Figure 9C:
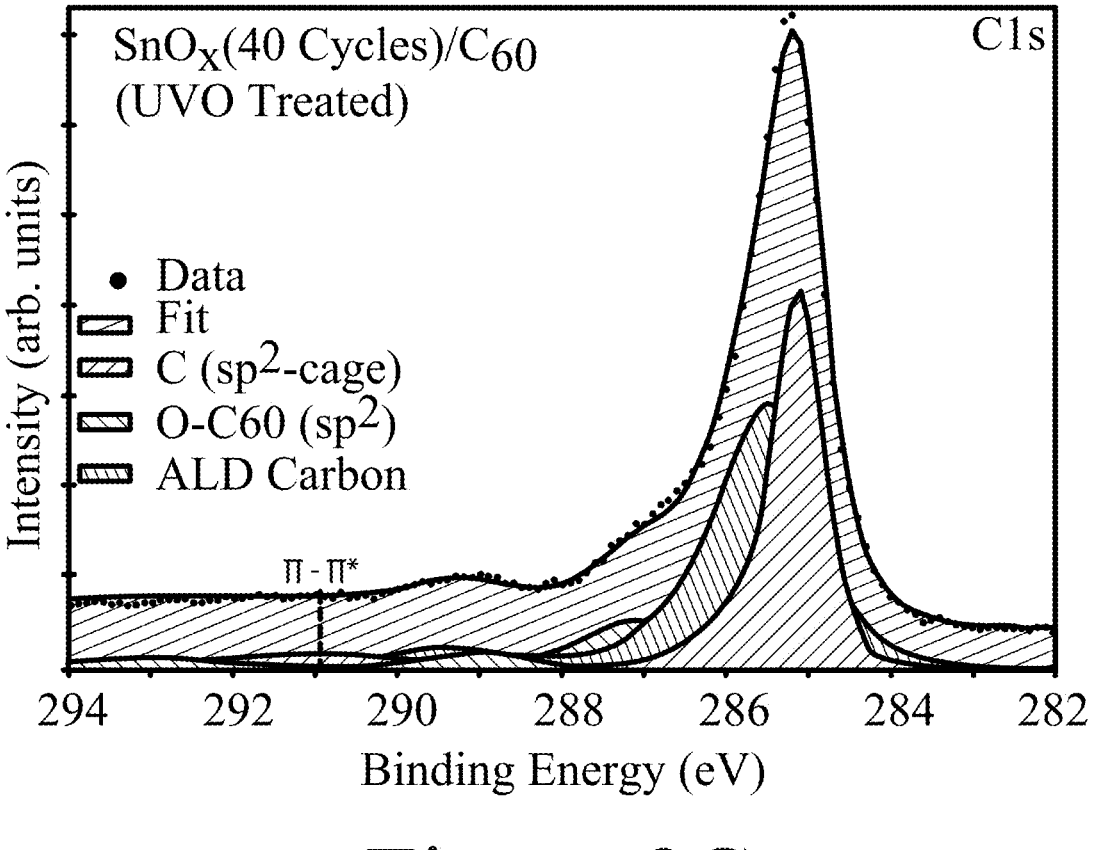

Surface oxidation of three structures were investigated: $C_{60}$, $C_{60}$ treated in-situ with ozone and water, and $C_{60}/40$ cycle ALD $SnO_x$ treated in-situ with ozone and water. XPS survey scans performed on in-situ ozone and water treated $C_{60}$ and $C_{60}/SnO_x$ films confirms oxygen uptake of the ozone-treated $C_{60}$ layers (see FIGS. 8A, 8B, and 8C). Analysis of the accompanying high-resolution C1s spectra (see FIGS. 9A, 9B, and 9C) reveals an increase in the relative intensity contribution of oxidized carbon, specifically, $O—C_{60}$ ($sp^2$) species, with ozone-treatment. A primary feature located at 285.0 eV is identified as the principal aromatic peak, corresponding to the $C_{60}$ ($sp^2$-cage) of the fullerene structure. This signal is coupled to a higher binding energy feature at 290.0 eV, identified as the $\pi$-$\pi$* shake-up satellite characteristic of aromatic carbon. Additional components of the C1s spectra are identified in Table 2, including two oxidized fullerene $O—C_{60}$ ($sp^2$) species at 287.0 eV and 288.9 eV with accompanying satellite shake-up features at 292.9 eV and 294.8 eV, respectively. For bare fullerene films (those without a $SnO_x$ first metal oxide layer 160), ozone-treatment and subsequent analysis of the $O—C_{60}$ ($sp^2$) signatures demonstrated a relatively uniform penetration of ozone-treatment into the XPS detection depth (~5 nm; 2.5 times the 2 nm mean free path of a C1s photoelectron with 1200 eV kinetic energy). The relative ease of penetration into the bare $C_{60}$ film highlights the importance of the first metal oxide layer 160.

TABLE 2

| | Peak (C1) | Peak (C2) | Peak (C3) | Peak (C4) | Peak (C5) | Peak (C6) | Peak (C7) | Peak (C8) |
|---|---|---|---|---|---|---|---|---|
| CasaXPS Fit Parameters for C1s XPS samples in FIGS. 9A-9C and FIGS. 8A-8C. | | | | | | | | |
| Untreated Fullerene Film | | | | | | | | |
| Assignment | C (sp2-cage) | (1) O—C60 (sp2) | (2) O—C60 (sp2) | (2) (sp2-cage) (pi-pi*) | (1) O—C60 (sp2) (pi-pi*) | (2) O—C60 (sp2) (pi-pi*) | NA | NA |
| Line Shape | LF(1.9, 2.1, 600, 19, 2) | LF(1.9, 2.1, 600, 19, 2) | LF(1.9, 2.1, 600, 19, 2) | LF(1.9, 2.1, 600, 19, 2) | LF(1.9, 2.1, 600, 19, 2) | LF(1.9, 2.1, 600, 19, 2) | — | — |
| Peak Position (eV) | 285.1 | 287.1 | 288.9 | 291.0 | 293.0 | 294.8 | — | — |
| FWHM | 0.73 | 1.32 | 1.32 | 2.42 | 2.05 | 2.05 | — | — |
| Fullerene Air-Exposed for 1 hr | | | | | | | | |
| Assignment | C (sp2-cage) | (1) O—C60 (sp2) | (2) O—C60 (sp2) | (2) (sp2-cage) (pi-pi*) | (1) O—C60 (sp2) (pi-pi*) | (2) O—C60 (sp2) (pi-pi*) | NA | NA |
| Line Shape | LF(1.9, 2.1, 600, 19, 2) | LF(1.9, 2.1, 600, 19, 2) | LF(1.9, 2.1, 600, 19, 2) | LF(1.9, 2.1, 600, 19, 2) | LF(1.9, 2.1, 600, 19, 2) | LF(1.9, 2.1, 600, 19, 2) | — | — |
| Peak Position (eV) | 285.0 | 287.0 | 288.8 | 290.9 | 292.9 | 294.7 | — | — |
| FWHM | 0.75 | 1.33 | 1.33 | 2.49 | 2.10 | 2.10 | — | — |
| 15 s Ozone Treatment for Fullerene Film | | | | | | | | |
| Assignment | C (sp2-cage) | (1) O—C60 (sp2) | (2) O—C60 (sp2) | (2) (sp2-cage) (pi-pi*) | (1) O—C60 (sp2) (pi-pi*) | (1) ALD reactor C (sp3) | NA | NA |
| Line Shape | LF(1.2, 2, 350, 19, 2) | LF(1.2, 2, 350, 19, 2) | LF(1.2, 2, 350, 19, 2) | LF(1.2, 2, 350, 19, 2) | LF(1.2, 2, 350, 19, 2) | LF(0.61, 1, 244, 300, 6) | — | — |
| Peak Position (eV) | 284.9 | 287.1 | 288.9 | 290.8 | 293.0 | 285.3 | — | — |
| FWHM | 0.74 | 1.64 | 1.64 | 2.47 | 2.55 | 1.34 | — | — |
| Fullerene/40 cyc ALD SnOx/15 s Ozone Treatment | | | | | | | | |
| Assignment | C (sp2-cage) | (1) O—C60 (sp2) | (2) O—C60 (sp2) | (2) (sp2-cage) (pi-pi*) | (1) O—C60 (sp2) (pi-pi*) | (2) O—C60 (sp2) (pi-pi*) | (1) ALD Reactor C (sp3) | (2) ALD Reactor (C═O) |

TABLE 2-continued

| | | | CasaXPS Fit Parameters for C1s XPS samples in FIGS. 9A-9C and FIGS. 8A-8C. | | | | |
|---|---|---|---|---|---|---|---|
| | Peak (C1) | Peak (C2) | Peak (C3) | Peak (C4) | Peak (C5) | Peak (C6) | Peak (C7) | Peak (C8) |
| Line Shape | LF(1.5, 2.1, 600, 19, 2) | LF(1.5, 2.1, 600, 19, 2) | LF(1.5, 2.1, 600, 19, 2) | LF(1.5, 2.1, 600, 19, 2) | LF(1.5, 2.1, 600, 19, 2) | LF(1.5, 2.1, 600, 19, 2) | LF(1.5, 2.1, 600, 19, 2) | LF(1.5, 2.1, 600, 19, 2) |
| Peak Position (eV) | 285.1 | 287.1 | 289.0 | 291.0 | 293.0 | 294.9 | 285.5 | 289.5 |
| FWHM | 0.75 | 1.36 | 1.36 | 2.49 | 2.11 | 2.11 | 1.27 | 1.27 |
| | | | | Fullerene/40 cyc ALD SnOx/15 s Ozone Treatment/85 cyc ALD SnOx (125 cyc. total) | | | | |
| Assignment | (1) ALD Reactor C(sp3) | (2) ALD Reactor (C=O) | NA | NA | NA | NA | NA | NA |
| Line Shape | LF(0.6, 1, 255, 300, 6) | LF(0.6, 1, 255, 300, 6) | — | — | — | — | — | — |
| Peak Position (eV) | 285.5 | 289.5 | — | — | — | — | — | — |
| FWHM | 1.33 | 1.33 | — | — | — | — | — | — |

XPS analysis of the C1s region for partial (40 cycles, see FIG. 9C) and full coverage (125 cycles, see FIG. 8C) $SnO_x$ ALD layers reveals two additional chemical states of carbon. These spectral features are attributed to C ($sp^3$) and C≃O ($sp^3$), located at 285.5 eV and 289.5 eV respectively. These features are denoted as 'ALD carbon', as their dominant signal contribution is unique to the ALD-deposited metal oxide layers in these experiments. These signal contributions are attributed to the presence residual precursor ligand in the ALD-deposited layer, as well as surface carbon acquired from the reactor itself. By directly associating these spectral features with the presence of the ALD-deposited layer, C1s contributions from the $C_{60}$ and $SnO_x$ ALD-deposited layers can be differentiated in $C_{60}/SnO_x$ bilayers. Fitted envelopes of the oxygen-free bare $C_{60}$ (see FIG. 9A) and full-coverage (125 cycles) $SnO_x$ ALD films (see FIG. 8C) were used to evaluate the C1s XPS data to understand the device relevant films with first metal oxide layers 160 constructed of $SnO_x$.

Figure 9D:
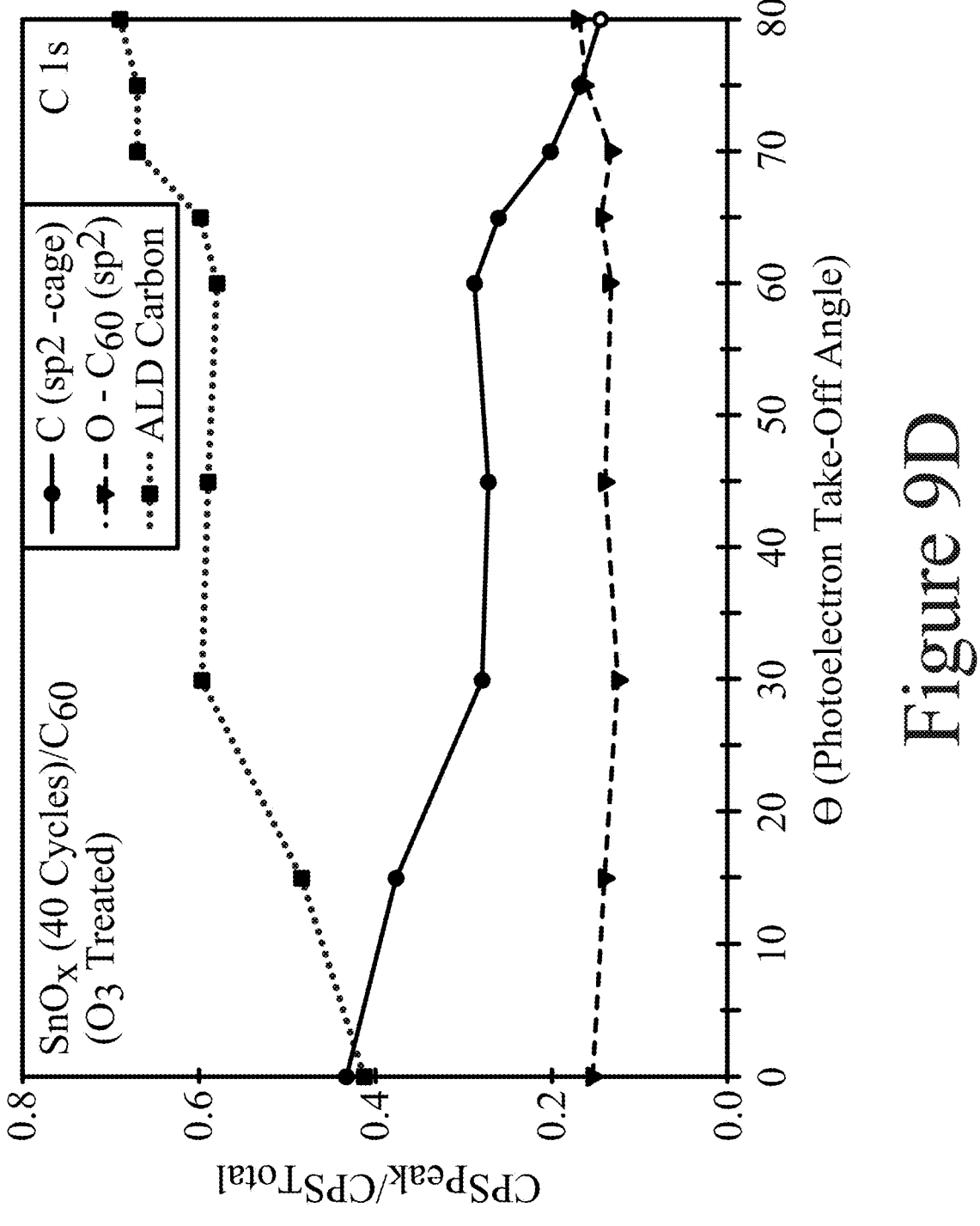
FIG. 9D illustrates calculated integrated intensity ratios from angle-resolved XPS (ARXPS) of the ozone-treated fullerene/$SnO_x$ bilayer using equivalent fit parameters as in FIGS. 9A-9C, according to some embodiments of the present disclosure.
Figure 9E:
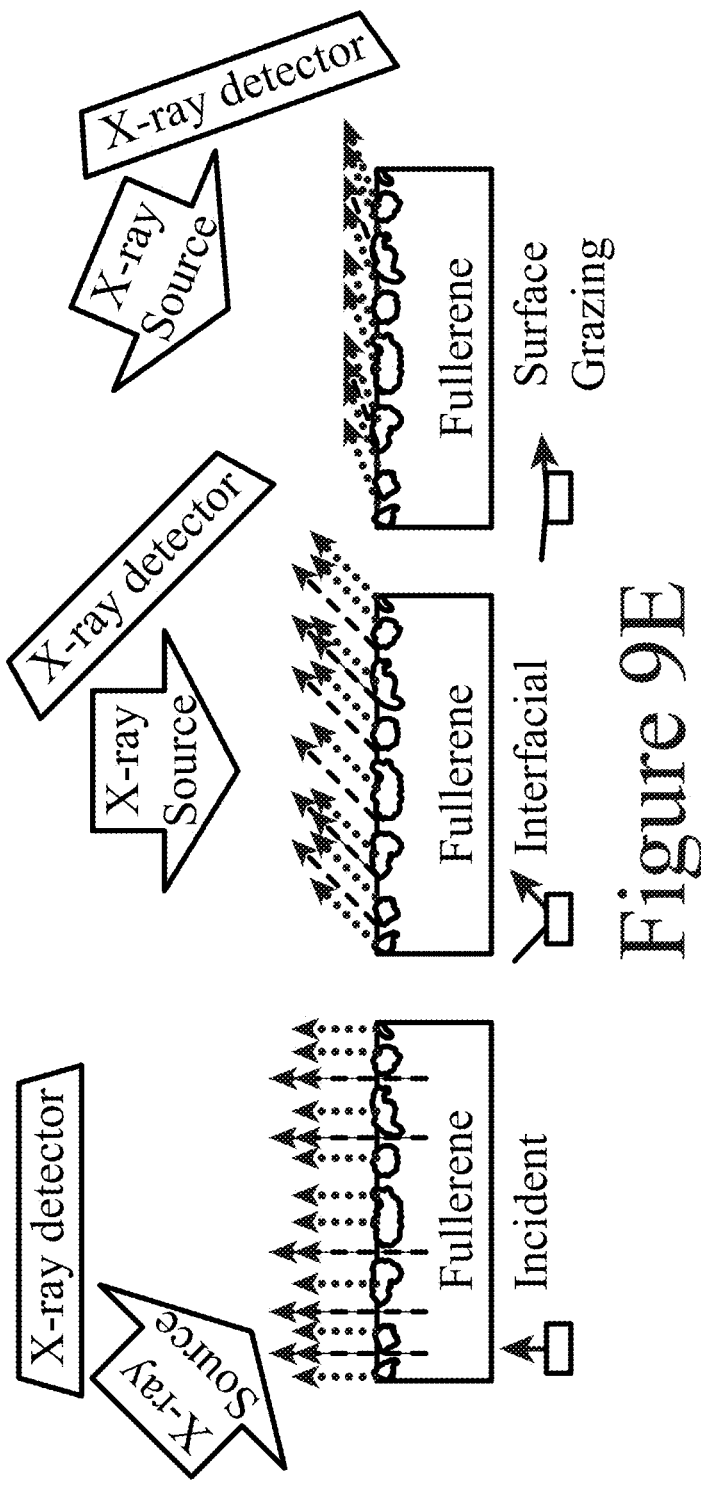
FIG. 9E illustrates a schematic representation detailing ARXPS measurement of the proposed $C_{60}$/$SnO_x$ interphase for a 5 nm ALD-deposited $SnO_x$ first metal oxide layer on $C_{60}$, according to some embodiments of the present disclosure.

Angle-resolved XPS (ARXPS) analysis of $C_{60}/40$ cycle ALD-deposited $SnO_x$ stack contacted in-situ with ozone and water (see FIG. 9D) shows the relative carbon fraction in the primary features in the C1s spectra at increasing surface sensitivity from 0° (normal take-off angle) to 80° (glancing take-off angle), as illustrated in FIG. 9E. The fraction of ALD carbon increases towards the surface of the stack, however, at 80°, a significant fraction of fullerene C1s contributions were maintained, where intensity attributed to $sp^2$ and O—$C_{60}$ ($sp^2$) peaks account for 14% and 17%, respectively. While the C1s peak fraction does not represent a quantitative surface coverage, a combined 31% intensity at glancing angles from these fullerene signatures suggest incomplete coverage of the ALD-deposited first metal oxide layer 160 constructed of $SnO_x$. This may be explained by poor nucleation on un-modified fullerene and cracking of the $SnO_x$ layer due to sub-surface growth. Surface fullerene after the first depositing 210 of a $SnO_x$ first metal oxide layer 160 may be directly susceptible to oxidation via diffusion from the 5 cycles of [3 s $O_3$+150 ms $H_2O$] applied. These diffusion processes do not require line-of-site and oxidation could occur both on directly exposed fullerene or through cracks in the first metal oxide layer 160. ARXPS of the ozone-treated first metal oxide layer 160 shows a gradual increase in the ratio of O—$C_{60}$ ($sp^2$) to $C_{60}$ ($sp^2$) towards the surface. This suggests an oxidation gradient within the top 5 nm of the fullerene base layer 150 with a higher degree of oxidation towards the surface, pointing to the efficacy of first metal oxide layer 160 at regulating penetration of ozone into an underlying base layer 150 and towards the perovskite surface.

Figure 10:
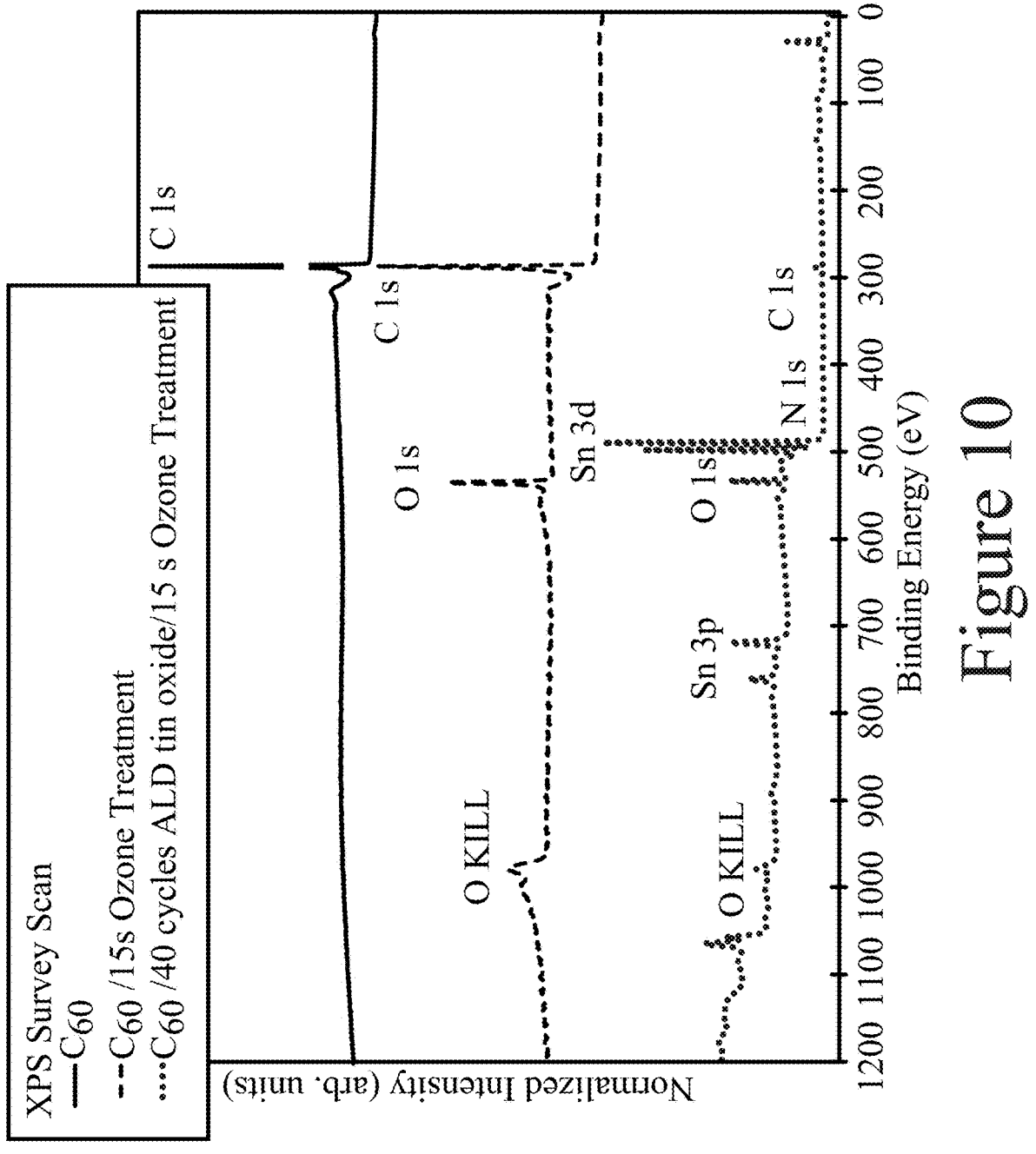
FIG. 10 illustrates survey scan XPS spectra of untreated fullerene surface (top), 15 seconds of ozone treatment of fullerene (5×[3 seconds $O_3$+150 ms $H_2O$]) (middle), and fullerene with 40 cycles of ALD tin oxide deposited prior to 15 seconds of ozone treatment (5×[3 seconds $O_3$+150 ms $H_2O$]) (bottom), all on ITO/glass substrates, according to some embodiments of the present disclosure.
Figure 11:
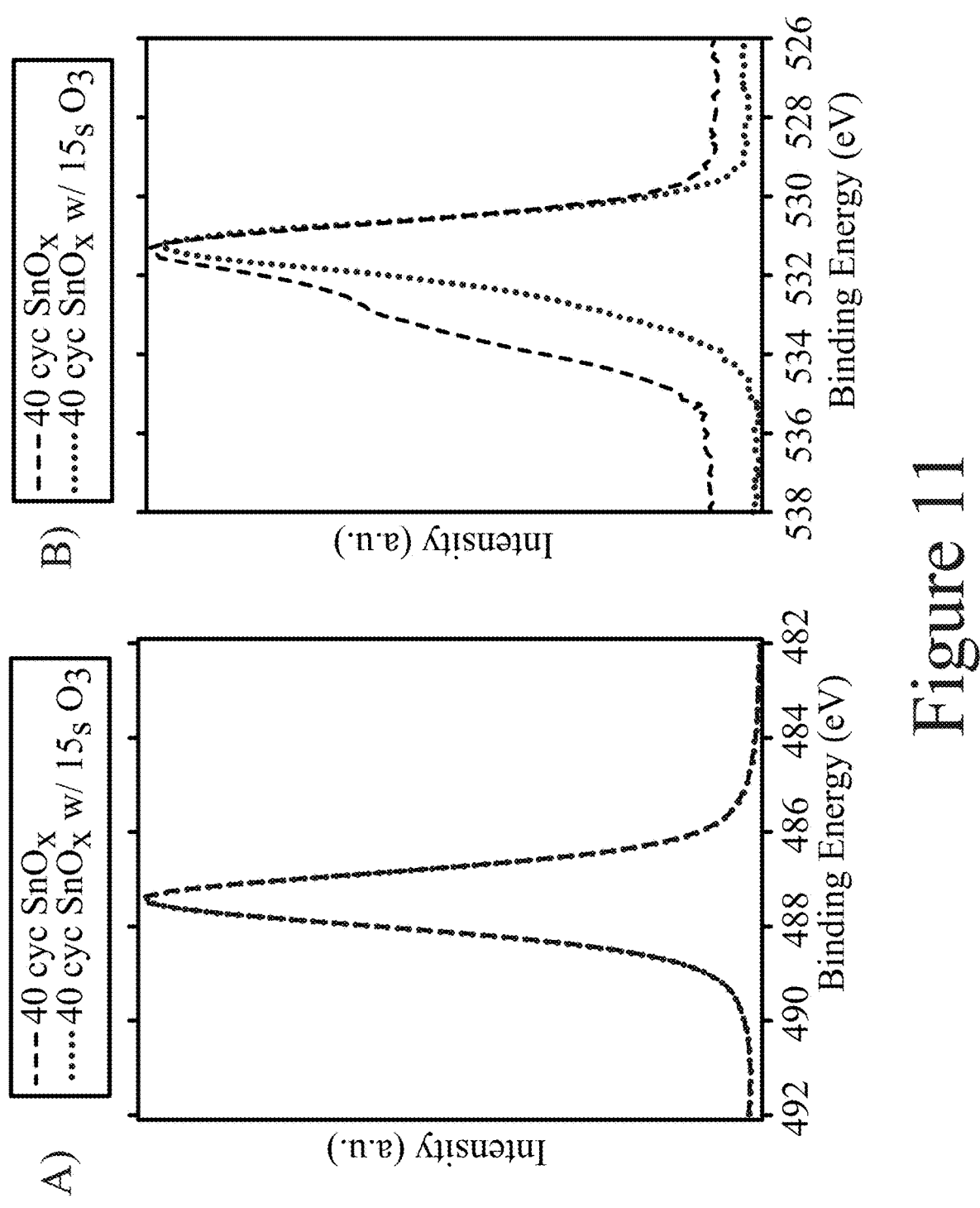
FIG. 11 illustrates XPS spectra of 40 cycles of ALD tin oxide with and without ozone treatment on 30 nm of fullerene showing Panel A) Sn3d 5/2 spectra and Panel B) O1s spectra showing a change in the binding energy distribution between the two samples, according to some embodiments of the present disclosure. The highest binding energy component of O1s spectra on metal oxides is associated with surface hydroxide, —OH, indicating an increase in surface hydroxylation after the treatment.

The secondary electron cutoff was measured by XPS to calculate the effect of ozone treatment on the Fermi-level of the tin oxide first metal oxide layer 160 before and after nucleation treatment. Results are illustrated in FIG. 10. The as-deposited 40 ALD cycles $SnO_x$ first metal oxide layer 160 on $C_{60}$ shows an electrically heterogeneous surface with two distinct Fermi-levels at approximately 4.2 eV and 4.4 eV. The surface heterogeneity is at a length scale smaller than the probe diameter of 100 μm, although some variability in the higher work function surface material was also observed from spot to spot across the substrate. After 5 cycles of [3 s $O_3$+150 ms $H_2O$] in-situ nucleation treatment, the work function of the first metal oxide layer 160 surface increased to 4.46 eV and became homogenous to the resolution of the instrument both within the 100 μm measurement probe and from spot to spot across the sample, indicating the layers become laterally more uniform in electronic properties. In addition to the fullerene functionalization of $C_{60}$ ($sp^2$) to O—$C_{60}$ ($sp^2$), as previously discussed, O1s and Sn3d 5/2 XPS spectra on these layers (see FIG. 11) show an increase in surface hydroxyl content upon in-situ ozone and water. A hydroxyl-induced chemical shift of Sn3d 5/2 peak is expected to be small and not definitively resolvable with XPS and therefore these tests were unable to determine whether the additional surface hydroxyls reside on exposed fullerene or tin oxide, however, it may be expected that both surfaces exhibit an increase in surface hydroxyl content upon the nucleation treatment.

Figure 12:
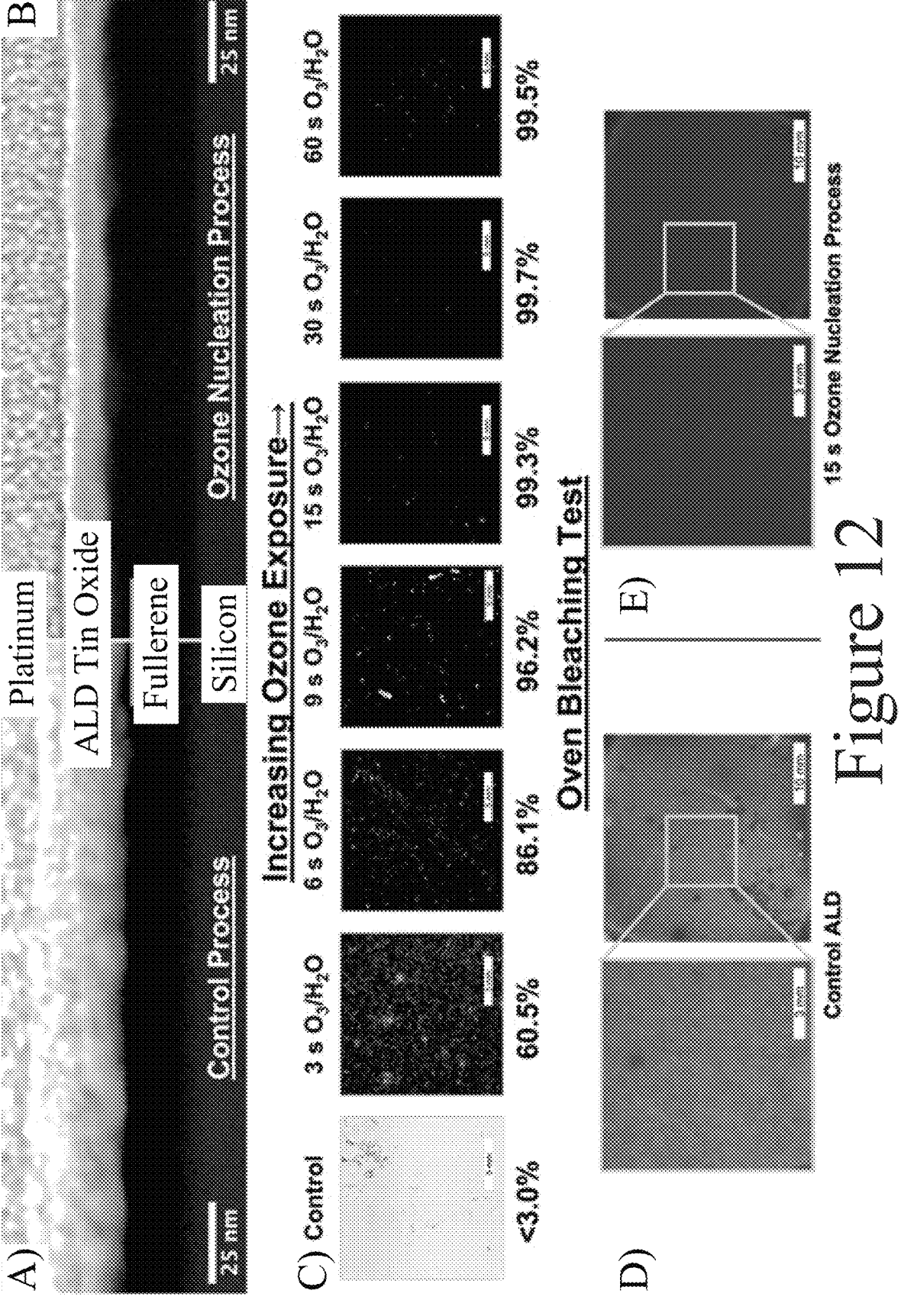
FIG. 12 illustrates: Panels A and B) Cross-sectional STEM images of Si/$C_{60}$/$SnO_x$/Pt substrates showing a comparison of a control tin oxide layer resulting from 125 ALD cycles (Panel A) and a tin oxide layer synthesize identically but with an ozone-contacting step (15 seconds) (Panel B), according to some embodiments of the present disclosure. Panel C illustrates perovskite layer retention after 10 seconds of dimethylformamide exposure for glass/perovskite/$C_{60}$/125 cycles ALD-deposited $SnO_x$ with increasing duration of ozone exposure applied after the initial 40 ALD cycles of $SnO_x$ growth (scale bars are all 5 mm), according to some embodiments of the present disclosure. Panel D illustrates glass/perovskite/$C_{60}$/125 cycle control ALD $SnO_x$ (scale bars are 3 mm left image and 10 mm right image) and Panel E illustrates glass/perovskite/$C_{60}$/15 nm ozone-treated (15 seconds) ALD $SnO_x$ aged for 1000 hours at 150° C. in an ambient oven (scale bars are 3 mm left image and 10 mm right image), according to some embodiments of the present disclosure.
Figure 13:
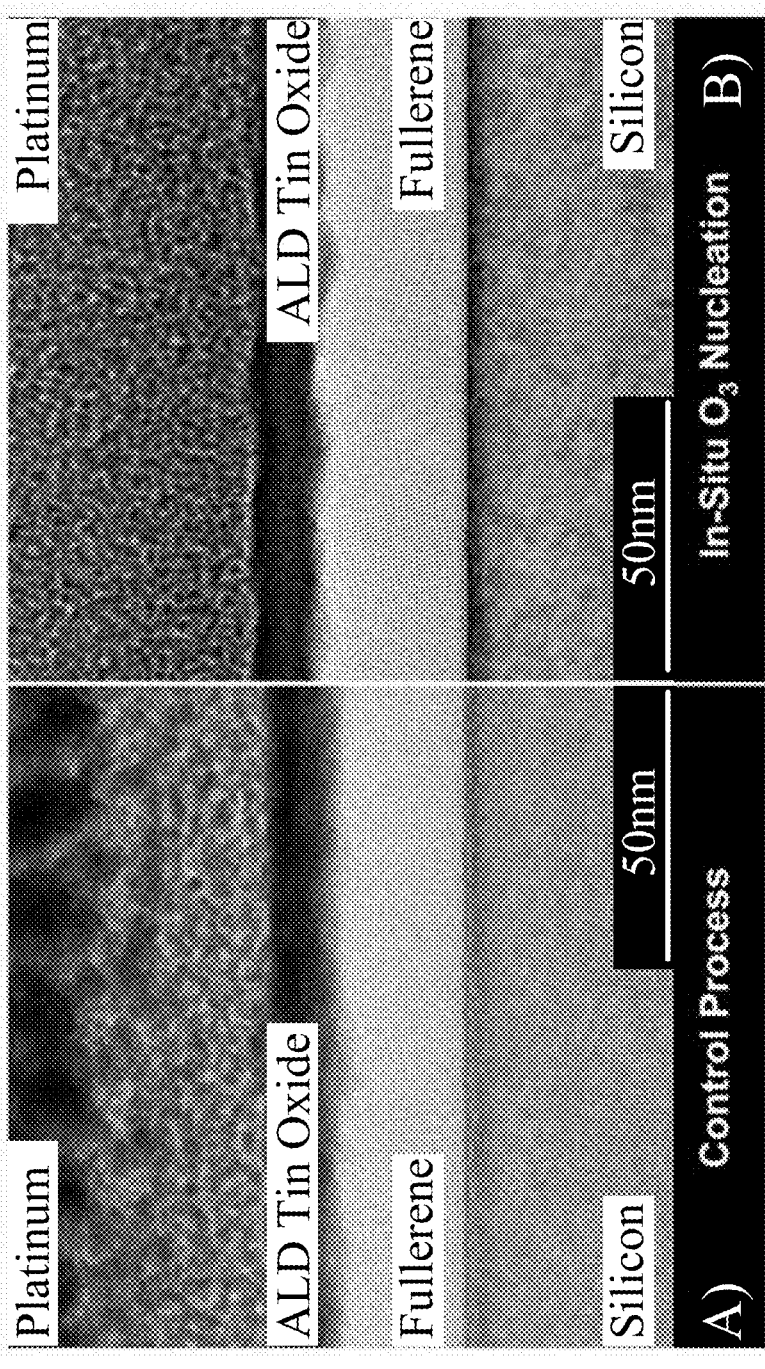
FIG. 13 illustrates High-Resolution Transmission Electron Microscopy (HRTEM) images of the tin oxide ALD-deposited layers (125 cycles) prepared via the control process (left) and using the 40 cycle/$O_3$ treatment (15 seconds)/85 cycle process (right), according to some embodiments of the present disclosure.

It was found that combined ozone and water modification on a first metal oxide layer 160 has a noticeable effect on the morphology of subsequent ALD-deposited second metal oxide layer 165. Cross-sectional scanning transmission electron microscopy (STEM) images compare $Si/C_{60}$ substrates coated with a $SnO_x$ first metal oxide layer 160 resulting from a first depositing by 125 ALD cycles without ozone contacting (control) (see Panel A of FIG. 12) versus the same stack but with the first metal oxide layer 160 contacted with ozone (see Panel B of FIG. 12). These figures illustrate morphological differences in the resulting $SnO_x$ second metal oxide layer 165 as a result of two different growth modes where, first, distinct domains in the "control" $SnO_x$ second metal oxide layer 165 without contacting are observed, consistent with sub-surface growth. Second, in contrast, the $SnO_x$ second metal oxide layer 165, resulting from an ozone-contacted first metal oxide layer 160, appears conformal with no detectable domains or cracks within the oxide layer. High resolution transmission electron micros-copy (HRTEM), illustrated in FIG. 13, provides further evidence for suppressed sub-surface growth upon ozone contacting of the $SnO_x$ first metal oxide layer 160. Here, the gap between the silicon substrate and the tin oxide layer (the combination of the first metal oxide layer 160 and the second metal oxide layer 165) is measured across several points on the sample and found to be 24.7 nm on the control $SnO_x$ sample and 27.4 nm on the ozone-treated $SnO_x$ sample. The $C_{60}$ films on these samples were loaded side-by-side on a rotating evaporator stage at approximately the same radius from center of rotation to ensure nearly identical initial $C_{60}$ film thickness. The difference in spacing between the silicon surface and the tin oxide of approximately 2.7 nm between the two HRTEM samples may be attributed to inhibited subsurface growth with ozone nucleation applied to the $SnO_x$ first metal oxide layer 160.

The measured thickness of the combined tin oxide layers, as determined by HRTEM, are very comparable at approxi-mately 14.7 nm on the control sample and 13.6 nm for the ozone-treated sample. These values are slightly lower than the nominal 15 nm thickness, as determined by spectro-scopic ellipsometry on silicon. This can be explained by a nucleation delay on the fullerene growth surface. The ~1 nm thickness variation between the two samples may be attrib-uted to the higher precursor mass uptake of the control sample due to sub-surface growth.

Figure 14A:
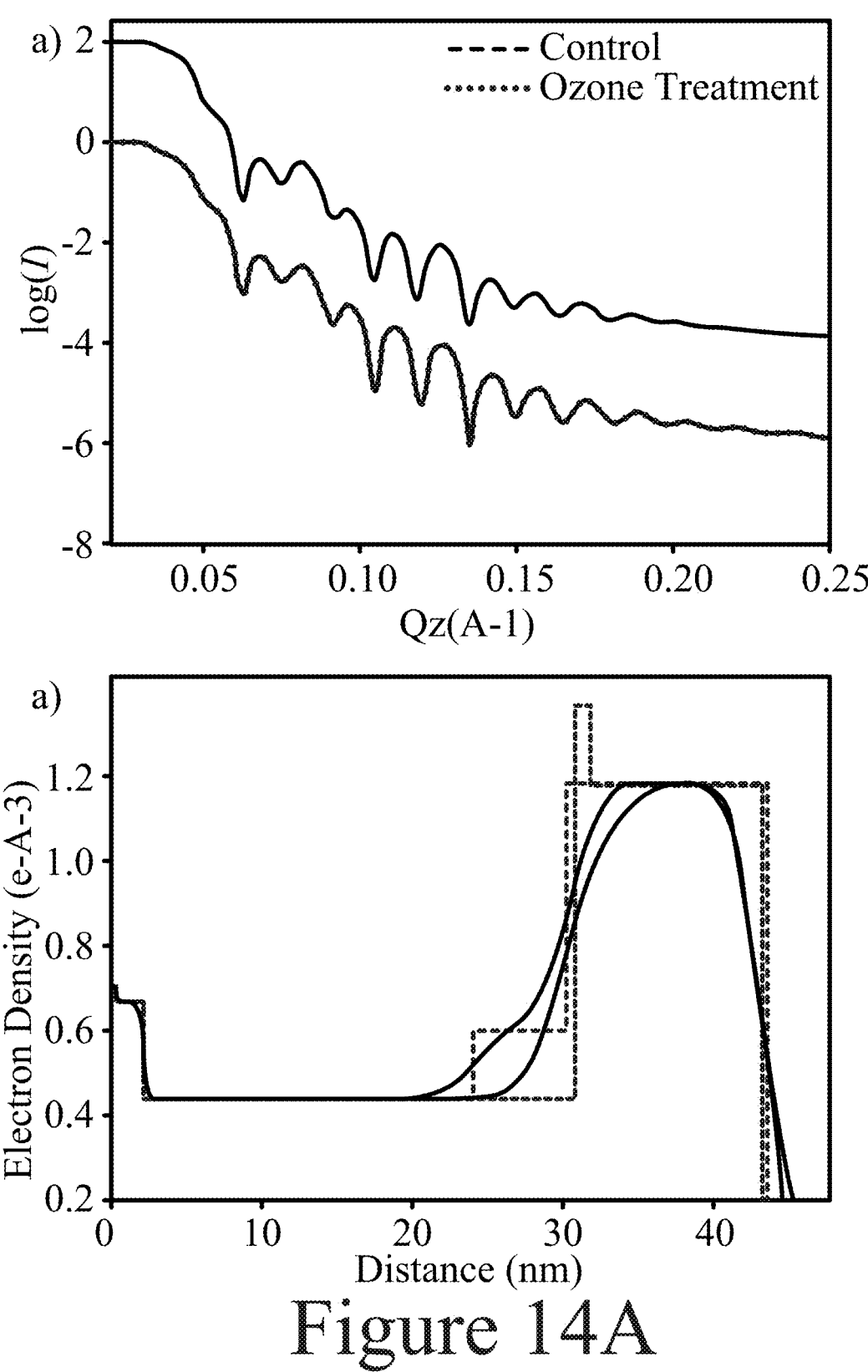
FIG. 14A illustrates X-ray Reflectivity measurement data and fit of $Si/C_{60}$ with 125 cycle ALD-deposited $SnO_x$ (control) or 40 cycle/$O_3$ treat (15 seconds)/85 cycle process ALD-deposited $SnO_x$ (ozone-treated), according to some embodiments of the present disclosure. Panel A) illustrates the reflectivity data is plotted as normalized reflection ($R/R_F$) vs Scattering Vector ($Q_z$) (white dots) and are overlaid with the fit for each variable. Panel B) illustrates XRR fits are transformed into the electron density profiles where the x-axis denotes distance away from the top of the silicon substrate; the dashed lines are representative of the individual layers with zero roughness at each interface.
Figure 14B:
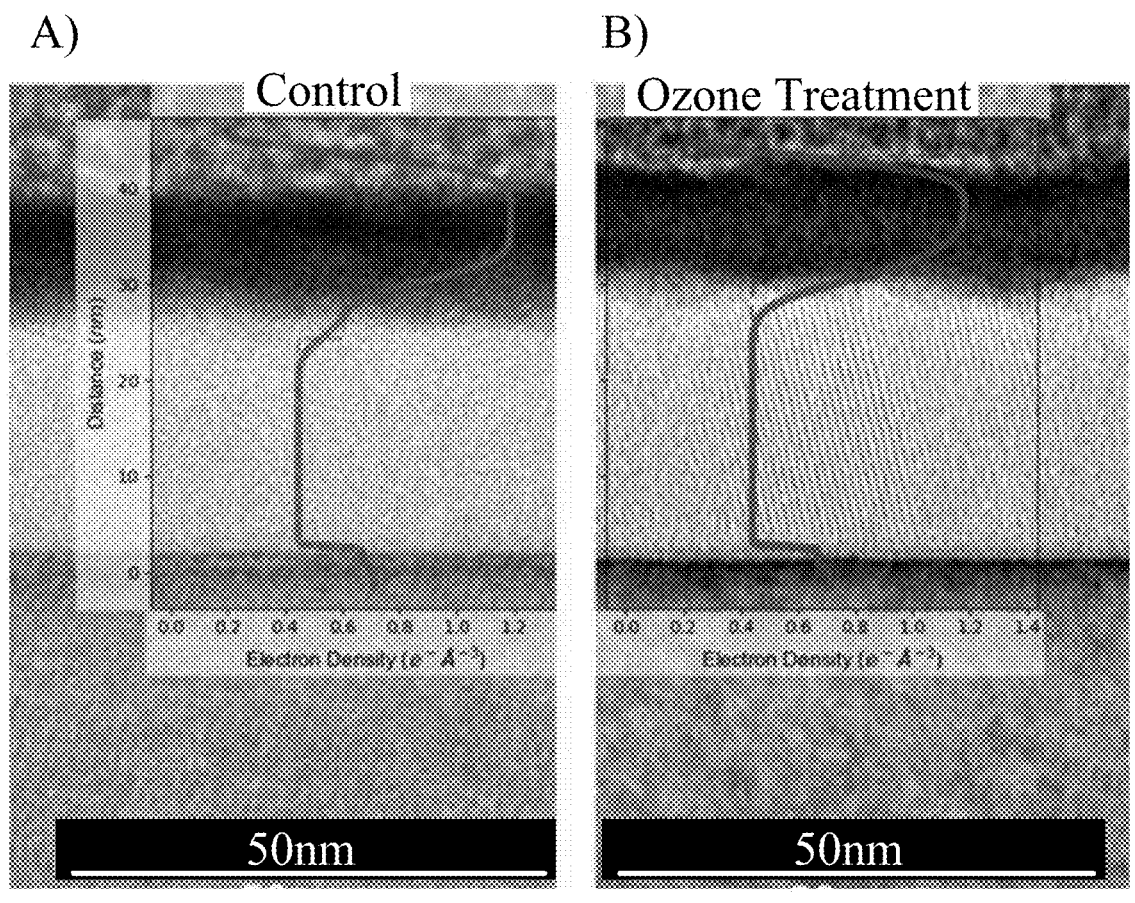
FIG. 14B illustrates a table of the extracted thickness, electron density, and roughness data for each supposed layer. Panels A and B) illustrate electron density plots for control and ozone-treated samples, respectively, overlaid on top of the HRTEM images from FIG. 13.
Figure 15:
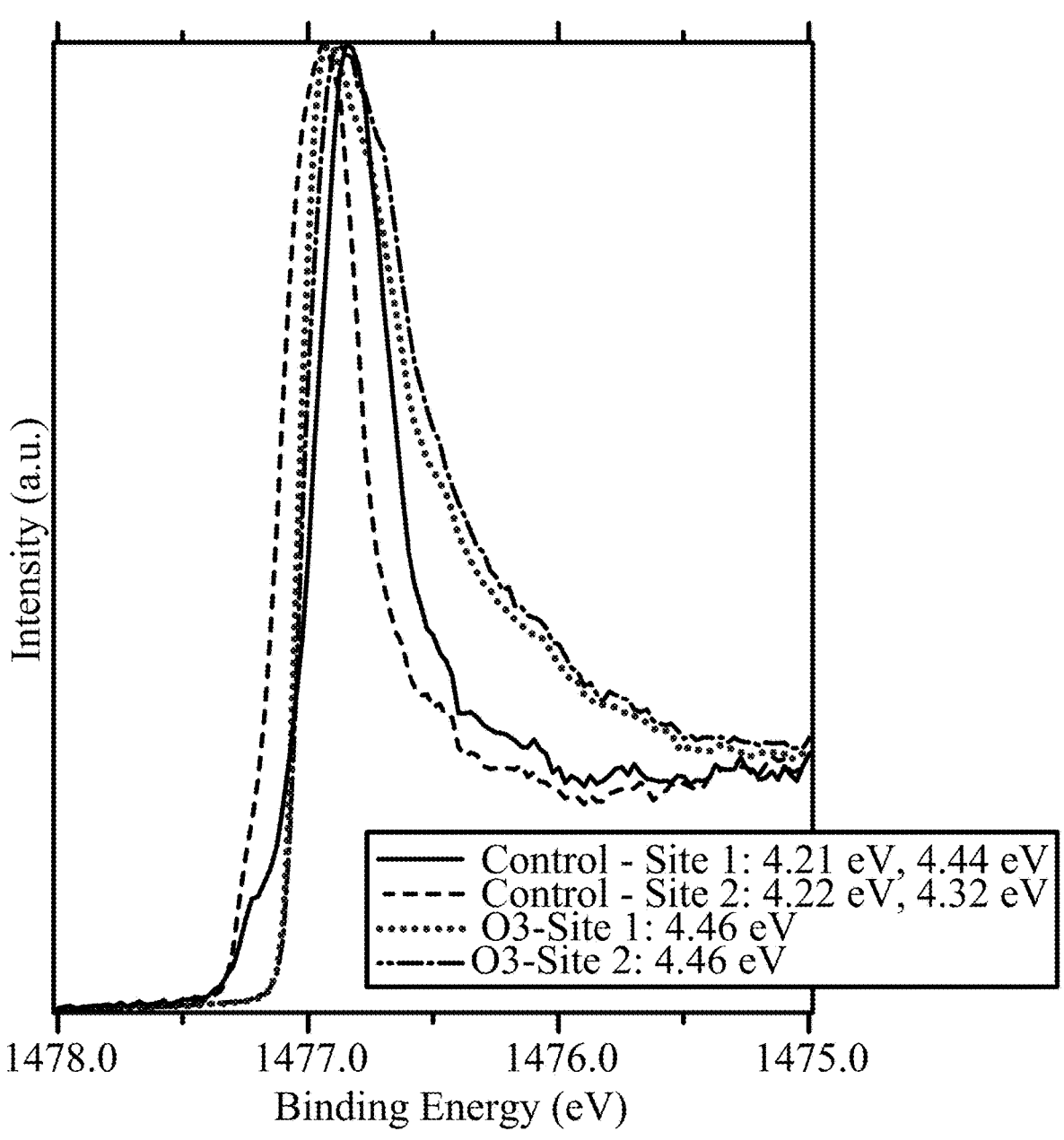
FIG. 15 illustrates photoelectron intensity-energy plots for two 100 µm survey sites on glass/ITO/$C_{60}$/40 cycles $SnO_x$, according to some embodiments of the present disclosure. The control sample is characterized as-deposited and the ozone-treated sample is modified in-situ with 5 cycles of [3 seconds O3+150 ms $H_2O$], according to some embodiments of the present disclosure.

The STEM and HRTEM observations are further sup-ported by x-ray reflectivity (XRR). XRR modeling of samples prepared identically to the STEM and HRTEM study, which is illustrated in FIGS. 14A and 14B. Several observations are made in this analysis. First, a thinner $C_{60}$ layer and thicker $C_{60}/SnO_x$ "interphase" is modeled in the control sample (22 nm and 6 nm, respectively) compared to the ozone-treated sample (28 nm and 1 nm, respectively). As used herein, the term "interphase" refers to a region that includes a first phase, material, and/or layer that penetrates into an adjacent and/or neighboring second phase, material, and/or layer. For example, a $C_{60}/SnO_x$ interphase refers to a portion of at least one of a first metal oxide layer 160 and/or a second metal oxide layer 165 penetrating into an adjacent fullerene base layer 150. Thus, referring again to FIGS. 14A and 14B, the thinner fullerene layer and thicker interphase in the control sample are consistent with subsurface diffusion. These results also suggest that the control sample $C_{60}/SnO_x$ interphase may penetrate the fullerene layer further than can be resolved HRTEM. Second, it is observed that the control sample interphase has a lower electron density (0.61 $e^-/A^3$) than the ozone-treated interphase region (1.37 $e^-/A^3$). The higher electron density of the ozone-treated interphase region may be explained by reduced intermixing with the fullerene layer and decreased oxygen vacancies as a result of ozone exposure. This is consistent with an increase of surface hydroxyl upon ozone treatment of the first metal oxide layer 160 observed in Panel B of FIG. 11 and a reduction in oxygen vacancies associated with an increase in tin oxide work function observed in FIG. 15. The cross-sectional electron density profile is overlaid on HRTEM images in Panels A and B of FIG. 14B to illustrate the differences in the interphase between the control and ozone-treated samples. Third, the electron density in the $SnO_x$ second metal oxide layer 165 of the control sample (1.19 $e^-/A^3$) and ozone-treated sample (1.18 $e^-/A^3$) are nearly identical. The similar electron densities observed in the $SnO_x$ second metal oxide layers 165 suggest that the elec-tronic properties of these materials grown after nucleation are substantially similar. This is expected as these layers are grown by the same ALD chemistry at the same reaction temperature. XPS, STEM, HRTEM, and XRR results sup-port the hypothesis that ozone treatment can be applied to functionalize fullerene materials and inhibit sub-surface ALD $SnO_x$ growth.

Enhanced Barrier Properties and Environmental Stability: Solvent penetration testing is directly relevant to all-perov-skite tandem processing. Without a conformally deposited solvent barrier, solution processing one perovskite layer on top of another with non-orthogonal solvent systems will result in dissolution of the underlying perovskite at pinholes and defects in the barrier layer. Glass/$DMA_{0.1}FA_{0.6}Cs_{0.3}Pb$ $(I_{2.4}Br_{0.6})_3$/fullerene/$SnO_x$ test structures were prepared with increasing nucleation cycles of ozone and water applied after a 40 cycle ALD-deposition of a tin oxide first metal oxide layer 160. DMF penetration was tested by fully covering the test stack with dimethylformamide for 10 seconds. Image analysis was used to characterize pinhole formation and capture the perovskite film retention after the DMF procedure; results are illustrated in Panel C of FIG. 12. In this experiment, the untreated control $SnO_x$ depositions show complete dissolution of the perovskite film (<3.0% remaining perovskite film) while increasing ozone and water dosage lead to improved film retention, culminating in >99.5% perovskite film retention for five or more cycles of ozone and water, or 15 seconds of cumulative in-situ ozone dose.

Figure 16:
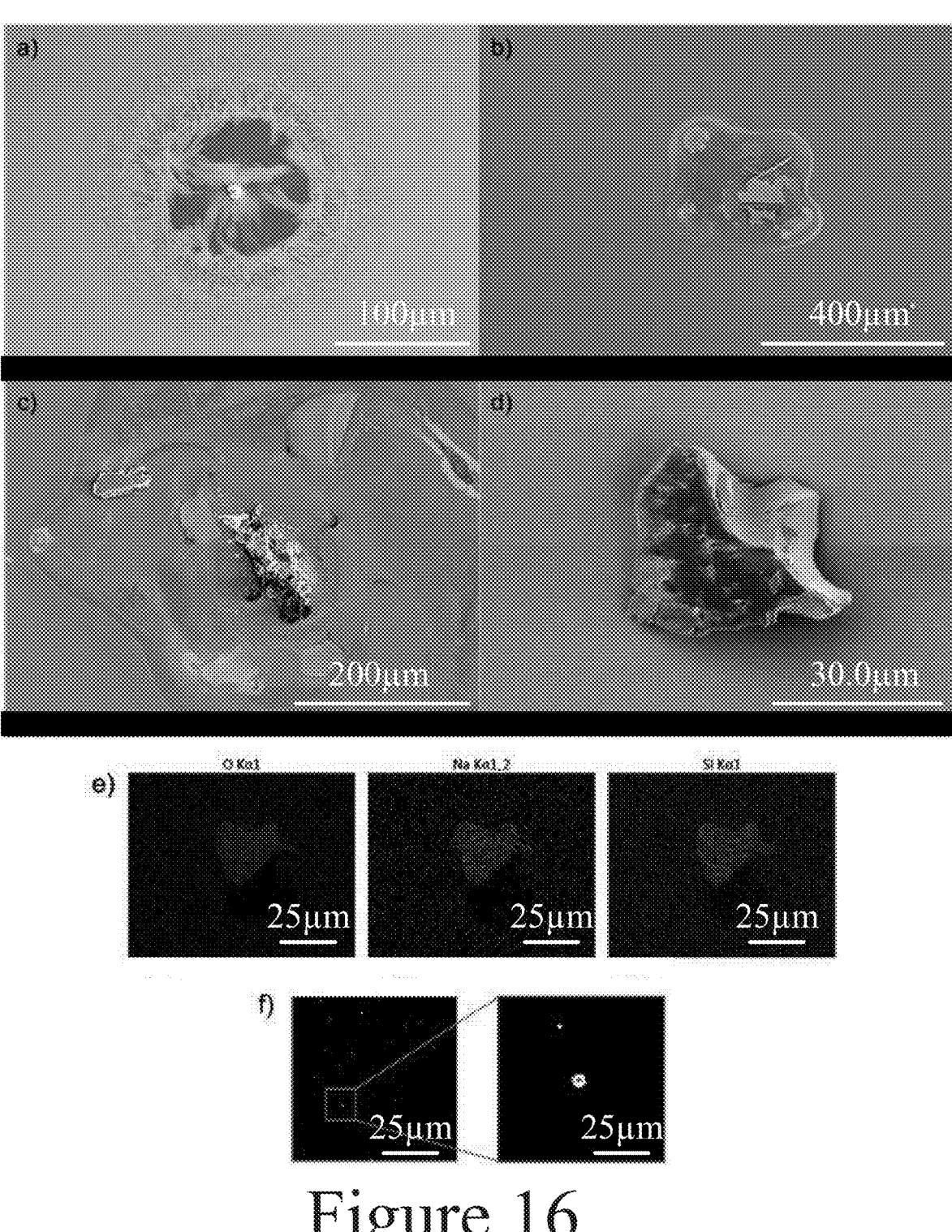
FIG. 16 illustrates SEM micrographs illustrating the size, shape and fine detail of the pinhole-producing particles present in perovskite layers: Panel A) a ~10 µm fragment of material, suspected to be graphite or fullerene dust, Panel B) a 200 µm fiber protruding from a DMF pinhole with a small flap of the $C_{60}$/$SnO_x$ bilayer visibly peeled back. Panel C) A 150 µm particle embedded in the device, appearing to be within the ITO substrate, Panel D) a 30 µm small shard of float glass embedded in the layer surface identified with Panel E) Energy Dispersive X-ray analysis of the fragment, according to some embodiments of the present disclosure. Panel F) A processed photograph of a post-DMF tested sample with resolvable particle-pinhole effect (scale bars left image 5 mm, right image 300 µm), according to some embodiments of the present disclosure.

Microscopy was performed on the pinholes that appeared on ozone-treated samples after DMF solvent testing. These images revealed that particulates resided in the center of most pinholes for ozone-treated barrier layers (see FIG. 16). It was determined that these particles have a size on the order of 40 to 200 um. Energy Dispersive X-ray (EDX) analysis of the particles suggests that they are primarily composed of glass shards, fragments of device material (e.g. $C_{60}$) and fibers from lab tissues. Ultrasonic substrate clean-ing, handling substrate edges with metal tweezers, and spin coating may generate these particles. Theoretically, an ALD-deposited barrier layer should conformally coat and protect around such particulates; however, we speculate that because these particles are several orders of magnitude thicker than our device layers, they may mechanically dislodge during the DMF solvent test. Complete removal of particulates during processing is beyond our laboratory capabilities and the scope of this project; however, an additional barrier test was designed to test the efficacy of these barriers through ambient annealing where mechanical forces would not be present. ALD-deposited tin oxide layers were deposited on glass/perovskite/fullerene substrates with and without the ozone nucleation treatment. These samples were aged in a 150° C. oven fed with ambient air. In this way, the barriers were tested for ingress of only gaseous oxygen/water or egress of halogen/cation without mechani-cal forces of spreading solvent. Samples were inspected through contactless visual and optical analysis. After 1000 hours of aging under these conditions, the ozone-treated ALD-deposited layer outperformed the control ALD-depos-ited layer with nearly no visual evidence of oxidation and bleaching of the perovskite (see Panels D and E of FIG. 12). These results suggest particulate accumulation on device surfaces may limit barrier performance in scenarios where those particulates can become dislodged and particle controls should be considered in a manufacturing setting.

Figure 17A:
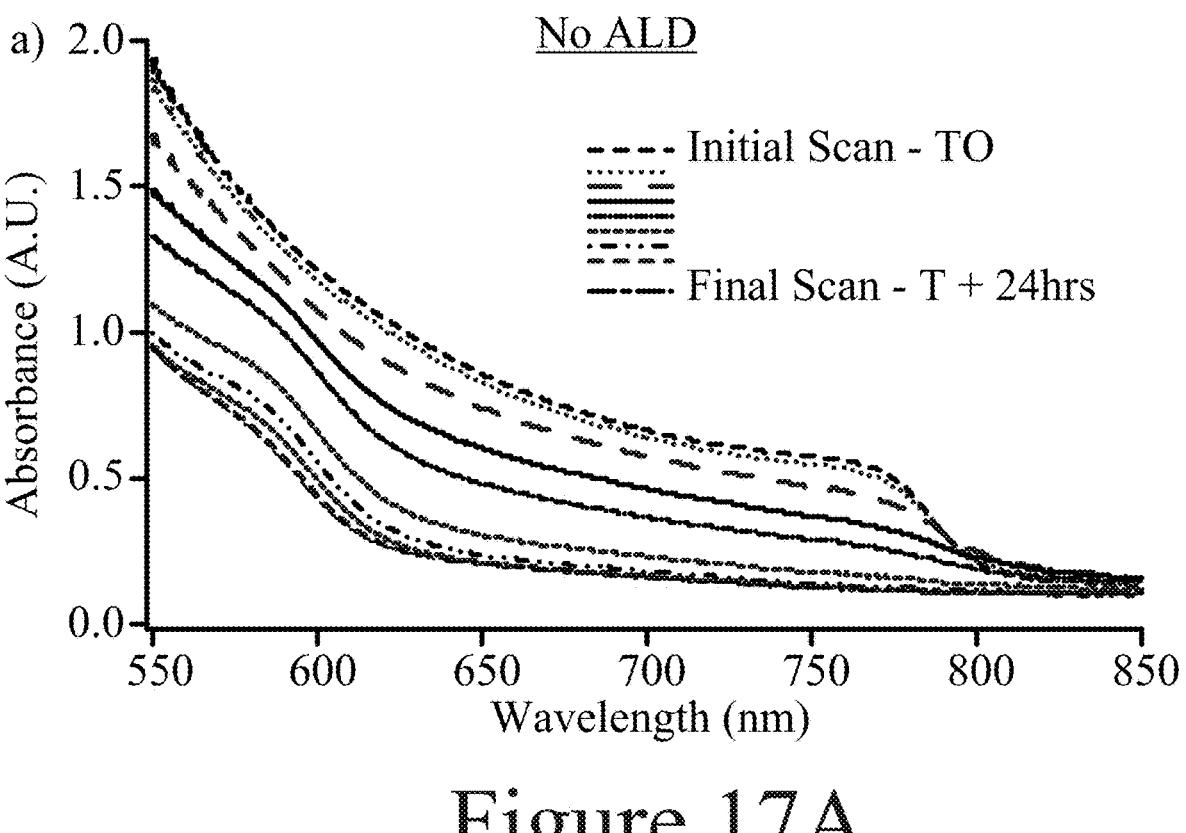
FIGS. 17A-17C illustrate stacked UV-Vis spectra of an in-situ monitored halide ion exchange, according to some embodiments of the present disclosure. Layers of $FA_{0.8}Cs_{0.2}PbI_3$ perovskite are formed on glass before evaporating 30 nm of fullerene and depositing 6 nm of BCP (FIG. 17A), 125 cycles of control ALD-deposited tin oxide (FIG. 17B, or 125 cycles of ALD-deposited tin oxide with a 15 second duration ozone treatment (FIG. 17C. These samples were gently suspended in a quartz UV-Vis cuvette with a 1 cm path length, then filled with a solution formamidinium bromide at 10 mg/mL in isopropanol at 50 C. UV-vis spectra was taken at 5 minute intervals for 24 hours. Bromine intercalation into the $FA_{0.8}Cs_{0.2}PbI_3$ perovskite lattice induces absorption shifts at different rates for the three samples, fastest for the unprotected sample and slowest for the ozone-treated $SnO_x$ barrier.
Figure 17B:
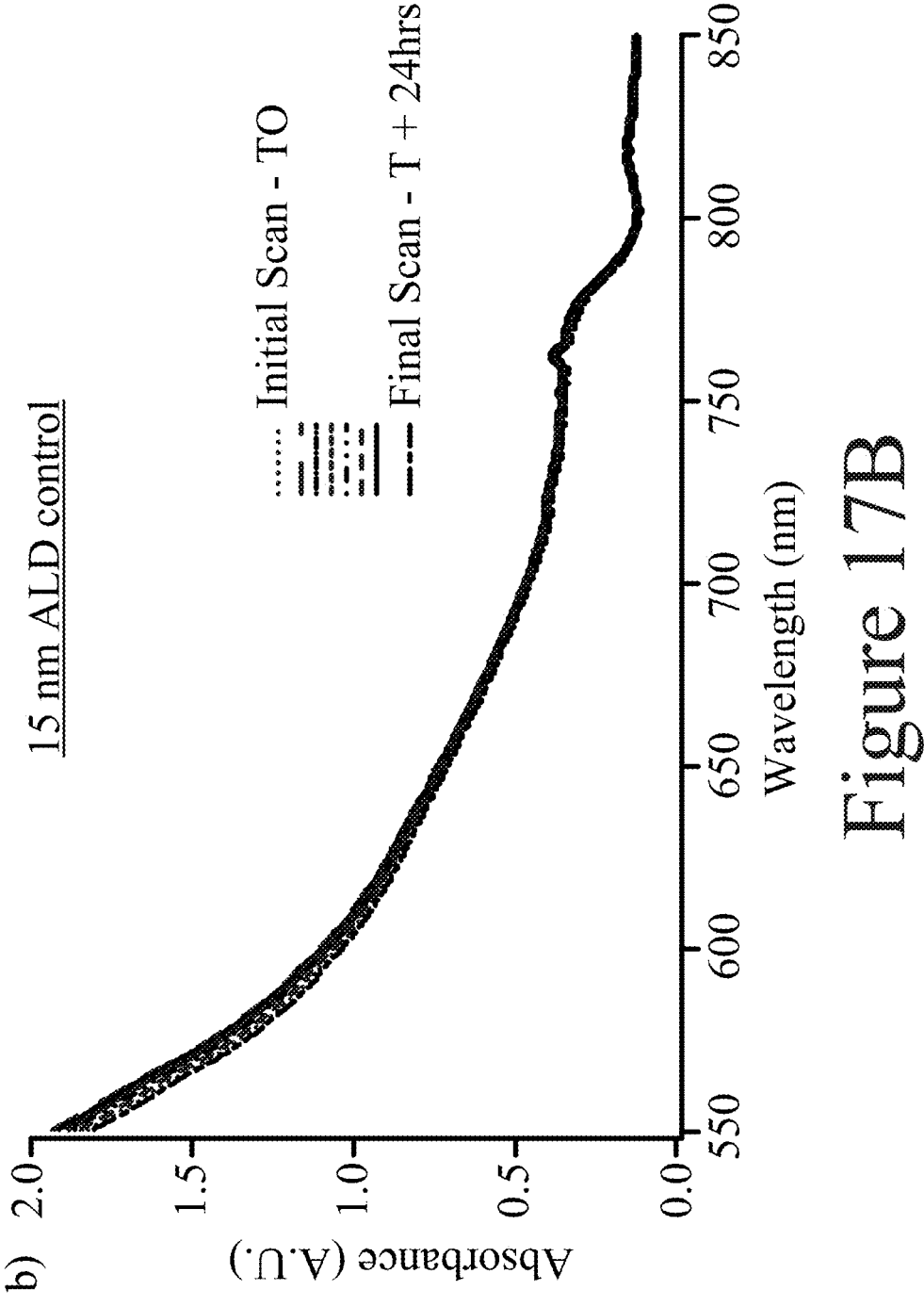
Figure 17C:
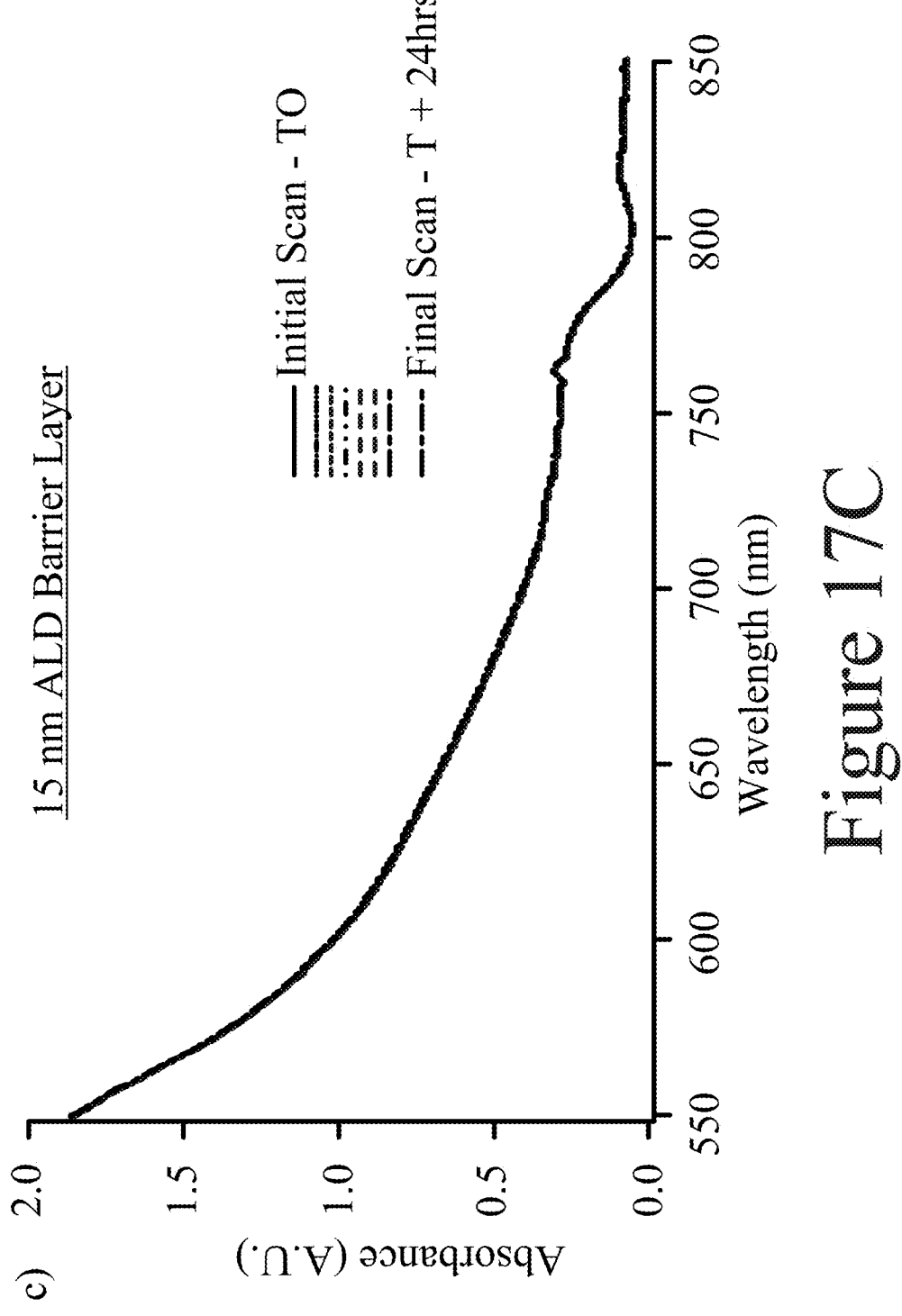

Internal halide barriers are important to reduce effusion from perovskite devices, minimize halide corrosion of contact electrodes, and prevent X-site intermixing between monolithic all-perovskite tandem subcells. Qualitative halide permeability of $SnO_x$ barriers is tested by a solution-based halide exchange monitored by absorption spectroscopy. Test structures of: Glass/$FA_{0.8}Cs_{0.2}PbI_3$/fullerene with bathocuproine (BCP), 125 cycles control ALD $SnO_x$, and 125 cycles ozone-treated ALD $SnO_x$ (40 cycle ALD-deposited $SnO_x$ first metal oxide layer 160, 5 cycle ozone nucleation, 85 cycle ALD-deposited $SnO_x$ second metal oxide layer 165) films were submerged in solutions of formamidinium bromide (10 mg/mL in isopropanol) at 50° C. for 24 hours. Absorptance was monitored via in-situ UV-Vis (see FIGS. 17A, 17B, and 17C). The devices lacking the ALD-deposited tin oxide layers showed a rapid absorptance onset shift from 790 nm (1.55 eV) to 600 nm (2.10 eV), indicating a nearly complete conversion to a pure bromine perovskite within 6 hours. Control $SnO_x$ barrier samples showed a significantly slower, yet noticeable, absorptance shift over the 24 hour test. In contrast, the ozone-treated $SnO_x$ barrier samples showed no detectable onset or absorption shift after being submerged in the bromide ion solution for 24 hours, indicating the ozone-treated ALD-deposited tin oxide barrier layer suppresses halide migration across the ETL to a greater degree than the control ALD-deposited $SnO_x$ barrier layer.

Figure 18A:
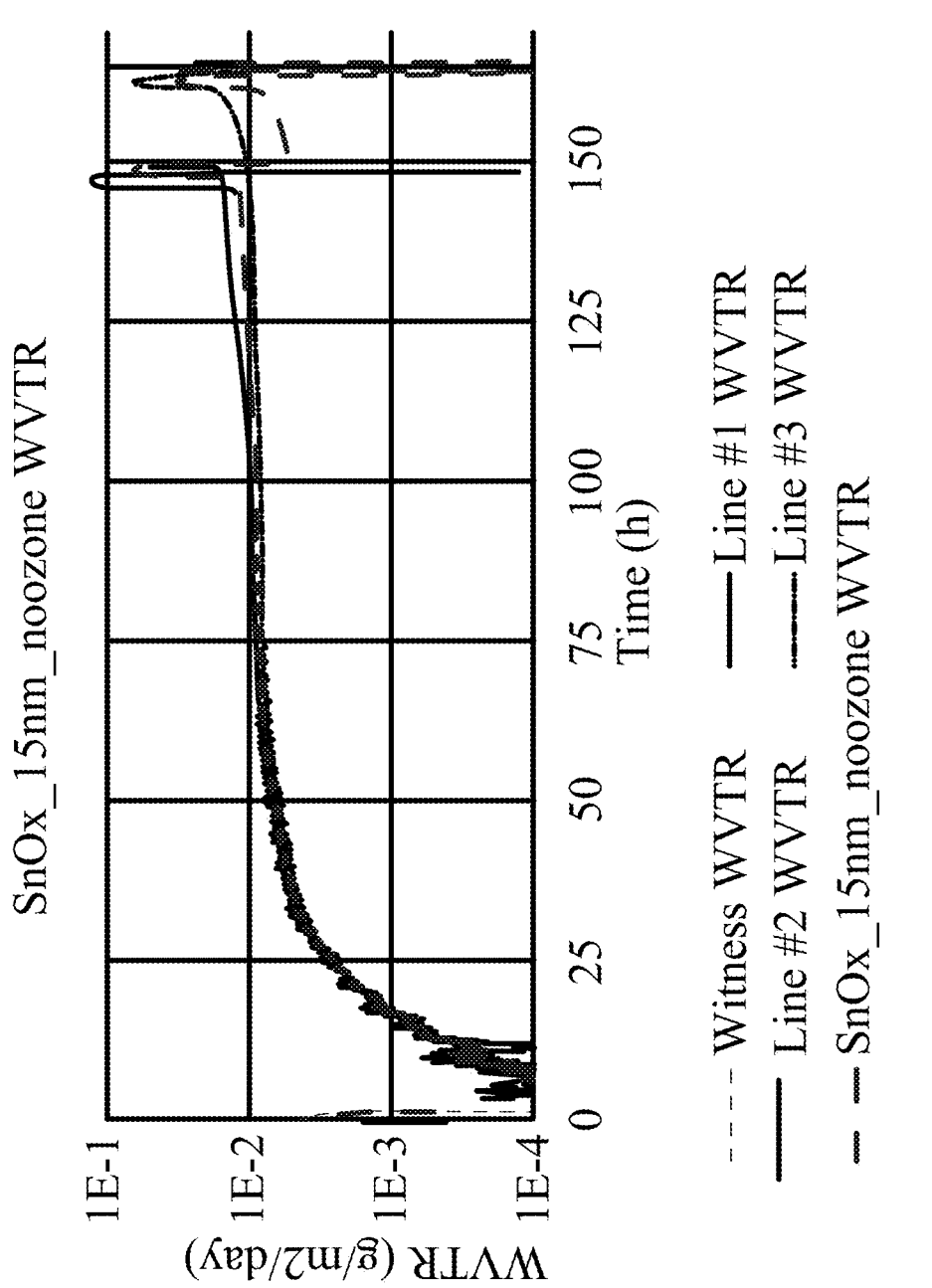
FIGS. 18A and 18B illustrate water-vapor transmission rates (WVTR) for ALD-deposited $SnO_x$ layers on rigid polymer substrates, without (FIG. 18A) and with ozone treating (FIG. 18B), according to some embodiments of the present disclosure.
Figure 18B:
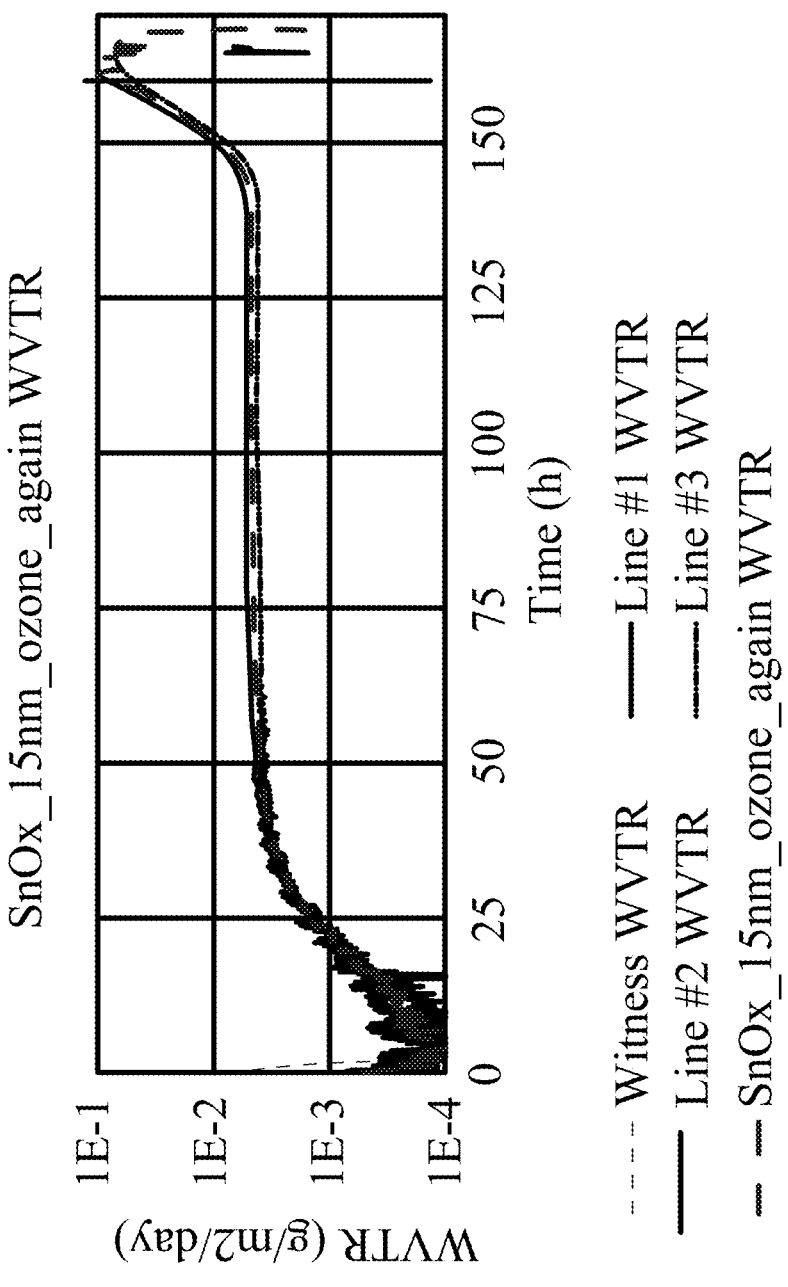
Figure 19A:
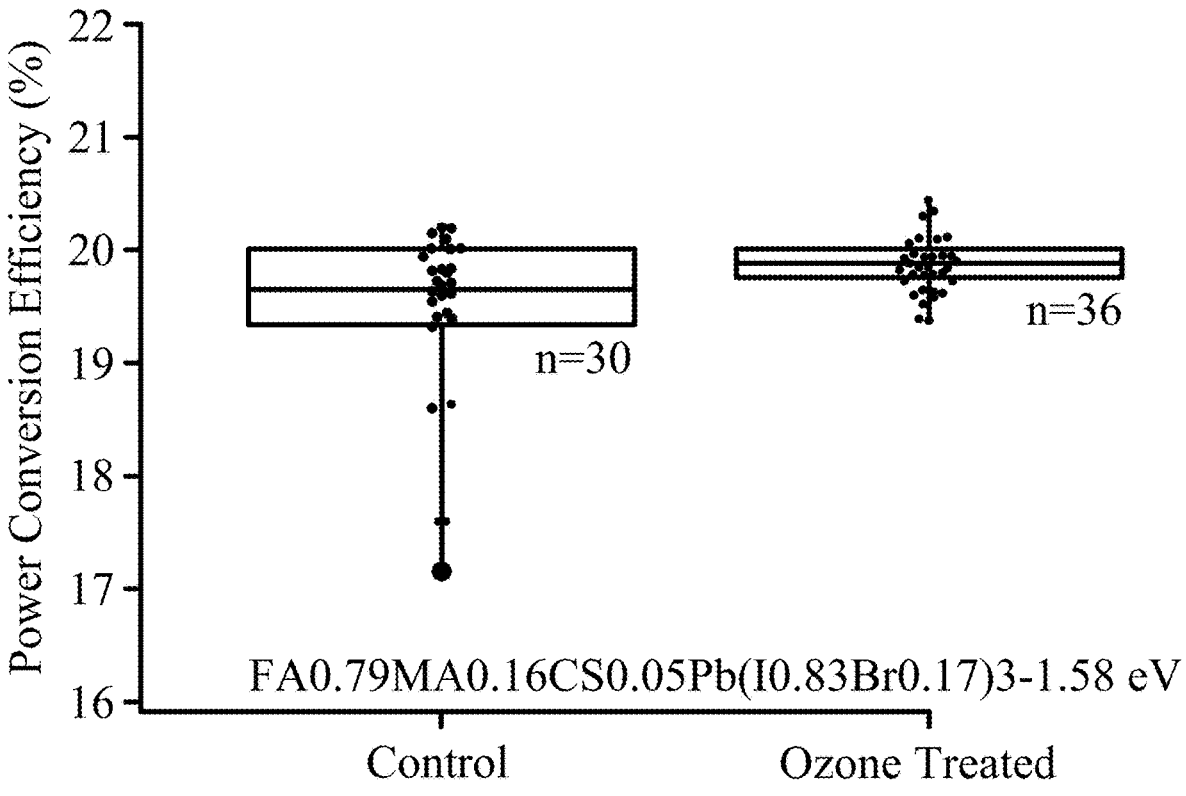
FIGS. 19A-19D illustrate box plots displaying median device power conversion efficiency and first and third quartile for devices with and without (control) ozone-treated ALD-deposited $SnO_x$ layers with n cells tested for the architectures, according to some embodiments of the present disclosure.
Figure 19B:
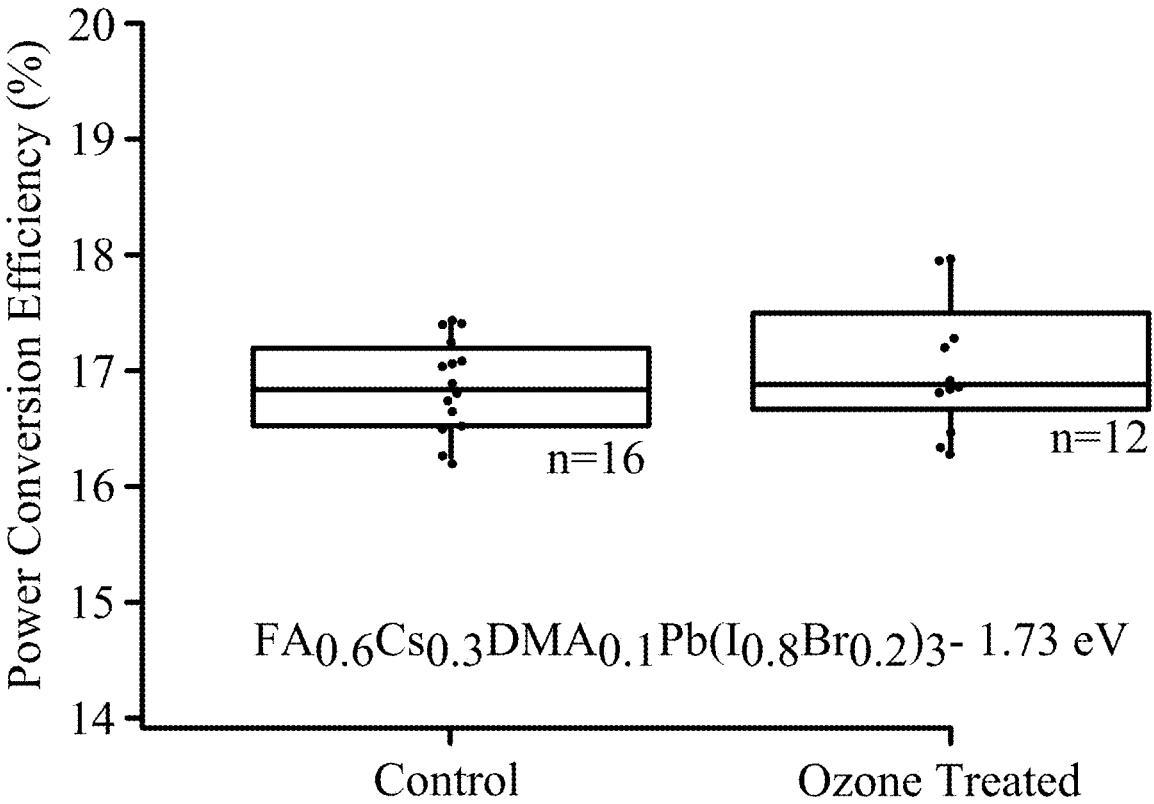
Figure 19C:
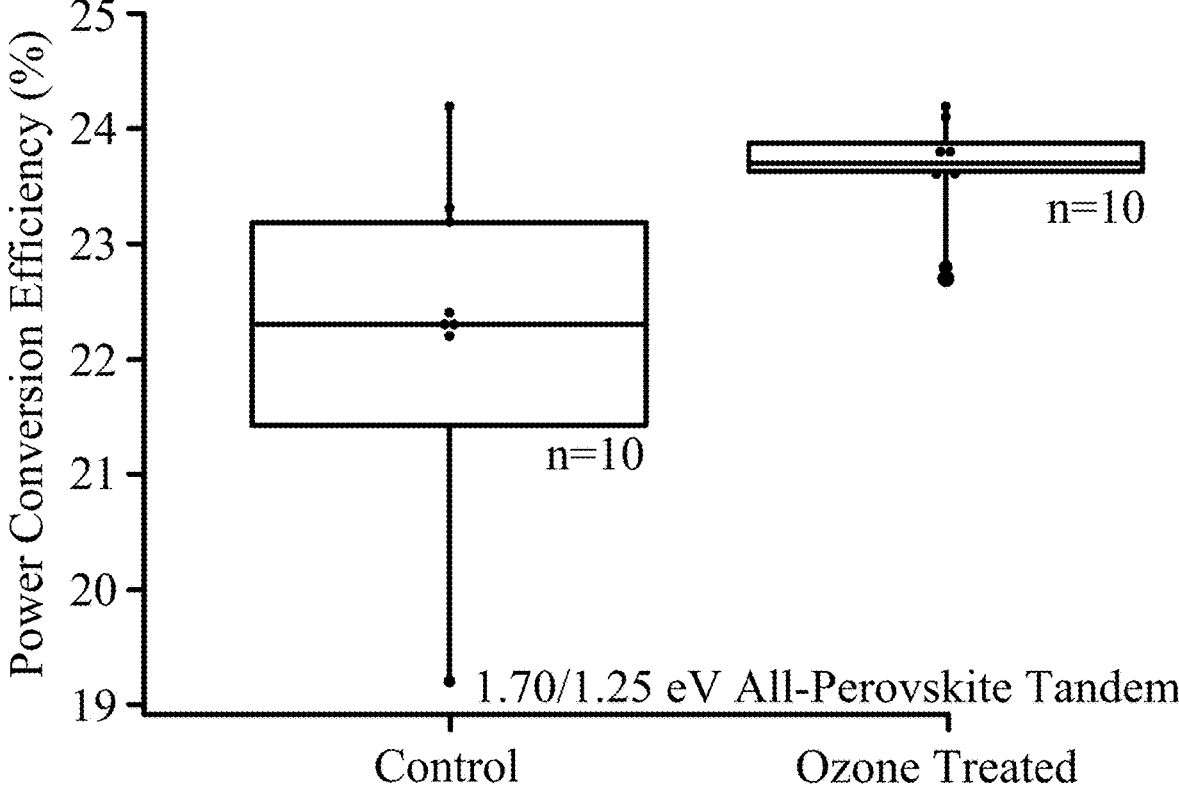
Figure 19D:
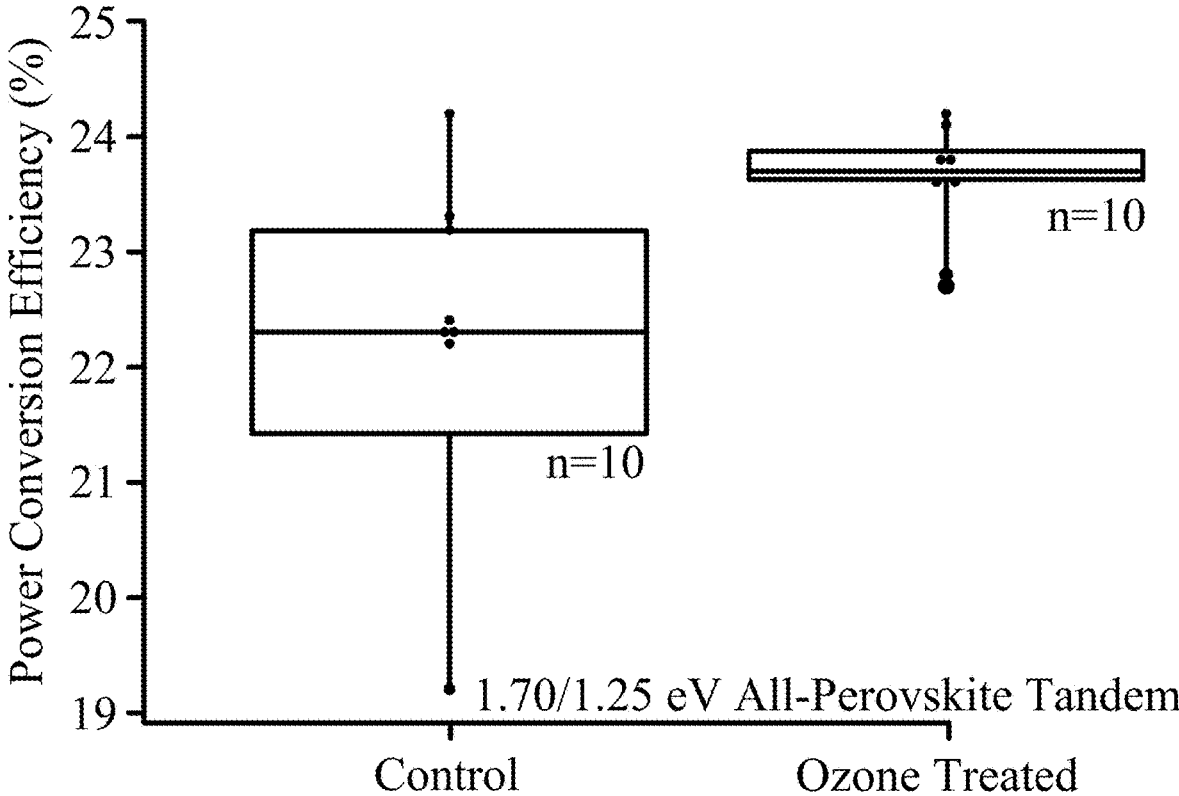

The barrier quality of the $SnO_x$ was further investigated by measuring the water-vapor transmission rates (WVTR). 30-nm-thick fullerene layers was thermally evaporated onto 15 mil×100-mm polyethylene terephthalate and deposited 125 cycles of ALD-deposited $SnO_x$ layer with a control process and with ozone treatment. The WVTR was measured using a MOTOC AquaTrans 2 instrument, opting for an automated liquid-phase moisture detection method over traditional calcium tests. WVTR data show an order of magnitude decrease from 1.34 g/($m^2$-day) for the control tin oxide ALD to 0.13 g/($m^2$-day) for the ozone-assisted ALD-deposited tin oxide layer, with the PET wafer being approximately 1 g/($m^2$-day) by itself. The WVTR metrics may be limited due to the flexing of the PET as a result of the packaging procedure—a spacer block was heated to bond a poly-isobutylene edge seal and cooling resulted in a slight vacuum and curvature in the PET, causing tensile stresses in the $SnO_x$ barrier layer. In addition to testing a flexible polymer substrate, a rigid polymer substrate was also tested to prevent flexing of the layer and tensile stresses. Results are illustrated in FIGS. 18A and 18B. These data show that an ALD-deposited layer of $SnO_x$ with a thickness of 15 nm and ozone contacting demonstrated a WVTR of 4.5E–3 whereas an ALD-deposited layer of $SnO_x$ with a thickness of 15 nm without ozone treating had a WVTR of 1E–2.

Alternative methods to initiate ozone nucleation were evaluated for those situations where access to an in-situ ozone source on an ALD system is not available. One common tool in device fabrication laboratories is a UV-Ozone (UVO) cleaner, capable of generating ozone in the presence of atmospheric moisture. To test UVO for ex-situ ozone nucleation treatment, samples were removed from the ALD chamber after the formation of the first metal oxide layer 160 and then treated with the UVO for 60 seconds. Samples were reloaded in the ALD system to complete the 15 nm $SnO_x$ barrier. Our experiments show that the ozone and ambient moisture within UVO tool adds oxygen functionalization comparable to in-situ ozone treatment via XPS, illustrated in FIG. 8B. Optical pinhole analysis of DMF penetration testing on barriers formed with ex-situ UVO nucleation treatments is illustrated in FIGS. 19A-19D. It was found that a 60 second ex-situ UV-ozone treatment provides equivalent nucleation and barrier behavior to the 15 s in-situ treatment with 99.3% film retention. This ex-situ approach is a viable alternative processing method for ozone nucleation.

Device Integration: To show the universality of ozone treatment, the process described above was completed on four different perovskite semiconductors, including $FA_{0.6}Cs_{0.3}DMA_{0.10}Pb(I_{0.8}Br_{0.2})_3$ (wide band gap—1.73 eV), $FA_{0.7}MA_{0.15}Cs_{0.05}Pb(I_{0.38}Br_{0.17})_3$ (intermediate band gap perovskite—1.58eV), and $FA_{0.76}Cs_{0.25}Pb_{0.5}Sn_{0.5}I_3$ (low band gap—1.25 eV) in p-i-n single junction devices and $Cs_{0.3}FA_{0.7}PbI_{2.1}Br_{0.9}/FA_{0.6}MA_{0.4}Pb_{0.4}Sn_{0.6}I_3$ (1.75 eV/1.25 eV) in all-perovskite tandem solar cells. Ozone nucleation treatment on the 1.58 eV and 1.73 eV compositions were performed in-situ while the ozone nucleation treatment for the 1.25 eV and tandem devices were performed ex-situ in a laboratory UV-ozone cleaner. ALD $SnO_x$ deposition temperatures on the 1.25 eV low band gap devices were decreased from 90° C. to 80° C. due to thermal sensitivity of the device stack. FIGS. 19A-19E illustrate the device power conversion efficiency (PCE) distributions as median and quartiles for control ALD $SnO_x$ (no ozone treatment) and ALD $SnO_x$ with an ozone nucleation treatment applied to a 40 cycle ALD $SnO_x$ first metal oxide layer. A full reporting of device figure of merit statics is shown in Table 3.

TABLE 3

| Performance statistics displayed as (Median; [Quartile 1, Quartile 3]) from the 4-panel box plots for batches of devices from FIGS. 19A-19E. | | | |
|---|---|---|---|
| | PCE (%) Median; [Q1, Q3] | FF (%) Median; [Q1, Q3] | $V_{oc}$ (mV) Median; [Q1, Q3] | $J_{sc}$ (mA/$cm^2$) Median; [Q1, Q3] |
| FACsDMA 1.73 eV | | | | |
| Ozone Treated; n = 11 | 16.87; [16.71, 17.37] | 78.8; [78.5, 79.3] | 1121; [1111, 1140] | 19.14; [19.00, 19.31] |
| Control; n = 15 | 16.83; [16.51, 17.11] | 77.9; [76.7, 78.5] | 1134; [1125, 1144] | 19.13; [19.00, 19.33] |
| FAMACs 1.58 eV | | | | |
| Ozone Treated; n = 35 | 19.87; [19.72, 19.99] | 83.4; [83.0, 83.8] | 1138; [1133, 1149] | 20.87; [20.71, 21.01] |
| Control; n = 30 | 19.77; [19.33, 19.99] | 83.2; [80.8, 83.6] | 1140; [1137, 1144] | 20.66; [20.53, 20.89] |
| FACsPbSn | | | | |

TABLE 3-continued

| | PCE (%)<br>Median; [Q1, Q3] | FF (%)<br>Median; [Q1, Q3] | $V_{oc}$ (mV)<br>Median; [Q1, Q3] | $J_{sc}$ (mA/cm$^2$)<br>Median; [Q1, Q3] |
|---|---|---|---|---|
| | Performance statistics displayed as (Median; [Quartile 1, Quartile 3])<br>from the 4-panel box plots for batches of devices from FIGS. 19A-19E. | | | |
| 1.25 eV | | | | |
| Ozone Treated; n = 70 | 12.2; [11.41, 13.1] | 67.2; [57.5, 70.0] | 610; [587, 636] | 29.35; [25.11, 29.70] |
| Control; n = 60 | 6.9; [5.30, 8.84] | 51.05; [36.2, 55.7] | 542; [446, 564] | 28.28; [27.86, 28.78] |
| All-Perovskite | | | | |
| Tandem | | | | |
| Ozone Treated; n = 10 | 23.70; [23.60, 23.87] | 77.6; [76.7, 79.2] | 2.01; [1.98, 2.02] | 15.23; [15.09, 15.32] |
| Control; n = 10 | 22.3; [22.2, 23.2] | 77.5; [76.5, 78.0] | 1.94; [1.93, 1.97] | 14.82; [14.63, 15.24 |

All devices utilizing the in-situ ozone nucleation treatments show a measurable improvement in the median power conversion efficiency. Of the primary device figures of merit in single-junction devices, this improvement was mainly driven through a stabilization of the fill-factor (FF), and partially through increases in open circuit voltage ($V_{oc}$), but the general narrowing of the performance spread goes beyond any single performance metric.

Figure 20A:
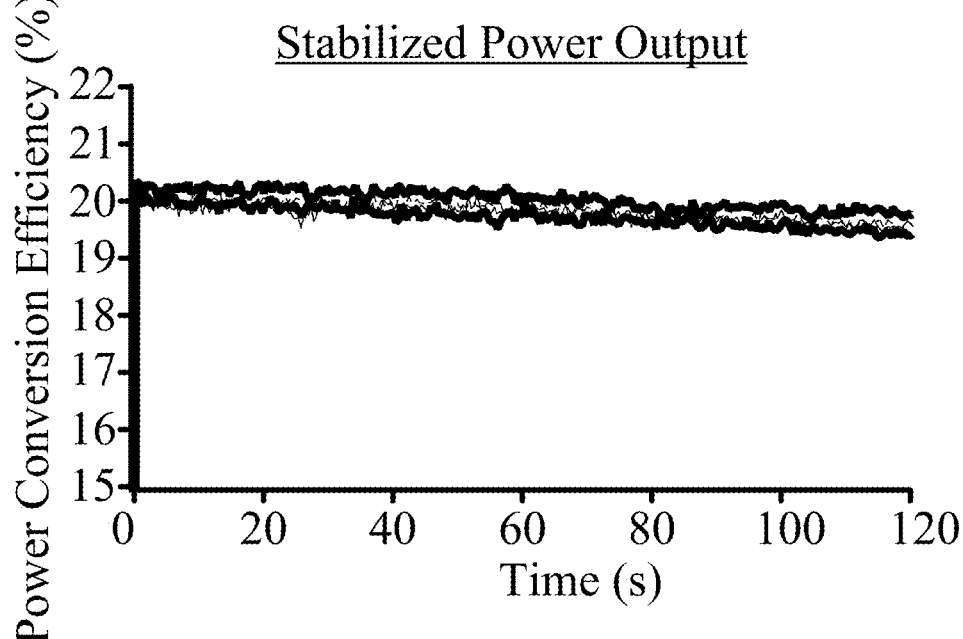
FIGS. 20A and 20B illustrate stabilized Power Output (SPO) and forward/reverse JV plots for two control and two ozone-treated FAMACs devices each from FIG. 18A, according to some embodiments of the present disclosure.
Figure 20B:
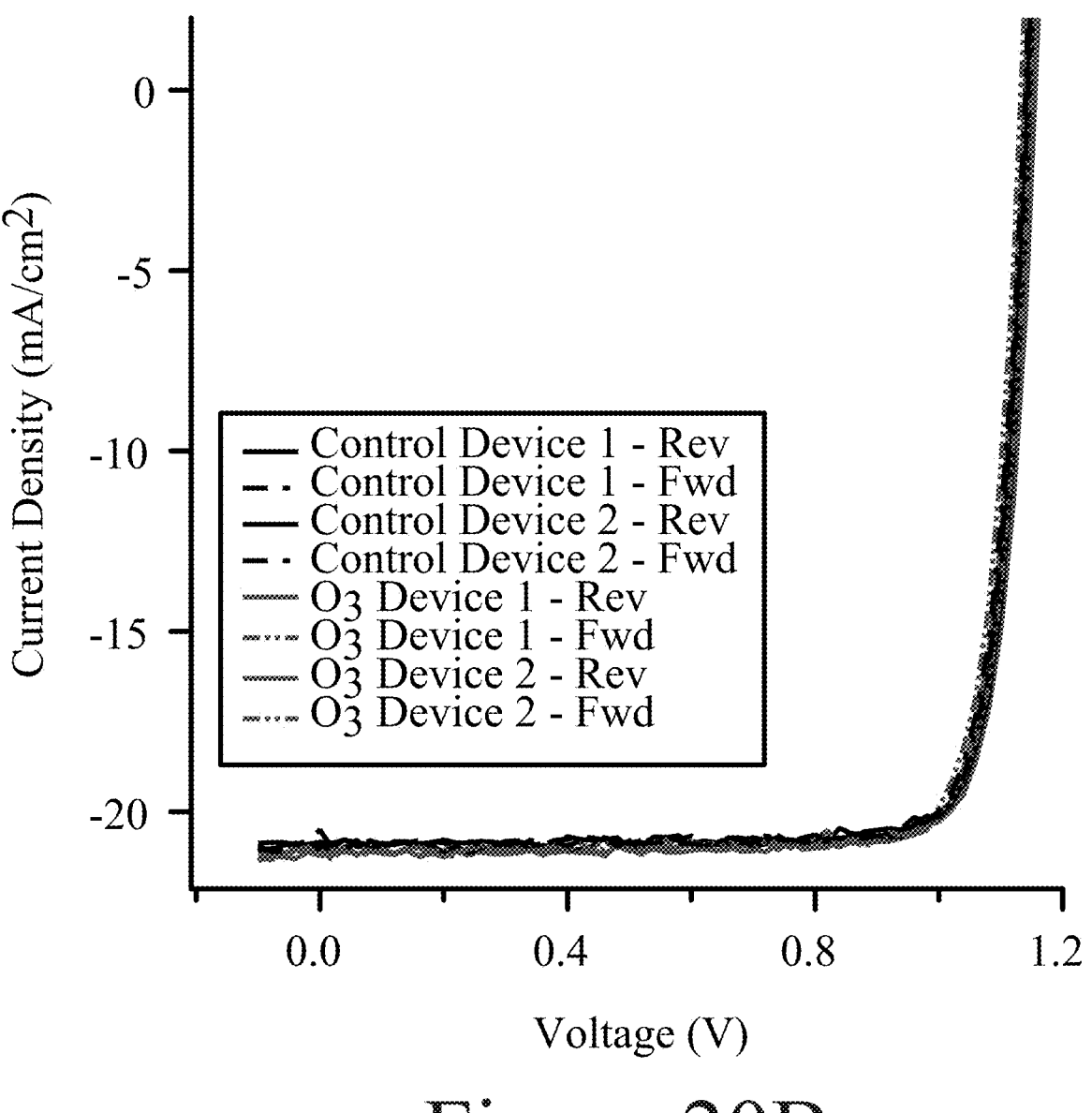

No significant efficiency improvement was observed with ozone nucleation treatments in the widegap compositions, however, importantly, no interfacial damage was detected. FIGS. 20A and 20B illustrate that the ozone-treated barrier layer does not induce hysteresis or SPO instabilities in the intermediate-gap FAMACs devices. Furthermore, the nearly identical champion performances suggest that the transport properties of the fullerene are not negatively affected by limited surface oxidation as a result of the reported ozone nucleation process. On these FAMACs devices, ozone nucleation did not impact the median Fill Factor of 83%, but narrowed the Q1/Q3 spread from 2.9% FF to 0.7% FF. This FF spread improvement may be attributed to the increased homogeneity of the ozone-treated ALD-deposited $SnO_x$ layer. Ozone nucleation treatment on low-gap tin lead materials resulted in nearly a doubling of the device efficiency. This is significant on the low-gap materials as Sn—Pb perovskite compositions are known to be highly sensitive to tin oxidation and demonstrates the efficacy of the first metal oxide layer 160 at protecting the underlying perovskite interface (i.e., base layer 150). The relatively low initial PCE on control devices may be attributed to un-optimized tin oxide at low (80° C.) deposition temperatures. At these temperatures, the ozone dose may further react with the tin oxide first metal oxide layer 160 to form a more stoichiometric contact near the fullerene interphase. A similar result was observed in the all-perovskite tandem devices, however, a significant factor in the tandem device yields was the reduced solvent penetration when integrating the two subcells. Here, it is possible that the solvent barrier properties enabled the high-yield integration of subcells with figure of merit improvements on the short circuit current density and open circuit voltage. Through the incorporation of in-situ ozone treatment in the recombination junction of an all-perovskite tandem solar cell, an improved median device performance from 22.3% to 23.7% with a champion efficiency of 24.2% PCE was achieved.

Figure 21:
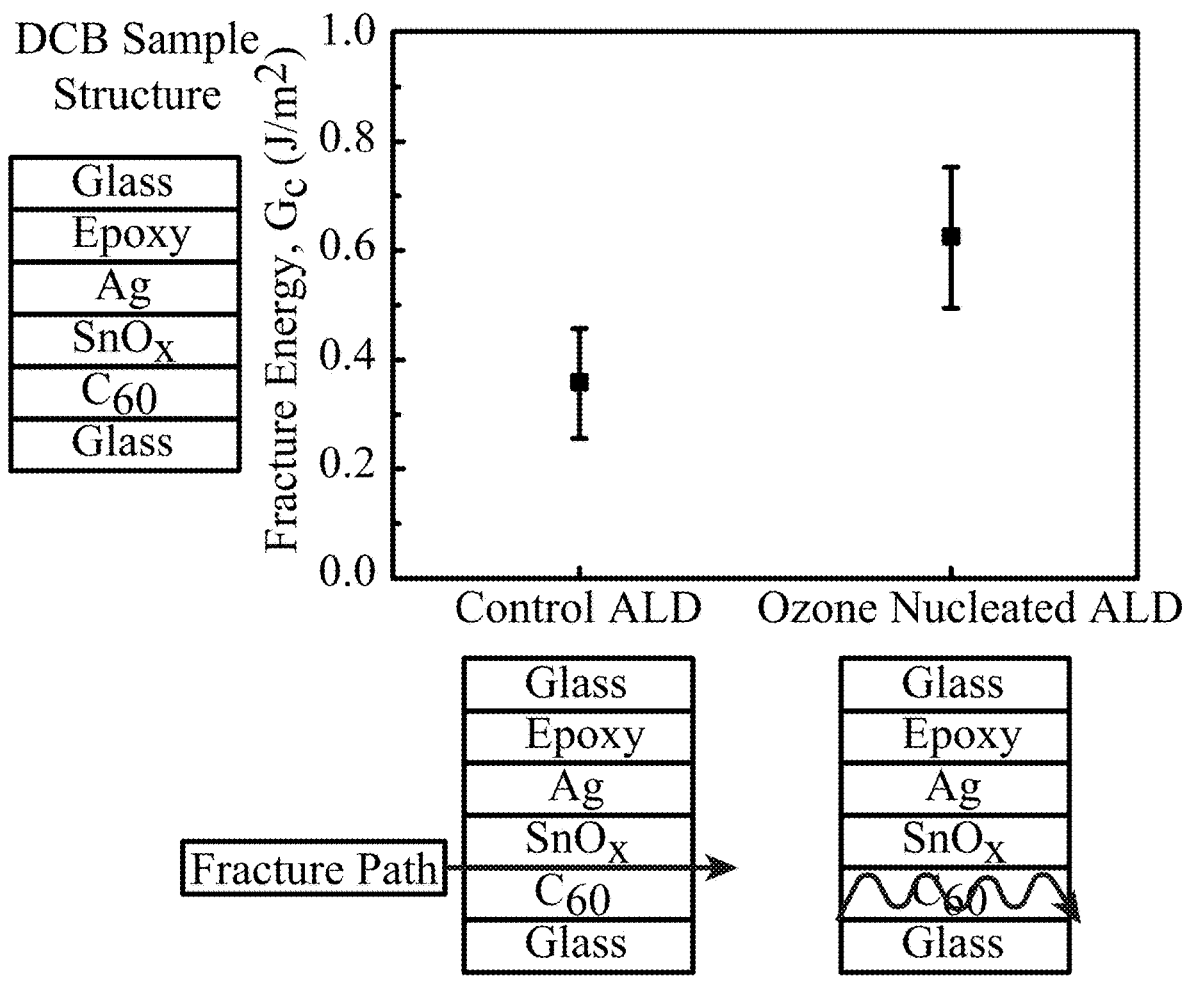
FIG. 21 illustrates a comparison between the average $G_c$ results and fracture paths of control ALD-deposited-$SnO_x$ and ozone-nucleated ALD-deposited-$SnO_x$ samples, according to some embodiments of the present disclosure.

Further, to address the $C_{60}$ mechanical fragility, fracture energy measurements were performed on device stacks having the following architecture: glass/ITO/perovskite/$C_{60}$/ ALD-deposited-$SnO_x$/Ag. The results confirmed the weak bonding at the $C_{60}$/ALD-$SnO_x$ interface with a low $G_c$ of 0.68±0.18 J m$^{-2}$. In order to understand the delamination mechanism, the $C_{60}$/ALD-$SnO_x$ interface was investigated by scanning transmission electron microscope (STEM) and the cross-sectional STEM images identified (not shown) numerous vertical microscopic cracks at the interface, which can readily initiate the delamination of the $C_{60}$ and ALD-deposited-$SnO_x$ under mechanical loads. By treating the ALD-deposited-$SnO_x$ first metal oxide layer above $C_{60}$ with ozone and water, a higher contact area can be achieved due to fewer cracks at the interface. This can be ascribed to the fact that the nucleation of the ALD process on the $C_{60}$ surface was improved by the ozone treatment, which makes the surface chemistry more reactive to the ALD-deposited-$SnO_x$, allowing for the formation of Sn—O—$C_{60}$ bonds. Besides, the added ozone may also polymerize and cross-link $C_{60}$, enabling ALD-deposited-$SnO_x$ and $C_{60}$ to form stronger bonding. To verify if the improvement in the interface morphology can result in higher mechanical robustness, fracture energy measurements were performed on samples with ALD-deposited-$SnO_x$ layers that were treated with or without the aforementioned ozone nucleation process. A relatively low $G_c$ (0.39±0.11 J m$^{-2}$) and an adhesive failure at the $C_{60}$/ALD-deposited-$SnO_x$ interface were observed for control samples, while there was a higher $G_c$ (0.58±0.12 J m$^{-2}$) and a meandering fracture path in the $C_{60}$ layer for the samples with ozone nucleation treatment (see FIG. 21). The higher $G_c$ value and the meandering fracture path in the $C_{60}$ layer of ozone-nucleated samples strongly suggest that the ozone nucleation treatment effectively improves the $C_{60}$/ALD-$SnO_x$ adhesion.

Experimental Procedures

Device Fabrication

Compositions:
  Pvsk-DMA: $DMA_{0.1}FA_{0.6}Cs_{0.3}PbI_{2.4}Br_{0.6}$ (1.7 eV)
  Pvsk-MAFACs: $FA_{0.79}MA_{0.16}Cs_{0.05}Pb(I_{0.83}Br_{0.17})_3$ (1.58 eV)
  Pvsk-PbSn: $FA_{0.76}Cs_{0.25}Pb_{0.5}Sn_{0.5}I_3$ (1.25 eV)
  Pvsk-Narrow: $FA_{0.6}MA_{0.4}Sn_{0.6}Pb_{0.4}I_3$ (1.25 eV)
  Pvsk-Wide: $Cs_{0.3}FA_{0.7}PbI_{2.1}Br_{0.9}$ (1.75 eV)
Architectures:
  ITO/pTPD/PFN/Pvsk-DMA/C60/$SnO_x$/Ag
  ITO/pTPD/PFN/Pvsk-DMA/C60/BCP/Ag
  ITO/Me-4PACz/Pvsk-MAFACs/C60/$SnO_x$/Ag
  ITO/Me-4PACz/Pvsk-MAFACs/C60/BCP/Ag
  ITO/2PACz/Pvsk-Wide/LiF/C60/SnOx/Au/PEDOT:PSS/
    Pvsk-Narrow/C60/BCP/Ag Wide-gap P-I-N device stacks with perovskite composition were fabricated in the following architectures by the following means.

Materials: Lead iodide (PbI$_2$) from TCI, >99.99% (trace metal basis). Cesium iodide (CsI), lead(ii) chloride (PbCl$_2$), tin(ii) iodide (SnI$_2$), tin(ii) fluoride (SnF$_2$) from Sigma-Aldrich, all >99.999% (trace metal basis). Lead(ii) bromide (PbBr$_2$) from Thermo-Fischer Scientific, Puratronic>99.998% (trace metal basis). Formamidinium iodide (FAI), formamidinium bromide (FABr), methylammonium iodide (MAI), methylammonium bromide (MABr), and dimethylammonium iodide (DMAI) from GreatCell Solar Materials, all >99.99%. Tetrakis-dimethylamino tin (IV) (TDMASn, 99.99% Sn basis) from Strem Chemicals CAS: 1066-77-9.

Hole transport layer, electron transport layer, and Interlayer Sources: [4-(3,6-dimethyl-9H-carbazol-9-yl)butyl] phsphonic acid (Me-4PACz)≥99.0%, [2-(9H-Carbazol-9-yl)ethyl]phosphonic acid (2PACz)≥99.0%, 1,6-Hexylenediphosphonic acid (6dPA)≥98.0%, bathocuproine (BCP) (sublimated)>99.9%. Poly(9,9-bis(3'-(N,N-dimethyl)-N-ethylammoinium-propyl-2,7-fluorene)-alt-2,7-(9,9-dioctylfluorene))dibromide (PFN-Br), poly(4-butylphenyl-diphenyl-amine) (pTPD) from 1-Material, 'Standardized'. Silver (Ag) and gold (Au) pellets from Kurt J. Lesker, >99.99% (trace metal basis).

Substrates: 25 mm×1.1 mm square float glass substrates with 15 ohm*sq patterned ITO coated glass substrates purchased from Colorado Concept Coatings were cleaned by subsequent ultrasonication in Alconox cleaning solution, DI water, acetone, isopropanol. Substrates were removed and blown clear of residual liquid under a stream of nitrogen before being dried fully dried at 120° C. for 24 hours. Substrates were subjected to an additional 10-minute UV-Ozone surface cleaning immediately before device fabrication begins.

pTPD: 2 mg/mL in chlorobenzene, cast at 4000 rpm for 40 s.

PFN-Br: 0.5 mg/mL in methanol, dynamic cast at 5000 rpm for 20 s.

Me-4PACz: Mix 4:1 by volume solutions 1 mg/mL Me-4PACz in ethanol and 0.75 mg/mL 1,6-hexylphosphonic acid in anhydrous ethanol (Sigma Aldrich, HPLC grade).

1.73 eV FA$_{0.6}$Cs$_{0.3}$DMA$_{0.10}$Pb(I$_{0.8}$Br$_{0.2}$)$_3$: Films of this materials were prepared as follows. Salts FAI, CsI, DMAI, PbBr$_2$, PbI$_2$ and PbCl$_2$ were weighed in stoichiometric quantities and dissolved at 1.0M in 3:1 DMF:DMSO. Perovskite ink was spread on a static substrate and spun at 5000 rpm for 50 seconds, with 120 uL methyl acetate or anisole antisolvent dispensed at 20 seconds into the spin process. Films were annealed at 120° C. for 20 minutes. Perovskite films on glass of the same composition were made using identical salt compositions, but instead dissolved at 1.0M in 3:1 DMF:NMP, static cast and spread, spun at 5000 rpm for 50 seconds with a nitrogen quench applied 10 seconds into the spin process. Films were annealed at 120° C. for 20 minutes.

1.58 eV FA$_{0.7}$MA$_{0.15}$Cs$_{0.05}$Pb(I$_{0.83}$Br$_{0.17}$)$_3$: Films of this material were prepared by weighing the salts FAI, MAI, CsI, PbBr$_2$, and PbI$_2$ in stoichiometric quantities and dissolved at 1.2M in 3:1 DMF/DMSO. Perovskite ink was spread on a static substrate and spun at 5000 rpm for 50 seconds with 120 uL anisole dispensed 25 seconds into the spin process. Films were then annealed at 100° C. for 60 minutes.

1.25 eV FA$_{0.76}$Cs$_{0.25}$Pb$_{0.5}$Sn$_{0.5}$I$_3$: Films of this material were prepared as follows. Salts FAI, CsI, SnI$_2$, PbI$_2$, and SnF$_2$ were weighed out in a stoichiometric ratio and then dissolved at 2M in 4:1 DMF/DMSO. Perovskite ink was spread on a static substrate and spun at 5000 rpm for 40 seconds with 120 uL of methyl acetate antisolvent applied 25 seconds into the spin cycle.

Monolithic 2-T all-perovskite tandem solar cell fabrication: Two-terminal tandem solar cells were fabricated as follows. Briefly, a Pvsk-narrow subcell (about 1 μm) on top of a Pvsk-wide subcell (about 400 nm). A thinner tin oxide layer of 125 cycles ALD SnO$_x$ (instead of the reported 300 cycles) was used with and without an ex-situ ozone-nucleation was used in the interconnecting layer between the wide- and narrow-bandgap subcells.

C60: 30 nm of C$_{60}$ was evaporated from an Angstrom Engineering thermal evaporator at 2E−7 torr at rates between 0.1 A/s and 0.3 A/s BCP: 6 nm of BCP was evaporated from an Angstrom Engineering thermal evaporator at 2E−7 torr with a rate of 0.1 A/s ALD SnO$_x$: ALD tin oxide deposition was performed using a Beneq TFS-200 ALD system by reacting TDMASn and de-ionized water at a reactor temperature of 90° C. The TDMASn precursor vessel was heated to 55° C. and the DI water was unheated. TDMASn was dosed by backfilling the bubbler with nitrogen for 350 ms and then dosing for 250 ms. Growth cycles proceeded by: [TDMASn dose (350 ms charge/250 ms dose)-purge (5 seconds)-DI water dose (150 ms)-purge (3 seconds)]. A growth rate for this process of 1.2 Å per cycle was measured on silicon by spectroscopic ellipsometry.

Ozone Functionalization: In-situ ozone nucleation was performed with 5 cycles of alternating doses of [3 s ozone and 150 ms DI water] with no purge using an integrated BMT 803 N ozone generator. The generator was operated at 50% power and an oxygen flow rate of approximately 2 SLM, resulting in an ozone dose concentration of 175 g/Nm$^3$.

Ex-situ ozone nucleation was performed under ambient conditions inside a Jelight Model 42 UV-ozone cleaner for 60 s.

Ag: 120 nm was thermally evaporated from Angstrom at 2E−7 torr with an initial rate of 0.1 A/s Au: 1 nm was thermally evaporated from Angstrom at 2E−7 torr with a rate of 0.1 A/s Device Testing: Devices were tested under 1-sun AM1.5 illumination, using a 0.06 cm$^2$ mask, pixel by pixel with forward and reverse sweeps at 50 mV/s, light off in between testing.

Curating Device Data for Statistics All acquired data was plotted for each device variable except for the case with our low-gap perovskite devices. This architecture suffered from poor perovskite wetting/coverage. Shunted pixels (<1% PCE, <5 mA current) were removed from the data for visual clarity, these 'dead' pixels are individually attributed to areas without perovskite coverage, a factor not attributed to ALD conditions.

Solvent Penetration Testing: Solvent penetration testing was accomplished in a VAC Omnilab nitrogen glovebox equipped with hotplate and a Laurell spincoater system. A variable 'delay-start' was programmed into the spincoater, followed by a 40 second drying cycle; testing was accomplished with 15 seconds of exposure. A sample was placed onto the spin-coating chuck and a 400 uL aliquot of DMF was dispensed onto 1×1" sample surface to fully coat the surface while simultaneously starting the coating cycle. Pinholes formed during the delay period, excess DMF was flung off during the spin period, and once complete, the device was thoroughly dried on a hotplate at 100° C. for 5 minutes. Devices are removed from the glovebox. Photography and further analysis were conducted in ambient air.

High-Temperature Ambient-Air Testing: Substrates had either 15 of ALD tin oxide applied with and without an ozone nucleation treatment. These samples were aged in a ventilated, 150° C. benchtop oven for several hundred hours while being routinely monitored for bleaching/color change via photography and UV-Vis spectroscopy.

Device Photography: Samples for image analysis were photographed using a Nikon D6200 with the following setup: 50 mm f5.6 lens, 320 ISO, 1/200 s exp, sample distance fixed at 30 cm on a backlight in a photobooth. The resulting images were trimmed from their background, fully desaturated (reduced to black and white) and had their contrast increased to reduce the required number of color bins for analysis.

Representative samples ~12 mm square (800×800 px) were cropped from the surface and analyzed using Image Color Summarizer, a k-means analysis tool using 5 color bins. Uninterrupted perovskite film was binned as pure black #00000, while any pinholes, deviations, and edge effects were lighter and thus binned differently. The calculations took only these uninterrupted, pure black areas as remaining film. The black binned pixels were counted and divided from the total pixels in the sample to yield 'Fraction of Film Remaining' as illustrated in FIG. 6C.

X-ray photoelectron spectroscopy (XPS): XPS measurements were performed using a Kratos Analytical AXIS Supra (sample analysis chamber base pressure: ~$10^{-8}$ Torr) equipped with a monochromatic Al $K_a$ (hn=1.486 keV) and a 180° double focusing hemispherical analyzer. C1s were acquired using an analyzer pass energy of 40 eV, 0.1 eV step-size, and 300 ms dwell time. Wide scan spectra were obtained using a pass energy of 160 eV, 1 eV step-size, and 100 ms dwell time. The X-ray anode was operated at 15 mA/225 W (emission current/X-ray power) for C1s, O1s, and Sn3d acquisitions and 10 mA/150 W for wide scan acquisitions (−5-1200 eV). X-ray optics were configured in slot collimation mode using a hybrid lens to perform large area spectroscopy at a primary incidence angle of 45° to the sample normal (orthogonal to the analyzer at q=0°). To eliminate charging effects, samples were mounted using copper clips to make electrical contact with the device structure back-contact ITO—active charge neutralization was tested and found not to be necessary.

Peak fitting was performed using CasaXPS™—fit parameters for lineshape, peak position, and FWHM are tabulated above in Table 2. C1s data were fitted using a U 3 Tougaard background, generalized asymmetric finite Lorentzian (LF) lineshape profile, and linear least-squares minimization method. Full width at half-maxima (FWHM) ratios, relative peak positions, and asymmetry parameters were fixed between the fullerene $C_{60}$ ($sp^2$—cage) principal aromatic peak (285.0 eV), oxidized O—$C_{60}$ ($sp^2$) fullerene species (287.0 eV, 288.9 eV), and their respective p-p* shake-up features (290.0 eV, 292.9 eV, 294.8 eV), as well as ALD carbon signals designated as C ($sp^3$) (285.5 eV) and C=O ($sp^3$) (289.5 eV).

XPS-based work function measurements: Work functions were measured at NREL on a Physical Electronics VersaProbe III XPS system at a pressure of ~3E-10 torr. Samples were introduced into the system using a argon-purged glovebox and a ULVAC-PHI Model 07-111K transfer vessel such that they were not exposed to air prior to analysis. The XPS system's energy scale was calibrated at low (~21 eV) kinetic energy by taking an ultraviolet photoelectron spectrum (UPS) of clean gold foil held at −5 V bias. For work function measurements, a pass energy of 6.5 eV was used yielding an energy resolution of 125 meV. The UPS calibration spectrum was differentiated and fit with a Gaussian function to locate the Fermi energy feature that appears at 1460.34 eV under these conditions. Secondary electron cut-off spectra used for work function determinations were acquired with Al $K_\alpha$ X-rays (100 μm diameter X-ray spot, 23.4 W anode power) and without exposing samples to UV light from the UPS source to avoid the He I-induced surface photochemical changes that can cause an artificial lowering of work functions in UPS measurements. Sample conductivity was tested by acquiring high resolution core level spectra with and without an electron beam (10 eV, 6 μA/mm$^2$); no significant charging was observed. Core level spectra were acquired with a pass energy of 69 eV. All spectra taken at NREL were acquired with near-normal (5°) photoelectron take-off angle.

Transmission Electron Microscopy: Si/$C_{60}$ substrates were prepared by loading two 25 mm×25 mm Si side-by-side in a single fullerene evaporation at approximately the same radius from the center of stage rotation to minimize sample-to-sample variation in the fullerene thickness. A control SnO$_x$ film was deposited on one of the samples using 125 cycles ALD-deposited SnO$_x$ at 87° C. and an ozone-treated SnO$_x$ layer was deposited with 40 ALD cycles SnO$_x$/5 ALD cycles [3 seconds O$_3$+150 ms H$_2$O]/85 ALD cycles SnO$_x$ at 87° C.

Cross sectional transmission electron microscopy samples were prepared on a Thermo Fisher Nova 200 focused ion beam/scanning electron microscope. The samples were aligned parallel to the edge of the Si substrates. Lift-out of a cross-section of the sample was attached to an Omniprobe half-grid and thinned to electron transparency.

STEM and HRTEM images were collected on a Thermo Fisher Tecnai F20 200 kV S/TEM. The samples were loaded into a double-tilt holder and aligned to zone axis of the Si substrate. Images of the fullerene and SnO$_x$ layers were collected first in HRTEM followed by STEM. Due to alignment of the sample to the Si substrate, STEM images were used to measure the thicknesses of these two layers. Samples were imaged within 3-5 days of preparation on the FIB/SEM, and no plasma cleaning was performed on these samples.

X-Ray Reflectivity: XRR samples were prepared simultaneously with the same silicon, fullerene evaporation, and ALD growth as the transmission electron microscopy samples. XRR data were collected using Rigaku Smartlab. The experiments were conducted using a Copper anode source with length limiting apertures of 10 mm horizontal and 0.05 mm vertical. Sample measurements were taken immediately after removal of the sample from the glovebox to reduce the time exposed to air. Following acquisition, the data was footprint corrected to account for spillover and normalized to unity.

For both the control process and the barrier nucleation process samples, the bare silicon and silicon oxide layer were fixed to limit the number of fitting parameters. The electron density and roughness values of the silicon substrate were fixed to 0.71 e$^-$/Å$^3$ and 3 Å, respectively. The silicon oxide thickness, electron density, and roughness were fixed to 20 Å, 0.67 e$^-$/Å$^3$, and 2 Å, all consistent with literature. Using three layers, plus the additional silicon oxide layer, for both the control and the ozone-treated sample resulted in the best fits. These three layers were defined by the fullerene layer, a mixed fullerene/SnOx layer, and finally a solid SnOx layer.

Water Vapor Transmission Rate Testing: 100 mm disks were hand-cut from 5 mil Dupont Melinex® ST504 PET sheets acquired from and attached to 100 mm silicon wafers with Kapton tape for case of handling. 30 nm of fullerene were vacuum deposited onto each substrate and 125 cycles of $SnO_x$ was deposited as a barrier layer using the control and ozone-treated processes.

After ALD, the PET wafers were carefully lifted from their Si wafer carriers and degassed at 50 C in an oxygen and moisture free nitrogen environment for 100 hours before loading into a MOTOC AquaTrans 2 WVTR tool. Results are recorded after approximately 5 days of testing.

Scanning Electron Microscopy: SEM was performed using a Hitachi SU3500 with equipped with Energy Dispersive Spectroscopy (EDS). Microscopy of DMF treated glass/perovskite/fullerene/$SnO_x$ substrates revealed particulates at the center of most pinholes in ozone-treated test structures with >15 s cumulative ozone exposure. It was found that these particles had a size on the order of 20 to 200 μm, with the largest being more than ~800 times the thickness of the perovskite film and ~2,500 times the thickness of the ALD barrier layer. Energy Dispersive X-ray (EDX) analysis the particles suggests that they were primarily composed of glass shards, fragments of device material (e.g. $C_{60}$) and fibers from lab tissues. These particles can be formed during fabrication from a variety of processes not limited to: ultrasonic substrate cleaning, handling substrate edges with metal tweezers, fling-off from spin coating, thermal evaporator residuals or graphite particles from brushed motors and de-static devices.

Device Examples

Example 1. A device comprising: a first metal oxide layer having a first thickness; a second metal oxide layer having a second thickness; and a base layer having a third thickness, wherein: the first metal oxide layer is positioned between the base layer and the second metal oxide layer, at least one of the base layer or the first metal oxide layer comprises a carbon-containing material, and at least one of a carbon concentration gradient or an oxygen concentration gradient is present across at least one of a portion of the first thickness or a portion of the third thickness.

Example 2. The device of Example 1, wherein the first metal oxide layer is permeable to an oxygen-containing compound.

Example 3. The device of either Example 1 or Example 2, wherein the oxygen-containing compound comprises at least one of $O_3$, $N_2O$, or $H_2O_2$.

Example 4. The device of any one of Examples 1-3, wherein the first thickness is between 1 Å and 200 nm or between 10 Å and 100 nm or between 10 Å and 5 nm.

Example 5. The device of any one of Examples 1-4, wherein the first metal oxide layer comprises at least one of a tin oxide, a zinc oxide, a molybdenum oxide, a vanadium oxide, a nickel oxide, an aluminum oxide, a titanium oxide, a hafnium oxide, a zirconium oxide, a silicon oxide, a copper oxide, a chromium oxide, a cobalt oxide, a manganese oxide, or an indium-tin-oxide.

Example 6. The device of any one of Examples 1-5, wherein the first metal oxide layer is doped.

Example 7. The device of any one of Examples 1-6, wherein the second thickness is between 1 Å and 200 nm or between 10 Å and 100 nm or between 10 Å and 50 nm.

Example 8. The device of any one of Examples 1-7, wherein the second metal oxide layer comprises at least one of a tin oxide, a zinc oxide, a molybdenum oxide, a vanadium oxide, a nickel oxide, an aluminum oxide, a titanium oxide, a hafnium oxide, a zirconium oxide, a silicon oxide, a copper oxide, a chromium oxide, a cobalt oxide, a manganese oxide, or an indium-tin-oxide.

Example 9. The device of any one of Examples 1-8, wherein the second metal oxide layer is doped.

Example 10. The device of any one of Examples 1-9, wherein the first metal oxide layer is the same as the second metal oxide layer.

Example 11. The device of any one of Examples 1-10, wherein the first metal oxide layer is different than the second metal oxide layer.

Example 12. The device of any one of Examples 1-11, wherein at least a portion of the first metal oxide layer forms an interface with the base layer.

Example 13. The device of any one of Examples 1-12, wherein at least one of the oxygen concentration gradient or the carbon concentration gradient is characterized by a maximum concentration of carbon-oxygen bonds at or near the interface.

Example 14. The device of any one of Examples 1-13, wherein at least a portion of the second metal oxide layer penetrates through the first metal oxide layer into a portion of the third thickness, as determined by at least one of X-ray reflectivity or transmission electron microscopy.

Example 15. The device of any one of Examples 1-14, wherein the base layer comprises at least one of a perovskite or a charge transport material (CTM).

Example 16. The device of any one of Examples 1-15, wherein the carbon-containing material of the base layer comprises a cation of a perovskite.

Example 17. The device of any one of Examples 1-16, wherein the cation comprises at least one of an ammonium or an amidinium.

Example 18. The device of any one of Examples 1-17, wherein the cation comprises an alkylammonium.

Example 19. The device of any one of Examples 1-18, wherein the alkylammonium comprises at least one of methylammonium (MA), ethylammonium, diethylammonium, or phenethylammonium.

Example 20. The device of any one of Examples 1-19, wherein the amidinium comprises at least one of formamidinium (FA) or guanidinium.

Example 21. The device of any one of Examples 1-20, wherein the carbon-containing material of the CTM comprises at least one of a fullerene, graphene, graphite, graphdiyne, a reduced graphene oxide, a carbon nanotube, carbon black, an MXene, a polymer, a perylenediimide, a perylene, a non-fullerene acceptor, or a small molecule.

Example 22. The device of any one of Examples 1-21, wherein the carbon-containing material of the CTM is functionalized.

Example 23. The device of any one of Examples 1-22, wherein the functionalized CTM is functionalized with at least one of an epoxy group, a hydroxyl group, a carboxyl group, or a carbonyl group.

Example 24. The device of any one of Examples 1-23, wherein the fullerene comprises at least one C50, C60, C70, C120, C140, or C180.

Example 25. The device of any one of Examples 1-24, wherein a functionalized fullerene comprises [6,6] phenyl-C61-butyric acid methyl ester (PCBM).

Example 26. The device of any one of Examples 1-25, wherein the carbon nanotube comprises at least one of a single-walled carbon nanotube, a double-walled carbon nanotube, or a multi-walled carbon nanotube.

Example 27. The device of any one of Examples 1-26, wherein the polymer comprises at least one of: parylene, poly(3-hexylthiophene) (P3HT), poly(triarlyamine) (PTAA), poly(3,4-ethylenedioxythiophene):poly(styrene-sulfonate) (PEDOT:PSS), bathocuproine (BCP), polyaniline, poly[(9,9-bis(3'-(N,N-dimethylamino)propyl)-2,7-fluorene)-alt-2,7-(9,9-dioctylfluorene)] (PFtN), poly(methyl methacrylate) (PMMA), or polycarbonate (PC).

Example 28. The device of any one of Examples 1-21, wherein the small molecule comprises at least one of a molecule used to form a self-assembled monolayer (SAM), 10,14-Bis(5-(2-ethylhexyl)thiophen-2-yl)-dipyrido[3,2-a:2', 3'-c][1,2,5]thiadiazolo[3,4-]phenazine (TDTP), 1,1-dicya-nomethylene-3-indanone (IDIC), N,N'-bis(3-(dimethyl-amino)propyl)-5,11-dioctylcoronene-2,3,8,9-tetracarboxdiimide (CDIN), perylene diimides (PDIs), 1-benzyl-3-methylimidazolium chloride, Example 29. The device of any one of Examples 1-28, wherein the SAM comprises phosphonic acid.

Example 30. The device of any one of Examples 1-29, wherein the SAM comprises at least one of 2PACz, MeO-2PACz, 4PACz, MeO-4PACz, Me-4PACz, or Me-2PACz.

Example 31. The device of any one of Examples 1-30, wherein the SAM comprises an aliphatic carbon chain and halogen.

Example 32. The device of any one of Examples 1-31, wherein the carbon-containing material included in the first oxide layer comprises a ligand (e.g. a nanoparticle film).

Example 33. The device of any one of Examples 1-32, wherein the ligand comprises at least one of an acidic ligand, a basic ligand, or a zwitterionic ligand.

Example 34. The device of any one of Examples 1-33, wherein the acidic ligand comprises at least one of oleic acid, phosphonic acid, or a phosphinic acid.

Example 35. The device of any one of Examples 1-34, wherein the acidic ligand comprises at least one of diisooc-tylphosphinic acid or tetradecylphosphonic acid.

Example 36. The device of any one of Examples 1-35, wherein the basic ligand comprises at least one of an amine, an acetate, or and oxide.

Example 37. The device of any one of Examples 1-36, wherein the basic ligand comprises at least one of oleylam-ine, dioctylamine, or trioctylphosphine oxide.

Example 38. The device of any one of Examples 1-37, wherein the zwitterionic ligand comprises at least one of 3-(N,N-dimethyloctadecylammonio)-propanesulfonate, N-hexadecylphosphocholine, or N,N-dimethyldodecylam-moniobutyrate.

Example 39. The device of any one of Examples 1-38, wherein: the first metal oxide layer comprises tin oxide, the second metal oxide layer comprises tin oxide, the base layer comprises a fullerene, and at least a portion of the tin oxide of the first metal oxide layer penetrates into at least a portion of the third thickness of the fullerene.

Example 40. The device of any one of Examples 1-39, wherein the portion of the thickness of the fullerene pen-etrated by the tin oxide of the first metal oxide layer has a thickness between 10 Å and 61 Å.

Example 41. The device of any one of Examples 1-40, wherein the portion of the thickness of the fullerene pen-etrated by the tin oxide of the first metal oxide layer has an electron density between 0.61 e–/Å$^3$ and 1.37 e–/A$^3$.

Example 42. The device of any one of Examples 1-41, wherein the fullerene layer comprises a surface concentra-tion of C—O bonds of less than about 70 mol %.

Example 43. The device of any one of Examples 1-42, wherein the fullerene layer comprises a bulk concentration of C—O bonds of less than about 33 mol %.

Example 44. The device of any one of Examples 1-43, further comprising: a gap, wherein: the gap passes through at least one of the first thickness, the second thickness, or the third thickness forming surface aligned perpendicular to at least one of the first metal oxide layer, the second metal oxide layer, or the base layer, the gap is at least partially filled with a solid, and the solid forms an interface with the surface.

Example 45. The device of any one of Examples 1-44, wherein: the solid comprises a first layer comprising the metal oxide of the first metal oxide layer, the solid comprises a second layer comprising the metal oxide of the second metal oxide layer, and the first layer is positioned between surface and the second layer.

Method Examples

Example 1. A method comprising: a first depositing of a first metal oxide layer onto a surface (e.g., fullerene layer and/or wall of a scribe-line); contacting at least one of the surface or the first metal oxide layer with at least one of an oxygen-containing compound or an oxygen plasma; and a second depositing of a second metal oxide layer onto the first metal oxide layer, wherein: at least one of the surface or the first metal oxide layer includes a carbon-containing material, the oxygen-containing compound reacts with at a least a portion of the carbon-containing material to form an oxy-gen-containing functional group bonded to carbon, the oxy-gen-containing functional group provides a nucleation site that facilitates, during the second depositing, the forming of structures comprising —C—O—M at the surface or on the first metal oxide layer, and M is a metal of at least one of the metal oxide of the first metal oxide layer or the metal oxide of the second metal oxide layer.

Example 2. The method of Example 1, wherein the oxygen-containing compound comprises at least one of $N_2O$, $O_3$, or $H_2O_2$.

Example 3. The method of either Example 1 or Example 2, wherein the first metal oxide layer is permeable to the oxygen-containing compound.

Example 4. The method of any one of Examples 1-3, wherein the oxygen-containing functional group comprises at least one of an epoxide, a hydroxyl, a carboxyl, a carbonyl, an aldehyde, an ester, a carboxylic acid, an ether, a ketone, an acyl halide, an amide, or an acid anhydride.

Example 5. The method of any one of Examples 1-4, wherein the surface is part of a base layer having a thickness.

Example 6. The method of any one of Examples 1-5, wherein the oxygen-containing functional group is present in at least one of a gradient aligned in a direction across the thickness of the base layer or in a direction that is substan-tially orthogonal to an interface between the base layer and the first metal oxide layer.

Example 7. The method of any one of Examples 1-6, wherein at least a portion of the surface is created by the forming of the base layer.

Example 8. The method of any one of Examples 1-7, further comprising, prior to the first depositing, scribing at least a portion of the base layer resulting in the forming of a gap passing through the thickness of the base layer and resulting in the forming of the surface.

Example 9. The method of any one of Examples 1-8, wherein the second depositing results in at least a portion of the metal oxide of the second metal oxide layer penetrating into at least one of the surface or the base layer, as determined by scanning transmission electron microscopy (STEM).

Example 10. The method of any one of Examples 1-9, wherein the first depositing is performed using at least one of a gas phase method, a vapor phase method, or a solution phase method.

Example 11. The method of any one of Examples 1-10, wherein the first depositing is performed using atomic layer deposition (ALD) and a first metal oxide precursor.

Example 12. The method of any one of Examples 1-11, wherein the first depositing is performed between 1 and 150 cycles.

Example 13. The method of any one of Examples 1-12, wherein the first depositing is performed between 1 and 40 cycles.

Example 14. The method of any one of Examples 1-13, wherein the first metal oxide precursor comprises tetrakis-dimethylamino tin (IV) (TDMASn) and the first metal oxide layer comprises tin oxide.

Example 15. The method of any one of Examples 1-14, wherein the first depositing further comprises water.

Example 16. The method of any one of Examples 1-15, wherein the first depositing is performed at a temperature between 50° C. and 150° C.

Example 17. The method of any one of Examples 1-16, wherein: the solution phase method comprises applying a solution onto the surface, and the solution comprises a metal oxide nanoparticle suspended in an alcohol.

Example 18. The method of any one of Examples 1-17, wherein the metal oxide nanoparticle comprises a metal oxide core and a ligand connected to the metal oxide core.

Example 19. The method of any one of Examples 1-18, wherein the ligand comprises at least one of an acidic ligand, a basic ligand, or a zwitterionic ligand.

Example 20. The method of any one of Examples 1-19, wherein the second depositing is performed using at least one of a gas phase method, a vapor phase method, or a solution phase method.

Example 21. The method of any one of Examples 1-20, wherein the second depositing is performed using atomic layer deposition (ALD) and a second metal oxide precursor.

Example 22. The method of any one of Examples 1-21, wherein surface contacting by the oxygen-containing compound or oxygen plasma and the second depositing is performed between 1 and 150 times.

Example 23. The method of any one of Examples 1-22, wherein the second metal oxide precursor comprises tetra-kis-dimethylamino tin (IV) (TDMASn) and the second metal oxide layer comprises tin oxide.

Example 24. The method of any one of Examples 1-23, wherein the second depositing further comprises water.

Example 25. The method of any one of Examples 1-24, wherein the second depositing is performed at a temperature between 50° C. and 150° C.

Example 26. The method of any one of Examples 1-25, wherein oxygen-containing compound comprises ozone (i.e., $O_3$).

Example 27. The method of any one of Examples 1-26, wherein the contacting comprises a first contacting using ozone for a period of time between 10 ms and 60 seconds or between 100 ms and 50 seconds or between 1 second and 10 seconds.

Example 28. The method of any one of Examples 1-27, wherein the contacting further comprises water.

Example 29. The method of any one of Examples 1-28, wherein the contacting further comprises a second contact-ing using water for a second period of time between 1 ms and 10 second or between 10 ms and 1000 ms or between 50 ms and 200 ms.

Example 30. The method of any one of Examples 1-29, wherein the scribing further comprises scribing a charge transport layer CTL, resulting in the extension of the gap through the CTL.

Example 31. The method of any one of Examples 1-30, wherein gap extends through a hole transport layer, a perovskite layer, and an electron transport layer.

Example 32. The method of any one of Examples 1-31, wherein each of the first metal oxide layer and the second metal oxide layer are independently conductive or insulative.

Example 33. The method of any one of Examples 1-32, wherein at least one of the first metal oxide layer or the second metal oxide layer is insulative.

Example 34. The method of any one of Examples 1-33, further comprising a third depositing of a contact layer onto a base layer comprising a CTM, wherein a material used to construct the contact layer at least partially fills the gap.

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A method comprising:
a first depositing of a first layer comprising a first metal oxide onto a surface;
contacting at least one of the surface or the first layer with at least one of an oxygen-containing compound or an oxygen plasma; and
a second depositing of a second layer comprising a second metal oxide onto the first layer, wherein:
at least one of the surface or the first layer includes a carbon-containing material,
the oxygen-containing compound reacts with at least a portion of the carbon-containing material to form an oxygen-containing functional group bonded to carbon,
the oxygen-containing functional group provides a nucleation site that facilitates, during the second depositing, forming structures comprising -C-O-M at the surface, on the first layer, or a combination thereof, and
M is a metal from at least one of the first metal oxide or the second metal oxide.

2. The method of claim 1, wherein the oxygen-containing compound comprises at least one of $N_2O$, $O_3$, or $H_2O_2$.

3. The method of claim 1, wherein the oxygen-containing functional group comprises at least one of an epoxide, a hydroxyl, a carboxyl, a carbonyl, an aldehyde, an ester, a carboxylic acid, an ether, a ketone, an acyl halide, an amide, or an acid anhydride.

4. The method of claim 1, wherein the contacting with the oxygen-containing compound or oxygen plasma and the second depositing are performed between 1 and 150 times.

5. The method of claim 1, wherein the contacting further comprises contacting with ozone for a period of time between 10 ms and 60 seconds.

6. The method of claim 1, wherein the first depositing is performed using at least one of a gas phase method, a vapor phase method, or a solution phase method.

7. The method of claim 6, wherein the first depositing is performed using atomic layer deposition and a first metal oxide precursor.

8. The method of claim 7, wherein the first depositing is performed between 1 and 150 cycles.

9. The method of claim 7, wherein the first metal oxide precursor comprises tetrakis-dimethylamino tin(IV) and the first layer comprises tin oxide.

10. The method of claim 7, wherein the first depositing further comprises water.

11. The method of claim 7, wherein the first depositing is performed at a temperature between 50° C. and 150° C.

12. The method of claim 1, wherein the second depositing is performed using at least one of a gas phase method, a vapor phase method, or a solution phase method.

13. The method of claim 12, wherein the second depositing is performed using atomic layer deposition and a second metal oxide precursor.

14. The method of claim 13, wherein the second metal oxide precursor comprises tetrakis-dimethylamino tin(IV) and the second layer comprises tin oxide.

15. The method of claim 13, wherein the second depositing is performed at a temperature between 50° C. and 150° C.

16. The method of claim 1, wherein the surface is part of a base layer having a thickness.

17. The method of claim 16, wherein the oxygen-containing functional group is present in at least one of a gradient aligned in a direction across the thickness of the base layer or in a direction that is substantially orthogonal to an interface between the base layer and the first layer.

18. The method of claim 16, further comprising, prior to the first depositing, scribing at least a portion of the base layer resulting in a gap passing through the thickness of the base layer and resulting in the forming of the surface.

19. The method of claim 16, wherein the second depositing results in at least a portion of the second metal oxide penetrating into at least one of the surface or the base layer.

*   *   *   *   *